United States Patent [19]
Fujinaga

[11] Patent Number: 5,812,435
[45] Date of Patent: Sep. 22, 1998

[54] SHAPE SIMULATION METHOD ALLOWING SIMULATION OF PROCESSED SHAPE DURING STEPS OF MANUFACTURING A SEMICONDUCTOR DEVICE IN A SHORT PERIOD OF TIME

[75] Inventor: Masato Fujinaga, Hyogo, Japan

[73] Assignee: Mitsubishi Denki Kabushiki Kaisha, Tokyo, Japan

[21] Appl. No.: 810,169

[22] Filed: Feb. 28, 1997

Related U.S. Application Data

[63] Continuation-in-part of Ser. No. 706,195, Aug. 30, 1996, abandoned, which is a continuation of Ser. No. 296,381, Aug. 26, 1994, abandoned.

[30] Foreign Application Priority Data

Sep. 21, 1993 [JP] Japan ................................. 5-234989
Oct. 29, 1993 [JP] Japan ................................. 5-272037
Apr. 27, 1994 [JP] Japan ................................. 6-089464

[51] Int. Cl.$^6$ ........................................................ G06G 7/48
[52] U.S. Cl. ...................... 364/578; 364/488; 364/468.24
[58] Field of Search ................................. 364/578, 488, 364/489, 490, 491, 468.24, 468.03, 475.02, 472.1; 257/29, 327, 365, 901, 296, 613, 755, 760, 775, 776

[56] References Cited

U.S. PATENT DOCUMENTS

| | | | |
|---|---|---|---|
| 4,785,399 | 11/1988 | Evans et al. ............................. | 364/512 |
| 4,984,181 | 1/1991 | Kliman et al. ........................... | 364/578 |
| 4,989,166 | 1/1991 | Akasaka et al. ......................... | 364/578 |
| 5,067,101 | 11/1991 | Kunikiyo et al. ........................ | 364/578 |
| 5,070,469 | 12/1991 | Kunikiyo et al. ........................ | 364/578 |
| 5,148,379 | 9/1992 | Konno et al. ............................ | 364/578 |
| 5,193,066 | 3/1993 | Konishi et al. ......................... | 364/472.1 |
| 5,212,653 | 5/1993 | Tanaka ..................................... | 364/490 |
| 5,293,557 | 3/1994 | Fujinaga et al. ......................... | 364/578 |
| 5,307,292 | 4/1994 | Brown et al. ............................ | 364/578 |
| 5,307,296 | 4/1994 | Uchida et al. ........................... | 364/578 |
| 5,502,643 | 3/1996 | Fujinaga .................................. | 364/578 |

FOREIGN PATENT DOCUMENTS

| | | | |
|---|---|---|---|
| 41 32 102A1 | 4/1992 | Germany ......................... | G06F 15/60 |
| 42 07 435A1 | 10/1992 | Germany ......................... | G06F 15/60 |
| 2-278714 | 4/1989 | Japan . | |
| 2-224228 | 9/1989 | Japan . | |
| 3-159238 | 11/1989 | Japan . | |
| 4-133326 | 9/1990 | Japan . | |
| 4-280450 | 3/1991 | Japan . | |

OTHER PUBLICATIONS

Scheckler, "Algorithms for Three–Dimensional Simulation of Etching and Deposition Processes in Integrated Circuit Fabrication", Electronics Research Laboratory, University of California, 1991/Nov.

Hume, III et al., "Mass Transfer Analysis of Electrodeposition Through Polymeric Masks", Electrochemical Science and Technology, Jun., 1984, pp. 1251–1258.

Primary Examiner—Jacques H. Louis-Jacques
Attorney, Agent, or Firm—McDermott, Will & Emery

[57] ABSTRACT

An area to which volume ratio "1" as allotted in an analysis area is divided into first and second types of cells. A third cell is placed next to and above the first cell, and volume ratio "0" is allotted to the third cell. With respect to the direction in which the third and first cells are placed next to each other, both cells are adapted to have the same width. As a result, by interpolation of the volume ratio, the position at which volume ratio assumes 0.5 is positioned at the boundary between cells.

33 Claims, 54 Drawing Sheets

<u>200b</u>

| 0 | 0 | 0 | 0 | 0 |
|---|---|---|---|---|
| 0.4 | 0.4 | 0.3 | 0 | 0 |
| 1 | 1 | 1 | 0.3 | 0 |
| 1 | 1 | 0.4 | 0 | 0 |
| 1 | 1 | 0.1 | 0 | 0 |

| 0 | 0 | 0 | 0 | 0 | 0 |
|---|---|---|---|---|---|
| 0 | 0 | 0 | 0 | 0 | 0 |
| 0 | 0 | 0 | 0 | 0 | 0 |
| 1 | 1 | 1 | 1 | 1 | 1 |
| 1 | 1 | 1 | 1 | 1 | 1 |

— Bsi

| 0 | 0 | 0 | 0 | 0 | 0 |
|---|---|---|---|---|---|
| 1 | 1 | 1 | 0 | 0 | 0 |
| 1 | 1 | 1 | 0 | 0 | 0 |
| 0 | 0 | 0 | 0 | 0 | 0 |
| 0 | 0 | 0 | 0 | 0 | 0 |

Bsio

| 0 | 0 | 0 | 0 | 0 | 0 |
|---|---|---|---|---|---|
| 0 | 0 | 0 | 0 | 0 | 0 |
| 0 | 0 | 0 | 1 | 1 | 1 |
| 0 | 0 | 0 | 0 | 0 | 0 |
| 0 | 0 | 0 | 0 | 0 | 0 |

— BsiN

FIG. 58

|  | i = 1 | 2 | 3 | 4 | 5 |
|---|---|---|---|---|---|
| k = 1 | 0 | 0 | 0 | 0 | 0 |
| 2 | 0 | 0 | 0 | 0 | 0 |
| 3 | 0.5 | 0.2 | 0 | 1 | 1 |
| 4 | 1 | 1 | 1 | 1 | 1 |
| 5 | 1 | 1 | 1 | 1 | 1 |

FIG. 59

|  | i = 1 | 2 | 3 | 4 | 5 |
|---|---|---|---|---|---|
| k = 1 | 0.1 | 0 | 0 | 0 | 0 |
| 2 | 1 | 1 | 0.6 | 0 | 0 |
| 3 | 0.5 | 0.8 | 1 | 0 | 0 |
| 4 | 0 | 0 | 0 | 0 | 0 |
| 5 | 0 | 0 | 0 | 0 | 0 |

FIG. 60

|  | i = 1 | 2 | 3 | 4 | 5 |
|---|---|---|---|---|---|
| k = 1 | 0 | 0 | 0 | 0.4 | 0.5 |
| 2 | 0 | 0 | 0.4 | 1 | 1 |
| 3 | 0 | 0 | 0 | 0 | 0 |
| 4 | 0 | 0 | 0 | 0 | 0 |
| 5 | 0 | 0 | 0 | 0 | 0 |

FIG. 61

|  | i = 1 | 2 | 3 | 4 | 5 |
|---|---|---|---|---|---|
| k = 1 | 104 | 0 | 0 | 105 | 106 |
| 2 | 2 | 2 | 103 | 3 | 3 |
| 3 | 101 | 102 | 2 | 1 | 1 |
| 4 | 1 | 1 | 1 | 1 | 1 |
| 5 | 1 | 1 | 1 | 1 | 1 |

FIG. 63

|  | i = 1 | 2 | 3 | 4 | 5 |
|---|---|---|---|---|---|
| k = 1 | 0 | 0 | 0 | 0 | 0 |
| 2 | 1 | 0.1 | 0 | 0 | 0 |
| 3 | 1 | 1 | 0.2 | 0 | 0 |
| 4 | 1 | 1 | 0.7 | 0 | 0 |
| 5 | 1 | 1 | 0.5 | 0 | 0 |

FIG. 64

|  | i = 1 | 2 | 3 | 4 | 5 |
|---|---|---|---|---|---|
| k = 1 | 0 | 0 | 0 | 0 | 0 |
| 2 | 1.2 | 0.1 | 0 | 0 | 0 |
| 3 | 1 | 1.2 | 0.2 | 0 | 0 |
| 4 | 1 | 1 | 0.9 | 0 | 0 |
| 5 | 1 | 1 | 0.7 | 0 | 0 |

FIG. 65

|  | i = 1 | 2 | 3 | 4 | 5 |
|---|---|---|---|---|---|
| k = 1 | 0.1 | 0 | 0 | 0 | 0 |
| 2 | 1 | 0.3 | 0 | 0 | 0 |
| 3 | 1 | 1 | 0.3 | 0 | 0 |
| 4 | 1 | 1 | 0.9 | 0 | 0 |
| 5 | 1 | 1 | 0.7 | 0 | 0 |

FIG. 66

|  | i = 1 | 2 | 3 | 4 | 5 |
|---|---|---|---|---|---|
| k = 1 | 0 | 0 | 0 | 0 | 0 |
| 2 | 1 | 0.1 | 0 | 0 | 0 |
| 3 | 1 | 1 | 0.2 | 0 | 0 |
| 4 | 1 | 1 | 0.7 | 0 | 0 |
| 5 | 1 | 1 | 0.5 | 0 | 0 |

FIG. 67

|  | i = 1 | 2 | 3 | 4 | 5 |
|---|---|---|---|---|---|
| k = 1 | 0 | 0 | 0 | 0 | 0 |
| 2 | 0.9 | -0.1 | 0 | 0 | 0 |
| 3 | 1 | 1 | 0 | 0 | 0 |
| 4 | 1 | 1 | 0.6 | 0 | 0 |
| 5 | 1 | 1 | 0.4 | 0 | 0 |

FIG. 68

|  | i = 1 | 2 | 3 | 4 | 5 |
|---|---|---|---|---|---|
| k = 1 | 0 | 0 | 0 | 0 | 0 |
| 2 | 0.85 | 0 | 0 | 0 | 0 |
| 3 | 1 | 0.95 | 0 | 0 | 0 |
| 4 | 1 | 1 | 0.6 | 0 | 0 |
| 5 | 1 | 1 | 0.4 | 0 | 0 |

FIG. 70    PRIOR ART

|  | i = 1 | 2 | 3 | 4 | 5 |
|---|---|---|---|---|---|
| k = 1 | 0 | 0 | 0 | 0 | 0 |
| 2 | 1 | 0.1 | 0 | 0 | 0 |
| 3 | 1 | 1 | 0.2 | 0 | 0 |
| 4 | 1 | 1 | 0.7 | 0 | 0 |
| 5 | 1 | 1 | 0.5 | 0 | 0 |

FIG. 71    PRIOR ART

| 0 | 0 | 0 | 0 | 0 |
|---|---|---|---|---|
| 0 | 0 | 0 | 0 | 0 |
| 0 | 0 | 0 | 0 | 0 |
| 1.0 | 0.5 | 0 | 0 | 0 |
| 1.0 | 1.0 | 0.7 | 0 | 0 |

SUBSTANCE $X_1$

FIG. 72    PRIOR ART

| 0 | 0 | 0 | 0 | 0 |
|---|---|---|---|---|
| 0 | 0 | 0.7 | 0 | 0 |
| 0 | 0.3 | 1 | 0.4 | 0 |
| 0 | 0.5 | 1 | 1 | 1 |
| 0 | 0 | 0.3 | 1 | 1 |

SUBSTANCE $X_2$

FIG. 73    PRIOR ART

| 1.0 | 0.8 | 0   | 0 | 0 |
|-----|-----|-----|---|---|
| 1.0 | 1.0 | 0.3 | 0 | 0 |
| 1.0 | 0.7 | 0   | 0 | 0 |
| 0   | 0   | 0   | 0 | 0 |
| 0   | 0   | 0   | 0 | 0 |

SUBSTANCE $X_3$

FIG. 74    PRIOR ART

| 1 | 0.8 | 0 | 0   | 0 |
|---|-----|---|-----|---|
| 1 | 1   | 1 | 0   | 0 |
| 1 | 1   | 1 | 0.4 | 0 |
| 1 | 1   | 1 | 1   | 1 |
| 1 | 1   | 1 | 1   | 1 |

ALL SUBSTANCES

SHAPE SIMULATION METHOD ALLOWING SIMULATION OF PROCESSED SHAPE DURING STEPS OF MANUFACTURING A SEMICONDUCTOR DEVICE IN A SHORT PERIOD OF TIME

This application is a continuation in part of application Ser. No. 08/706,195 filed Aug. 30, 1996, now abandoned which is a continuation of application Ser. No. 08/296,381, filed Aug. 26, 1994 now abandoned.

BACKGROUND OF THE INVENTION

1. Field of the Invention

The present invention relates to a shape simulation method for simulating a shape of an analysis area which is changing with time due to flow-in or flow-out of substance particles and, more particularly, to a shape simulation method for simulating processed shape in the step of etching, deposition or the like during manufacturing of semiconductors.

2. Description of the Background Art

Recently, the degree of integration of semiconductor devices has been more and more increased, and hence it becomes a serious problem to attain high precision of the processed shape during the steps of manufacturing. Accordingly, shape simulation method has been developed for simulating the processed shape during the steps of manufacturing semiconductor devices. A conventional method of shape simulation will be described in detail in the following.

1. Cell Division of an Analysis Area

FIGS. 28 and 29 are conceptual figures showing examples of cell division used in the conventional shape simulation. In this example, the areas 200a and 200b to be analyzed each have the size of 11 units in the lateral direction and 10 units in the longitudinal direction. Numeral in each cell denotes a volume ratio at the center of each cell.

FIGS. 28 and 29 show shapes before and after film formation, respectively. In FIG. 28, the cell labeled with the volume ratio of "1" means that there is already a substance (for example, silicon), while the cell labeled with the volume ratio of "0" means that there is not any substance (for example, silicon) existing. It does not necessary mean vacuum, and it may be considered that there is air.

FIG. 28 shows the initial state before deposition of a substance such as silicon, divided into cells. Here, the substance such as silicon is divided into cells assuming that it occupies a rectangle having the size of 8 units to the right and 7 units upward from the lower left corner of the analysis area 200a at the initial state. Therefore, in analysis area 200a shown in FIG. 28, the cells provided by dividing a rectangle having the size of 8 units to the right and 7 units upward from the lower left corner are labeled with the volume ratio of "1".

Meanwhile, other cells obtained by dividing analysis area 200a are allotted the volume ratio of "0", since the substance does not exist in these portions of the analysis area which correspond to these cells. However, the cells labeled with the volume ratio of "0" in the initial state shown in FIG. 28 has narrower width in the direction of deposition as compared with the cells labeled with the volume ratio of "1" at the initial state. Here, it is assumed that the material to be deposited comes generally from above and the direction of deposition is right or upward direction.

The reason is that on one hand, film formation simulation is effected on the premise that the volume ratio of the cell labeled with the volume ratio of "1" in the initial state does not change, and on the other hand, the volume ratio of the cell labeled with the volume ratio of "0" at the initial state increases, and correspondingly the shape of the substance of interest changes, necessitating detailed analysis of this area.

Therefore, adjacent cells having different volume ratios at the initial state have widths which differ from each other. In shape simulation for film formation, generally, the cell having larger volume ratio at the initial state is wider in the direction of deposition. On the contrary, in shape simulation for etching, it is necessary to precisely recognize reduction of the volume ratio of the area in which the substance existed in the initial state. Therefore, the cell having larger volume ratio at the initial state generally is narrower in the direction of etching.

FIG. 29 shows volume ratio of each cell after film formation. The cells dividing analysis area 200b after film formation are the same as the cells dividing analysis area 200a. However, by the simulation with respect to volume, volume ratio of various cells have changed from those in analysis area 200a. As mentioned above, the volume ratio of cells of which volume ratio was already "1" in FIG. 28 showing the initial state are kept unchanged. Meanwhile, among the cells which had the volume ratio of "0", some have their volume ratios changed.

Since the volume ratio is calculated in accordance with simulation related to volume, it may assume a non-integer between "0" to "1". In such a case, shape simulation is not completed until a boundary of the substance, that is, the border defining to which area the substance has been deposited and to which area and from which area the substance has not yet existing (air or vacuum) is determined.

2. Method of Determining Boundary

Now, in order to determine boundary of a substance in the analysis area which is divided into cells, generally a position having the volume ratio of "0.5" is calculated by interpolation, and the position is regarded as the boundary of a substance. General description of such method of determination can be found, for example, in, *Cho LSI Gijutsu* [16] *Device and Process* (No. 6) (Handotai Kenkyu 36, edited by Junichi Nishizawa, Handotai Kenkyu Shinkokai, issued by Kogyo Chosakai), pp. 107–109. Validity of determining the boundary of the substance at a position having the volume ratio of "0.5" will be described by further discussing a case in which there are a plurality of substances.

FIG. 30 is a schematic diagram showing an analysis area 201 which is set independent from FIGS. 28 and 29. Let us consider an example in which Si, $SiO_2$ and $Si_3N_4$ occupy respective areas shown in the figure in the analysis area 201 having the size of 6 units in the lateral direction and 5 units in the longitudinal direction. It is assumed that there is not a cell in which different substances exist simultaneously.

Let us consider the volume ratio of the analysis area of each substance. FIGS. 31 to 33 are schematic diagrams showing analysis areas 201a to 201c showing volume ratios of Si, $SiO_2$ and $Si_3N_4$, respectively. The volume ratio of areas in which respective substances exist is assumed to be "1", which does not contradict the above assumption.

Now, the boundary of each substance should be defined in this state. Assume that the position having the volume ratio of "0.5" is regarded as the boundary. The volume ratio represents the volume ratio at the center of each cell. Therefore, in the example of FIG. 31, the boundary $B_{Si}$ of Si would be the position at 2.25 unit from the lowermost side, as represented by the dotted line. Meanwhile, referring to FIG. 32, the lower limit of the boundary $B_{SiO}$ of $SiO_2$ would exist at a position 1.75 units from the lowermost side, as shown by the dotted line. Then, it means that the boundary $B_{Si}$ of Si is in $SiO_2$, while the boundary $B_{SiO}$ of $SiO_2$ exists in Si, namely, different substances exist in the same cell at the same time. This contradicts the above assumption.

Similarly, referring to FIG. 33, the boundary $B_{SiN}$ would exist in both Si and $SiO_2$, which is not reasonable. If the position at which the volume ratio assumes "0.75" is determined to be the boundary, similar problem occurs.

However, if the position at which the volume ratio assumes "0.5" is determined to be the boundary, both the boundary $B_{Si}$ of Si and the boundary $B_{SiO}$ of $SiO_2$ exist at the position two units from the lowermost side, and thus both boundaries coincide. Therefore, the above described unreasonable phenomenon in which two boundaries exist in different substances does not occur. The same applies to the boundary $B_{SiN}$ of $Si_3N_4$.

From these reasons, the method in which the position having the volume ratio of "0.5" is calculated and regarded as the boundary of substances is valid.

The boundary of substance in analysis area 200a will be discussed referring again to FIG. 28. The upper limit of the substance boundary $B_S$ is determined from the cell C2 in which substance exists at the initial state and the cell C1 adjacent on the upper side and in which the substance does not exist. Cell C1 is located at an area in which the substance is deposited on the substance existing in cell C2 as a base, so that the width thereof in the upward and downward direction is set narrower than that of cell C2.

Therefore, when the volume ratios "0" and "1" are allotted to the centers of cells C1 and C2 and the upper limit of substance boundary $B_S$ is calculated based on the position having the volume ratio of "0.5" by interpolation, it would enter cell C2 as shown by the dotted line. More specifically, since the width in the longitudinal direction of cell C1 is 1 unit and the width in the longitudinal direction of cell C2 is 4 unit, the upper limit of substance boundary $B_S$ exist at a position 6.25 units from the lowermost side of the analysis area 200a. Similarly, the right side limit of substance boundary $B_S$ exists at a position 7.25 units from the leftmost side of analysis area 200a.

In principle, analysis is carried out on the premise that the substance exists in an area having the size of 8 units in the lateral direction and 7 units in the longitudinal direction of the analysis area 200a as the initial state. Therefore, the above described position of the boundary indicates that the analysis is not of very high precision.

Reflecting this low precision, the boundary of the substance after simulation of volume shown in FIG. 29 is as shown by the dotted line, which is as if the originally existed substance has been etched, though actually the deposited volume is simulated. Especially, deposition entering immediately below a corner or the sidewall of a hole cannot be accurately calculated, and as a result, the shape after deposition cannot be precisely represented.

Problems related to deposition and etching calculations in the conventional shape simulation will be described. FIG. 70 shows a boundary face of surface cells. Referring to FIG. 70, the analysis area is divided into small rectangular areas (cells) and the numeral in each cell denotes the volume ratio of the substance. Hatched cells represent surface cells, and the face denoted by the thick solid line represents the boundary surface, that is, the surface of the substance. In other words, in the conventional shape simulation method, the surface of the substance is approximated by rectangles, and calculation such as deposition and etching is effected based on the approximated surface. As a result, deposition or etching calculation which has reaction rate proportional to the surface area comes to be non-accurate. More specifically, since the surface of the substance is approximated by rectangles, the area differs by about 1.4 times at most if the substance has slanted surface, resulting in error in calculated shape.

Further, since the surface shape and surface area of each cell are not very precise, the amount of substance flowing into or flowing out from the cell cannot be calculated accurately in sputter deposition calculation, ion assisted etching calculation and the like.

Next, a problem related to a method of storing volume ratio in the conventional shape simulation will be described. Volume ratios of substances including substances $X_1$, $X_2$ and $X_3$ of different materials are stored in the following manner. FIGS. 71 to 74 show results of calculation of the volume ratios of substances $X_1$, $X_2$ and $X_3$ and the volume ratio of the whole substance respectively, when there are a plurality of substances in the analysis area. Referring to FIG. 71, when the analysis area is divided into 5 units in the longitudinal directional and 5 units in the lateral direction, it is necessary to store the volume ratio of each of the divided cells for each of the substances and for the entire substance. Therefore, if the number of substances increases, the storage capacity must be increased corresponding to the increased number. Especially when the analysis is effected three dimensionally, enormous amount of storage capacity is required. As a result, the analysis area cannot be divided into small pieces because of the limit in the storage capacity of the computer and simulation with high precision cannot be performed.

SUMMARY OF THE INVENTION

The present invention was made to solve the above described problems and its object is to provide a method of shape simulation allowing highly precise simulation of processed shape during the steps of manufacturing a semiconductor device.

Another object of the present invention is to provide a method of shape simulation by which processed shape in the steps of manufacturing a semiconductor device can be simulated in a short period of time.

Another object of the present invention is to provide a method of shape simulation by which processed shape in the steps of manufacturing a semiconductor device can be simulated with small storage capacity.

According to an aspect of the present invention, the shape simulation method includes a first step of dividing a prescribed analysis area, in which volume ratios assuming values from 0 to 1 are distributed, into a plurality of analysis elements to the center of each of which the initial value of volume ratio, that is, initial volume ratio, is allotted; a second step of updating the volume ratio by calculating time change of the volume ratio; and a third step of determining the shape based on the volume ratio updated in the second step; wherein the first step includes a fourth step of dividing the analysis area such that when a first analysis element having initial volume ratio of "1" neighbors a second analysis element having initial volume ratio of "0", the first analysis element has the same width as that of the second analysis element in the neighboring direction, the second step includes a fifth step of updating the volume ratio at the center of the analysis element, and the third step includes a sixth step for determining the shape based on a position having the volume ratio of 0.5.

Therefore, among the analysis elements, when a first element having the initial volume ratio of 1 is next to a second element having the initial volume ratio of 0, these two elements have the same width in the direction in which these are next to each other. Therefore, the volume ratio attains 0.5 at the boundary between adjacent first and second elements. That is, that position at which the volume ratio is 0.5 at the initial state is on the boundary between neighboring first and second elements, and therefore the position does not exist in any of the analysis elements.

As a result, the position at which the volume ratio is 0.5 at the initial state is on the boundary of neighboring first and second elements, and therefore the processed shape during the steps of manufacturing the semiconductor device can be simulated with high precision.

According to another aspect of the present invention, the shape simulation method is for simulating the shape in an analysis area which changes due to movement of substance particles, and the method includes a first step of dividing the analysis area into a plurality of analysis elements; a second step of specifying a first boundary between moving area and non-moving area in a first analysis element positioned at the surface among the analysis elements; and a third step of specifying a second boundary between the moving area and the non-moving area of substance particles in a second analysis element positioned at the surface and close to the first analysis element, based on the above mentioned first boundary.

The second boundary of the second analysis element which is close to the first analysis element is a t a position approximately the same as that of the first boundary of the first analysis element. Therefore, the second boundary can be specified in a short period of time when the second boundary is specified based on the first boundary which has been already obtained.

In addition, it is not necessary to decrease the number of division of solid angle and analysis elements. As a result, processed shape during steps of manufacturing a semiconductor device can be simulated in a short period of time with high precision.

In accordance with a still another aspect of the present invention, the shape simulation method includes a first step of dividing a prescribed analysis area, in which volume ratios assuming values in a prescribed range are distributed, into a plurality of analysis elements to the center of each of which an initial value of volume ratio, that is, initial volume ratio is allotted; a second step of calculating an equal volume ratio face at which the volume ratio assumes a prescribed value based on the volume ratio of the analysis elements; and a third step of calculating time change of the volume ratio by calculating amount of substance particles passing through the equal volume ratio face.

Since time change of the volume ratio is calculated by calculating the amount of substance particles passing through the equal volume ratio face at which the volume ratio assumes a prescribed value as described above, the time change of the volume ratio can be correctly calculated.

As a result, the processed shape during the steps of manufacturing a semiconductor device can be simulated with high precision.

According to a still another aspect of the present invention, the shape simulation method is to simulate the shape of a substance including a plurality of materials, and the method includes a first step of dividing an analysis area including the aforementioned substance into a plurality of analysis elements, and a second step of storing, when an analysis element is completely filled with only one material among the plurality of materials, only a first code which corresponds to the type of each material, for every analysis element.

Since only the first code corresponding to the type of each material is stored for that analysis element which is completely filled with only one type of material among the plurality of materials is stored, the storage capacity for storing the volume ratios can be reduced. More specifically, the analysis element for which the first code is stored, can represent that the material corresponding to the first code exist in the element with the volume ratio of "1".

As a result, the amount of data to be stored corresponding to the analysis element can be reduced, whereby the analysis element can be further divided, enabling simulation of processed shape during steps of manufacturing the semiconductor device with higher precision.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 29 to 33 are first to fifth illustrations for help describing validity of the method of determining the boundary in the conventional shape simulation method.

FIG. 58 shows result of calculation of volume ratio of silicon.

FIG. 59 shows result of calculation of volume ratio of polysilicon.

FIG. 60 shows result of calculation of volume ratio of $SiO_2$.

FIG. 61 shows material indexes corresponding to FIGS. 58 to 60.

FIG. 63 shows a state before deposition calculation.

FIG. 64 shows a state after deposition calculation.

FIG. 65 shows a state after volume ratio correction.

FIG. 66 shows a state between etching calculation.

FIG. 67 shows a state after etching calculation.

FIG. 68 shows a state after volume ratio correction.

FIG. 70 shows a boundary face of surface cells in accordance with a conventional shape simulation method.

FIG. 71 shows result of calculation of volume ratio of substance $X_1$ when there are a plurality of substances in the analysis area.

FIG. 72 shows result of calculation of volume ratio of substance $X_2$ when there are a plurality of substances in the analysis area.

FIG. 73 shows result of calculation of volume ratio of substance $X_3$ when there are a plurality of substances in the analysis area.

FIG. 74 shows result of calculation of volume ratio of all substances when there are a plurality of substances in the analysis area.

DESCRIPTION OF THE PREFERRED EMBODIMENTS

1. Basic Concept of the Present Invention

Figure 1:
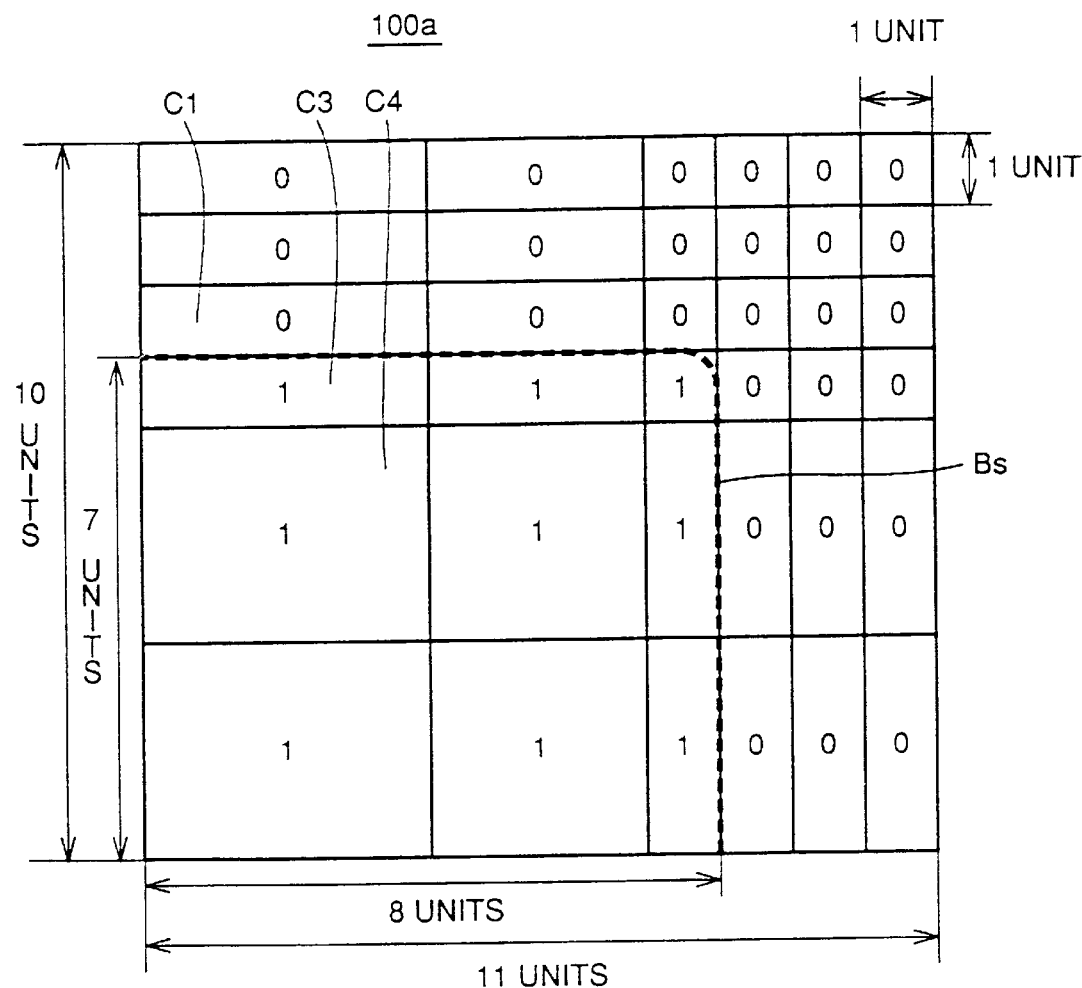
FIGS. 1 and 2 are first and second conceptual figures showing basic concept of the present invention.
Figure 2:
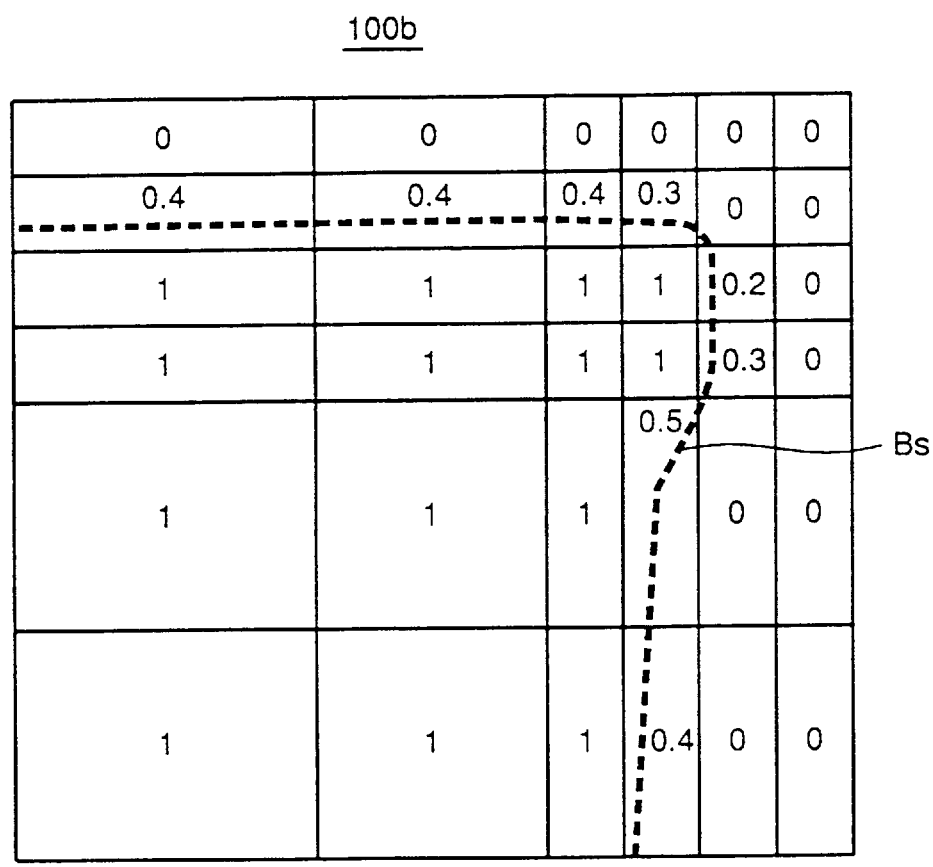

Before specific description of details of the present invention, the basic concept will be described. FIGS. 1 and 2 show analysis areas 100*a* and 100*b* divided into a plurality of cells. Similar to the analysis areas 200*a* and 200*b* described with reference to FIGS. 28 and 29 of the prior art, analysis areas 100*a* and 100*b* are shown having the size of 11 units in the lateral direction and 10 units in the longitudinal direction, as an example. The numeral shown in each cell denotes the volume ratio at the center of each cell.

FIGS. 1 and 2 show shapes before and after film formation, respectively. Referring to FIG. 1, the cell with the volume ratio "1" allotted thereto indicates that a substance such as silicon has already existing, while the cell with the volume ratio of "1" allotted thereto indicates that a substance has not yet existed. Here, the substance is divided into a plurality of cells based on the premise that the substance occupies a rectangle having the size of 8 units to the right and 7 units upward from the lower left corner of the analysis area 100*a* at the initial state. Accordingly, similar to FIG. 28, cells obtained by dividing a rectangle occupying 8 units to the right and 7 units upward from the lower left corner of the analysis area 100*a* are allotted volume ratio "1".

Figure 28:
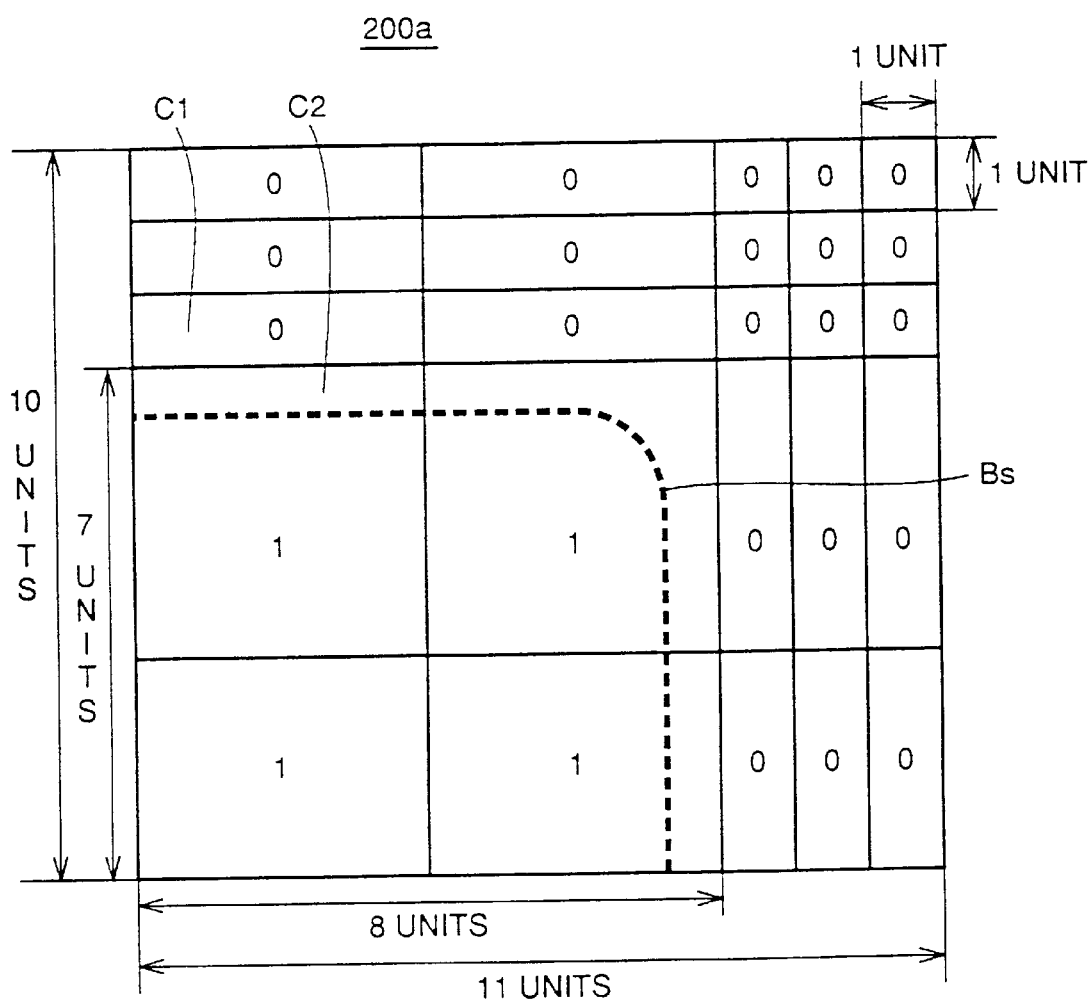
FIGS. 28 shows a concept of the conventional shape simulation method.
Figures 29, 30:
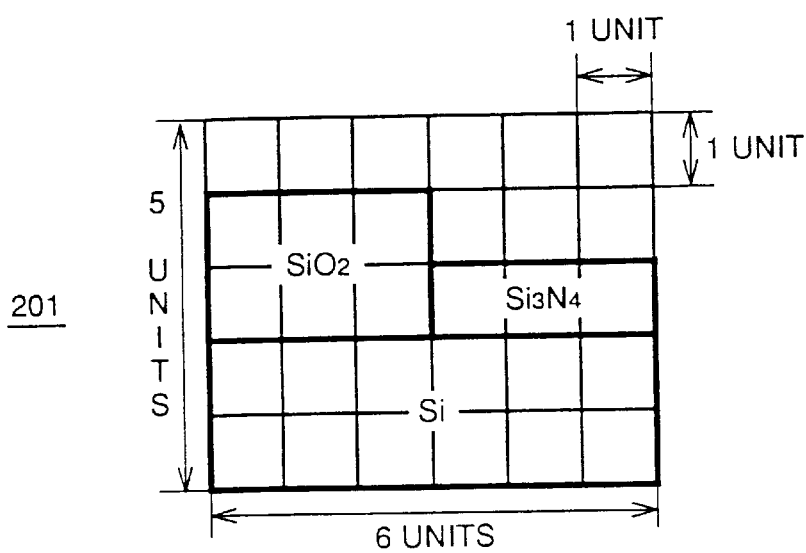

However, the number of division and the size of the cells of analysis area 100*a* are different from those of analysis area 200*a* shown in FIG. 28. In the area where the substance exists, that is, the area having the volume ratio of "1", that portion which has been denoted by the cell C2 in analysis area 200*a* is further divided into two cells C3 and C4 in analysis area 100*a*. Cell C1 is placed next to the upper side of cell C3, and the volume ratio of "0"is allotted to cell C1.

With respect to the direction in which cells C1 and C3 are placed side by side, widths of cells C1 and C3 are made equal to each other. Therefore, by interpolation of volume ratio, the volume ratio at the position 7 units from the lowermost side of analysis area 100*a* is calculated to be "0.5", and therefore the upper limit of the substance boundary $B_S$ comes to be positioned at the boundary between the cell C3 having the volume ratio of "1" and the cell C1 having the volume ratio "0". Similarly, the right limit of the substance boundary $B_S$ is positioned at the boundary between the cell having the volume ratio of "1" and the cell having the volume ratio of "0" which are adjacent to each other, namely, the position 8 units from the leftmost side.

This is very much consistent with the premise that the substance occupies a rectangle having the size of 8 units to the right and 7 units upward from the lower left corner of analysis area 100a at the initial state.

In the analysis area 100b obtained by deposition simulation with the analysis area 100a used as the initial state, the boundary of the substance denoted by the dotted line, that is, the shape of the substance never enters inside the rectangle having the size of 8 units to the right and 7 units upward from the lower left corner. In other words, a shape as if the substance which has existed previously were etched never results in this simulation, and a shape which is reasonable and valid as the result of deposition simulation is obtained.

As described above, in the present invention, when the shape is simulated with the position at which volume ratio attains to "0.5" being regarded as the substance boundary by interpolation, precision in simulation is improved simply by dividing the analysis area into cells at the initial state in accordance with a prescribed rule. Therefore, as compared with the prior art example, the number of memories are not extremely increased, and the time necessary for calculation is not very much increased, since separate complex calculations are not necessary. The prescribed rule here is simply to make equal the widths of cells when cells having volume ratios "1" and "0" are neighboring with each other, in the direction in which these cells are placed side by side, whereby the position at which the volume ratio attains to "0.5" by interpolation can be located at the cell boundary. The aforementioned width of adjacent cells have only to be approximately equal. For example, if there is an error of about 50%, the position at which the volume ratio attains to "0.5" nearly corresponds to the boundary between adjacent cells, thus providing similar effects as mentioned above.

Figure 2A:
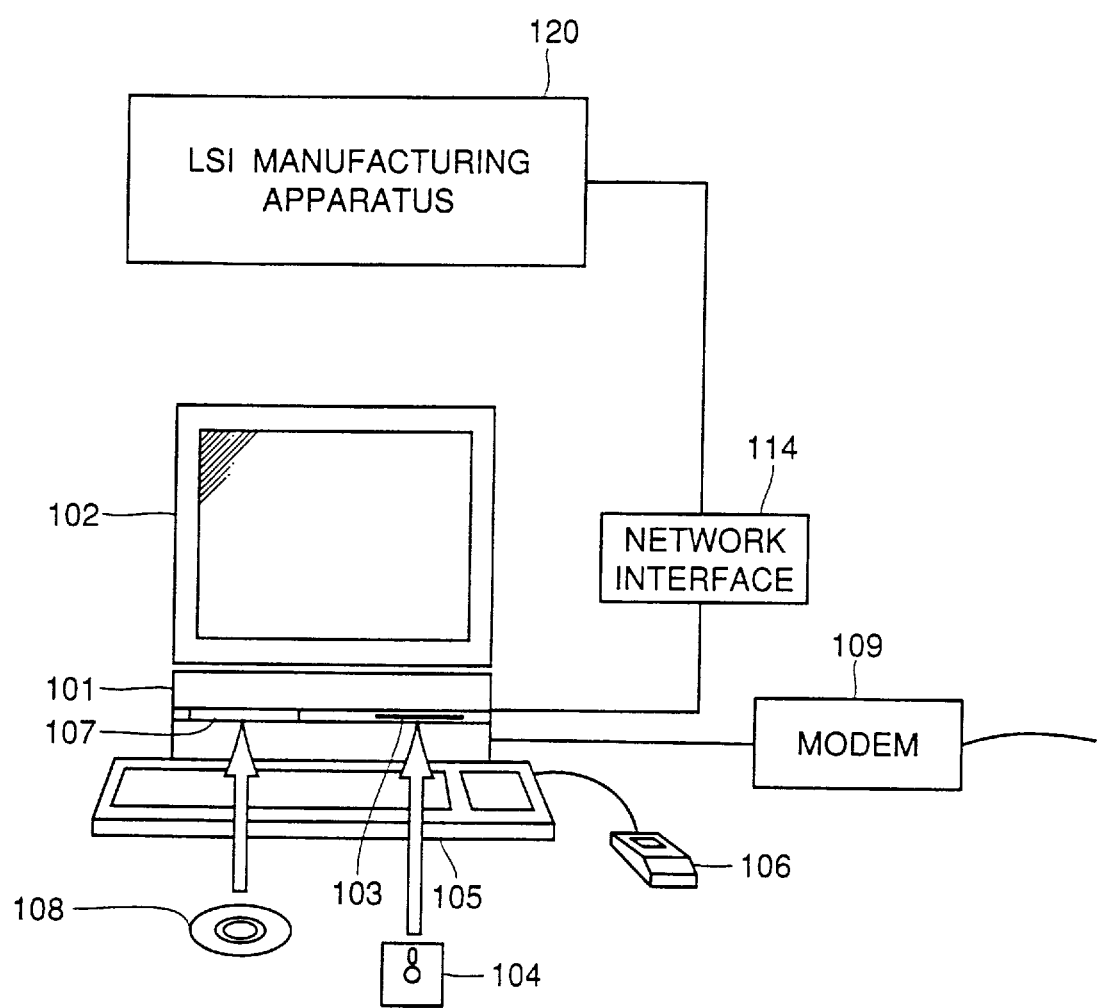
FIGS. 2A and 2B shown a computer for performing shape simulation of the present invention.
Figure 2B:
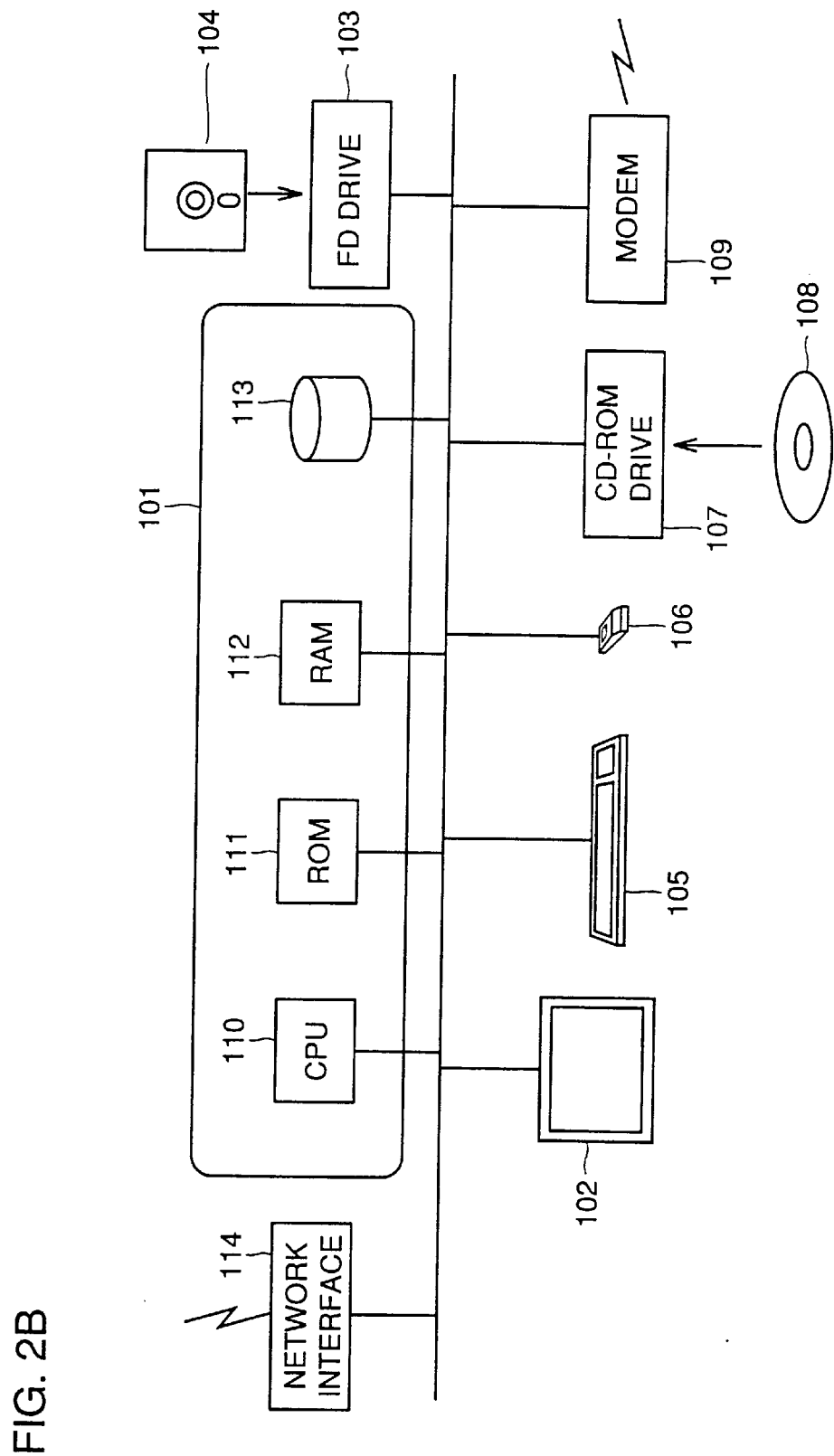

Referring to FIGS. 2A and 2B, the apparatus for performing shape simulation of the present invention is substantially a computer including a main body 101, a graphic display device 102, an FC drive 103 for a flexible disc (FD) 104, a keyboard 105, a mouse 106, a CD-ROM drive 107 for a CD-ROM (Read-Only Memory), a modem 109, and a network interface 114 for interfacing the computer to LAN (Local Area Network). The computer is connected to semiconductor processing apparatus 120 through the network interface 114 and the LAN.

Specifically, referring to FIG. 2B, the main body 101 of the computer includes a CPU (Central Processing Unit) 110, a ROM 111, an RAM (Random Access Memory) 112, and a hard disc 113.

The operation of the computer itself is well known, and therefore, detailed description thereof is not repeated here.

The method of shape simulation in accordance with the present invention is implemented by having the computer execute a prescribed program for shape simulation. The shape simulation program is supplied, to a user, stored in a flexible disc 104 or a CD-ROM 108. The program may be transferred from a network to the computer through modem 109 or network interface 114.

The program is stored in hard disc 113, loaded to RAM 112 and executed by the CPU. Control architecture of the program will be described later. The operator performs simulation by operating keyboard 105 and mouse 106 while monitoring graphic display device 102.

Figure 2C:
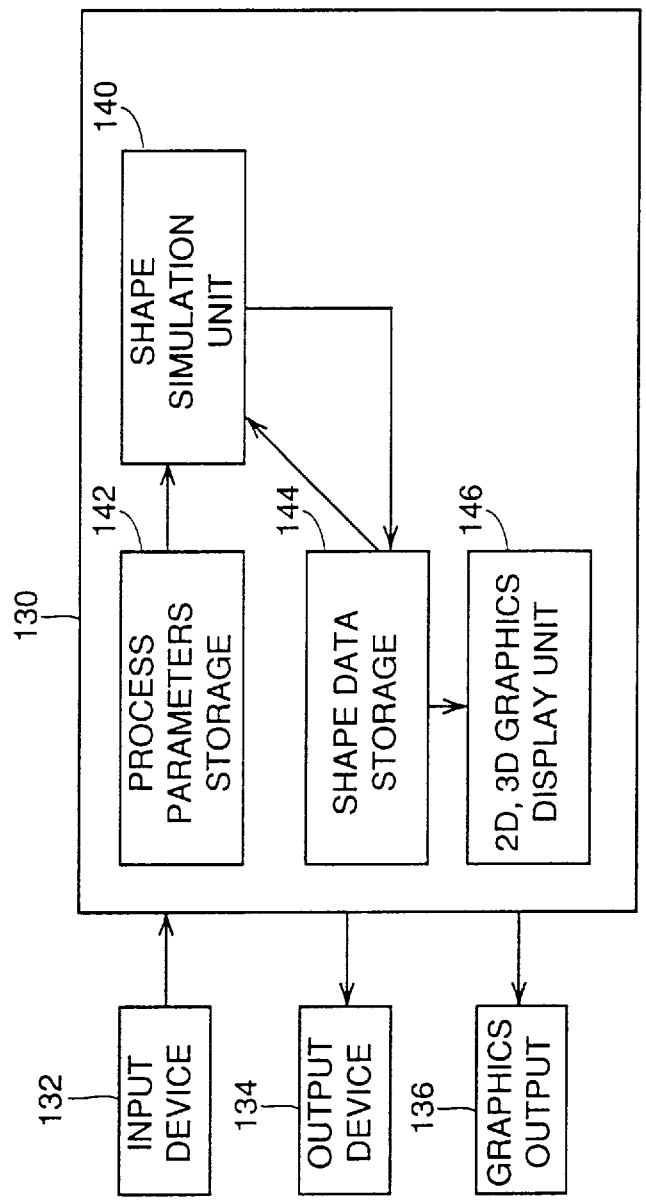
FIG. 2C shows a system configuration realized by the computer executing a program for shape simulation.

A system configuration realized by the computer executing the program is as shown in FIG. 2C. Referring to FIG. 2C, the system includes an input device 132 for the user to supply commands, necessary parameters and the like to the system and for inputting data of the shape to be simulated to the system; a shape simulator 130 for performing shape simulation based on the commands, parameters and shape data applied from input device 132, an output device 134 for outputting a set of optimal parameters, which be described later, for example, generated by the shape simulator; and a graphics output 136 for displaying the shape of the semiconductor generated by shape simulation as a two-dimensional or three-dimensional image. Keyboard 105, mouse 106, FD drive 103, CD-ROM drive 107, modem 109 and network interface 114 correspond to the input device 132. FD drive 103, modem 109, network interface 114 or the like correspond to the output device 134. Graphic display device 102 corresponds to graphics output 136.

Simulator 130 includes a process parameter storage 140 for storing process parameters for the semiconductor manufacturing process; shape data storage 144 for storing shape data of the semiconductor device to be simulated; a shape simulation unit 140 for simulating a process of a designated semiconductor device such as etching, deposition or reflow using the shape data stored in shape data storage 144, forming shape data of the semiconductor device after processing and for storing the data in shape data storage 144; and a 2D, 3D graphics display unit 146 for generating and applying to graphics output 136 a two-dimensional or three-dimensional image of the shape of the semiconductor device obtained as a result of shape simulation stored in shape data storage 144.

RAM 112, hard disc 113, flexible disc 104 or the like provides storages 142 and 144. The program executed by CPU 110 provides shape simulation unit 140 and 2D, 3D graphics display unit 146.

Figure 2D:
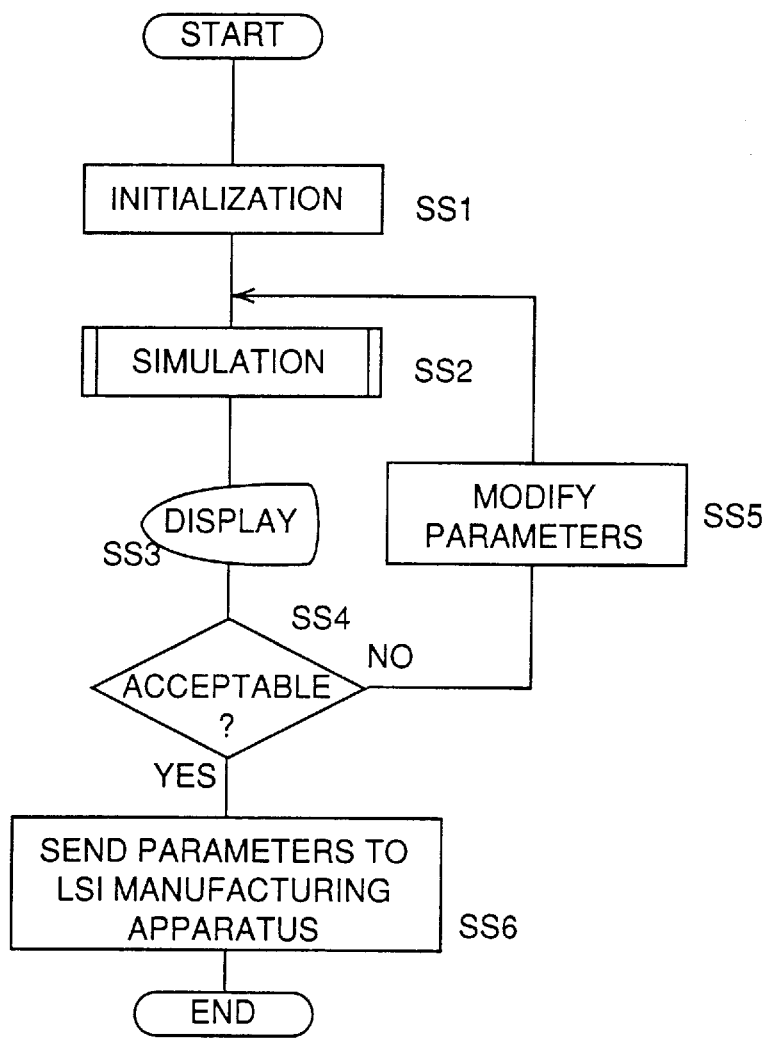
FIG. 2D is a flow chart of a program for realizing a process of controlling the semiconductor manufacturing apparatus of FIG. 2A.

FIG. 2D is a flow chart of the program for realizing the process of controlling semiconductor processing apparatus 120 using the shape simulation method in accordance with the present invention. The program includes, as a part thereof, a portion for performing shape simulation which will be described in the following. When seemingly appropriate parameters are obtained as a result of simulation, the program applies the parameters to the semiconductor processing apparatus 120, so that the semiconductor is processed actually in accordance with the process parameters. The semiconductor processing apparatus 120 is to perform etching of the semiconductor device, deposition of a layer on the semiconductor device, performing reflow of a layer on a semiconductor device or the like.

Referring to FIG. 2D, in step SS1, the system is initialized. Here, for example, initial values of process parameters are set, file of hard disc 113 storing the shape data for the simulation is designated, and ranges of values of desired shape parameters to be obtained as a result of simulation are defined.

In step SS2, shape simulation is performed using the set data. A main characteristic of the present invention resides in the method of performing shape simulation, details of which will be described later.

In step SS3, the shape of the semiconductor device obtained as a result of simulation is graphically displayed. At this time, shape parameters of the semiconductor device obtained as a result are also displayed.

In step SS4, whether or not the shape parameters obtained as a result of simulation satisfy the condition set in step SS1 is determined. This may be determined by the operator referring to the displayed value. However, in the present embodiment, the user does not take part in this determination and the program determines. If the result is satisfactory, in step SS6, the process parameters at this time are transferred through network interface 114 to semiconductor processing apparatus 120, so that the semiconductor device is actually processed by using the process parameters. If the result does not satisfy a prescribed condition, in step SS5, the value of the process parameters are changed and the control returns to step SS2. Thereafter, the process from step SS2 to SS5 is repeated until a satisfactory result is obtained.

There are various methods as to how the parameters are to be changed in step SS5. For example, for a process parameter or a combination of a plurality of process parameters, change in the parameter value and change in the shape of the semiconductor device obtained at that time are studied through experiment in advance, and relation therebetween is estimated in advance. At the time of simulation, difference between the result and the desired value is fitted with the relation estimated in advance, whereby it can be determined in which direction the parameter should be changed to obtain the result closer to the desired value.

2. Specific Methods

A specific method of shape simulation in accordance with the present invention will be described with reference to the figures. The method described below is disclosed in, for example, in Japanese Patent Laying-Open No. 4-133326 of the same applicant, except the technique for calculating substance boundary and the technique related to cell division.

(1) Overall Flow

Figure 3:
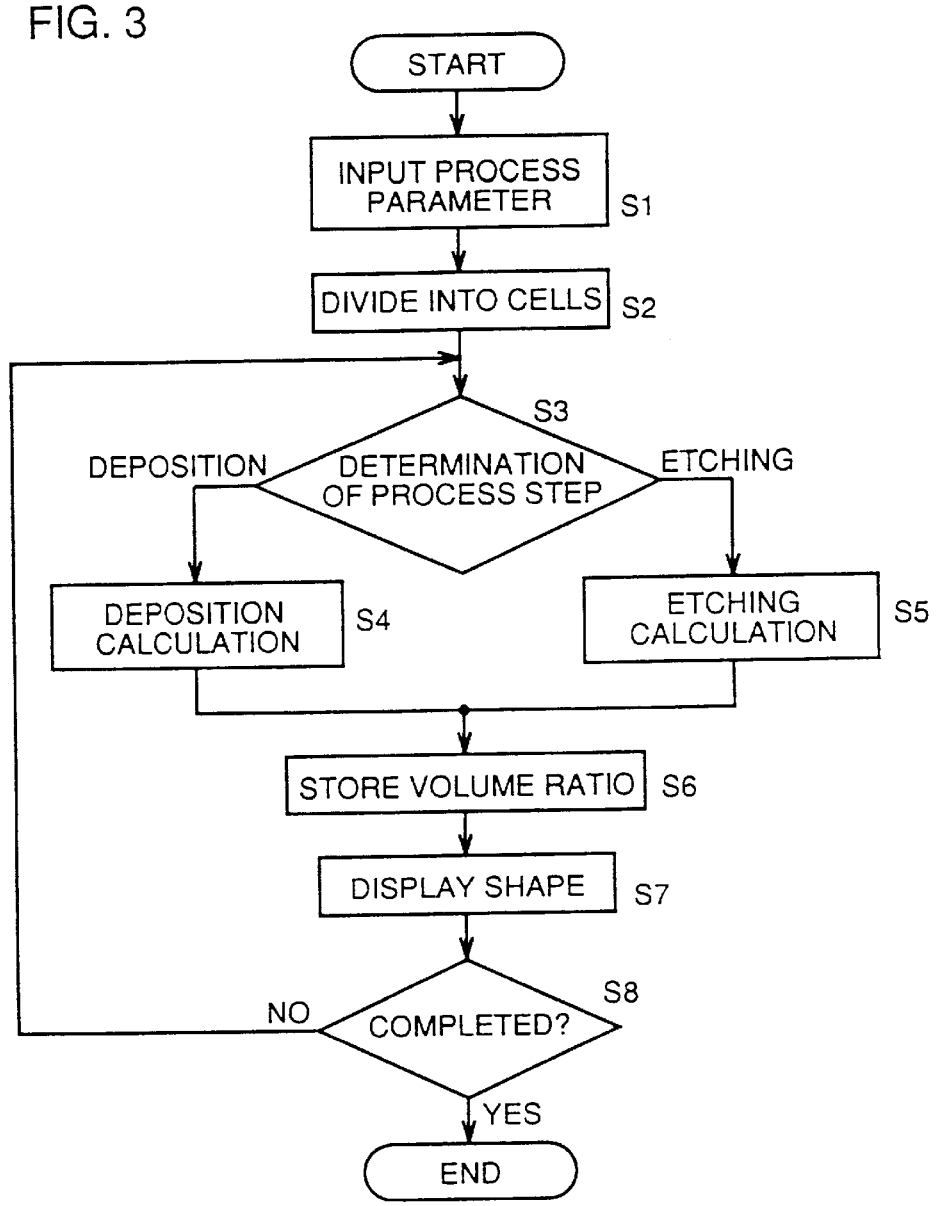
FIG. 3 is a flow chart showing one embodiment of the present invention.
Figure 4:
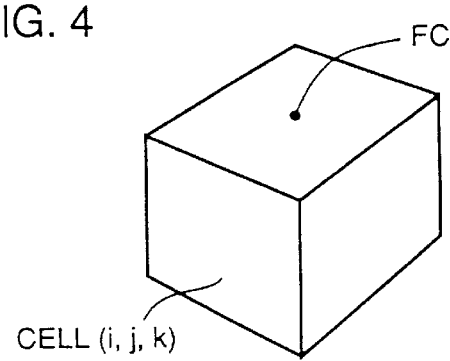
FIG. 4 is a perspective view showing a rectangular parallelepiped cell as an example.

Referring to FIG. 3, first, process parameters are input in step S1. Next, in step S2, an analysis area is divided into a plurality of rectangular parallelepiped cells, and a volume ratio as a prescribed condition is applied to each of the cells. FIG. 4 is a perspective view showing a rectangular parallelepiped cell and each cell is represented by (i, j, k) if the cell number in the x direction is i, in the y direction j and in the z direction k.

As already described in the section "1. Basic Concept of the Present Invention", when cells having volume ratios "1" and "0" are placed next to each other, the widths of the cells are made equal with respect to the direction along which the cells are placed next to each other, in this step S2 of cell division. In "1. Basic Concept of the Present Invention", two dimensional cells have been described. However, division can be performed similarly to provide three dimensional cells. In addition, the position at which the volume ratio attains "0.5" can be placed at the cell boundary by interpolation in the similar manner. Therefore, the substance boundary can be similarly located at the cell boundary as the example shown in FIG. 1.

In the next step S3, it is determined what analysis (shape simulation) for what processing is to be carried out in the analysis area. If it is the deposition processing, the flow proceeds to step S4 where deposition calculation is performed. If it is an etching process, the flow proceeds to step S5 where etching calculation is performed. In the steps S4 and S5, the volume ratio of the substance of each cell is calculated when the deposition process or the etching process has been completed. Thus the volume ratio of each cell is obtained in the similar manner as shown in FIG. 2. Then, the volume ratio in each cell is stored in step S6, the position having the volume ratio of "0.5" is calculated in step S7, and the substance boundary $B_S$ is displayed. Steps S5 to S7 are repeated until it is determined in S8 that a series of processes are terminated completely.

(2) Specific Method of Deposition Calculation

Figure 5:
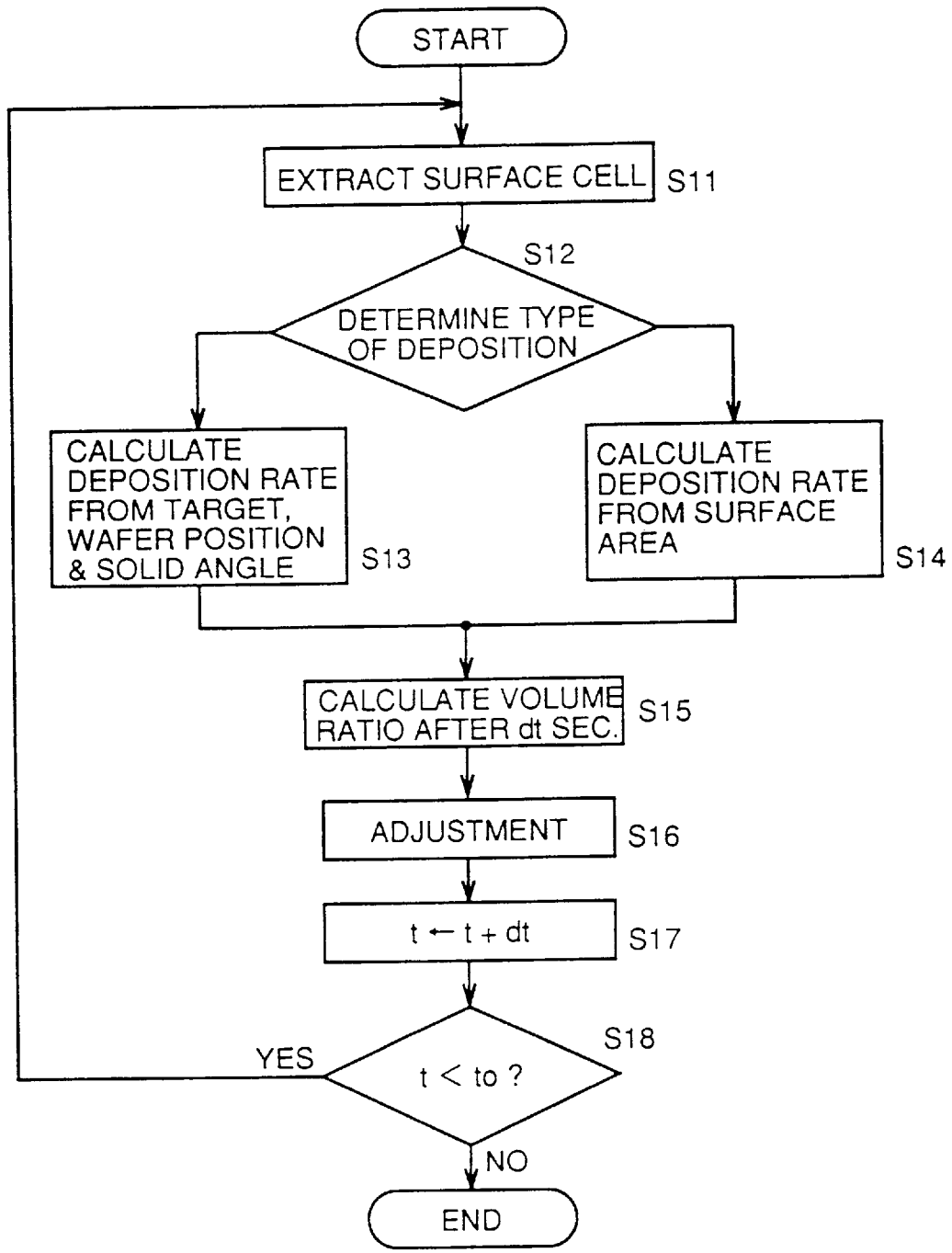
FIG. 5 is a flow chart showing deposition calculation of FIG. 3.

Method of deposition calculation will be more specifically described with reference to FIG. 5. Here, the volume ratio of substance existing in each cell is represented by $C^t$ (i, j, k).

First, in step S11, the surface cells are extracted in step S11. Whether a cell is a surface cell or not is determined in the following manner. Volume ratios $C^t$ (i±1, j, k), $C^t$ (i, j±1, k) and $C^t$ (i, j, k±1) around a cell (i, j, k) which is noted are calculated. Of these six values, if there is any which is smaller than 0.5, the cell (i, j, k) is regarded as the surface cell. However, the cell (i, j, k) having the volume ratio $C^t$ (i, j, k) of smaller than 0.5 is not regarded as the surface cell.

Next, in step S12, the type of deposition is discriminated. If the deposition is sputter deposition, a deposition speed is computed in step S13 from the positional relationship between a target and a wafer as well as from solid angle. If it is an isotropic deposition such as CVD, the deposition speed is calculated based on the surface area in step S14. In any case, the volume ratio $R_{ijk}$ at which a substance such as silicon to be deposited flows into the cell per unit time through the surface of the surface cell is determined on the basis of the calculated deposition speed.

Thereafter, in step S15, the volume ratio $C^{t+dt}$ (i, j, k) of the cell (i, j, k) after a very small time period dt is calculated in step S15.

$$C^{t+dt}(i,j,k)=C^t(i,j,k)+R_{ijk}\cdot dt$$

Thereafter, in step S16, the adjustment of the volume ratio of each cell is performed. That is, when the volume ratio $C^{t+dt}$ (i, j, k) calculated in accordance with the above equation exceeds 1, cells α, β, γ, . . . having volume ratios of less than 0.5 are detected from among the cells (i±1, j, k), (i, j±1, k) and (i, j, k±1) around that cell (i, j, k). The areas with which the cell (i, j, k) is in contact with these cells α, β, γ, . . . are denoted as Sα, Sβ, Sγ, . . . , and the following expressions apply:

$$C^{t+dt}(i,j,k) \leftarrow 1$$

$$C^{t+dt}(\alpha) \leftarrow C^{t+dt}(\alpha)+\eta \cdot S\alpha/(S\alpha+S\beta+S\gamma+ \ldots )$$

$$C^{t+dt}(\beta) \leftarrow C^{t+dt}(\beta)+\eta \cdot S\beta/(S\alpha+S\beta+S\gamma+ \ldots )$$

$$C^{t+dt}(\gamma) \leftarrow C^{t+dt}(\gamma)+\eta \cdot S\gamma/(S\alpha+S\beta+S\gamma+ \ldots ),$$

where $$\eta=C^{t+dt}(i,j,k)-1.$$

In this manner, the volume ratio is re-allotted.

The series of steps S11 to S16 is performed at every small time period dt until it is determined in steps S17 and S18 that a deposition time $t_0$ has elapsed.

As for the small time period dt, it should preferably be $dt=1/1\cdot R_{max}$ where $R_{max}$ represents the maximum value of the volume ratio $R_{ijk}$ flowing in or out in a unit time. However, the time period $dt_{end}$ of the last time step of deposition time $t_0$ should be $dt_{end}=t_0-n\cdot dt$, where n is an integer.

(3) Specific Method of Calculating a Solid Angle

As already described, it is necessary to calculate the solid angle in order to calculate deposition speed in steps S14 and S15. An example of the specific method will be described.

Figure 6:
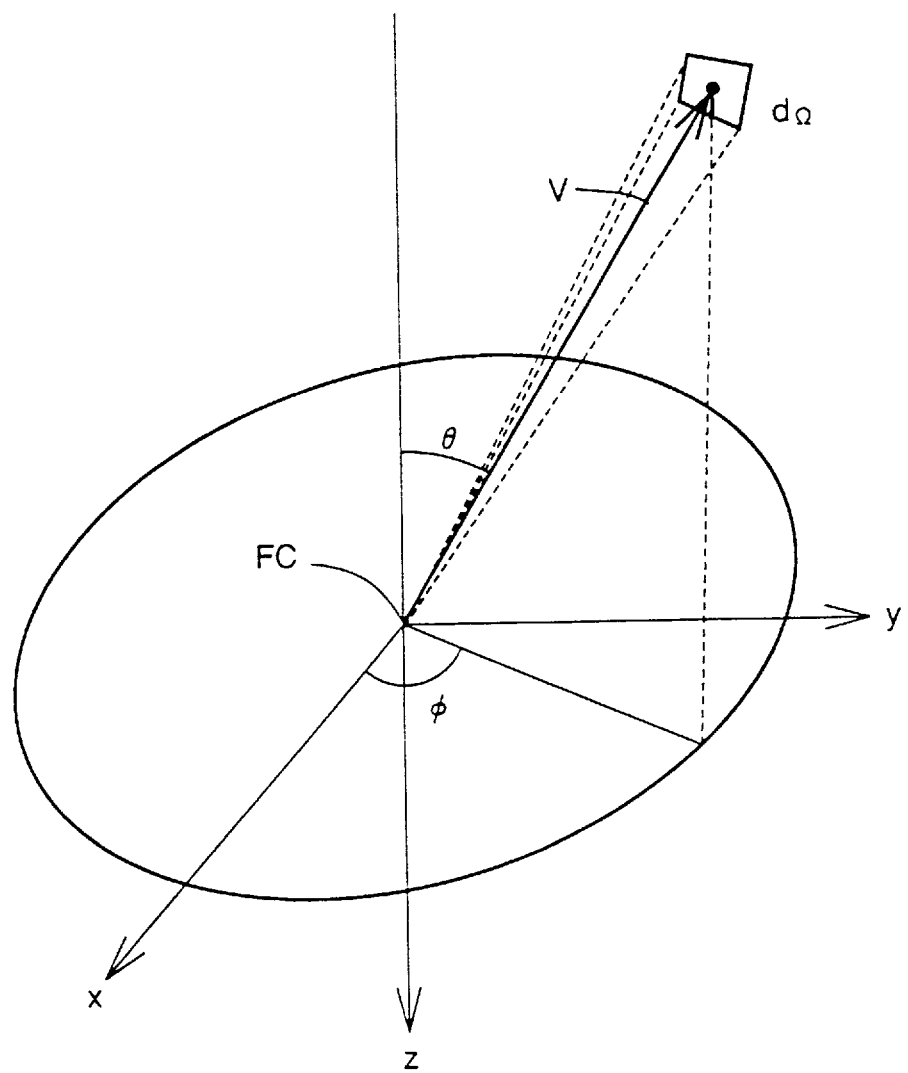
FIG. 6 is an illustration of a specific method of calculating a solid angle.

First, referring to FIG. 4, the cell (i, j, k) has six faces. The quantity of a substance that enters each face, that is, the number of particles, must be calculated. When the number of particles incident on one face of the cell is calculated, a vector $V=(V_X, V_Y, V_Z)$ with the center point FC of the face as a starting point is determined. When the coordinate system is set as shown in FIG. 6, it holds $V_X = \sin\theta \cdot \cos\phi$ $V_Y = \sin\theta \cdot \sin\phi$ $V_Z = \cos\theta$ $0 \leq \theta \leq \pi/2$ $0 \leq \theta \leq \pi/2$.

At this time, a very small solid angle $d\Omega$ is given by $d\Omega = \sin\theta\, d\phi\, d\theta$.

If the divisors in the $\theta$ direction and in the $\phi$ direction are denoted as $N\theta$ and $N\phi$, respectively, then $\theta = \pi(i-\frac{1}{2})/2N\theta$ $\phi = 2\pi(j-\frac{1}{2})/N\theta$, where $1 \leq i \leq N\theta$ $1 \leq j \leq N\phi$ where $1 \leq i \leq N\theta$ $1 \leq j \leq N\phi$.

When this vector V passes through other cells filled with a substance, particles cannot enter in that direction. Therefore, it is necessary to find through which cell the vector V passes. This can be found with relatively short calculation time if the following method is employed.

Figure 7:
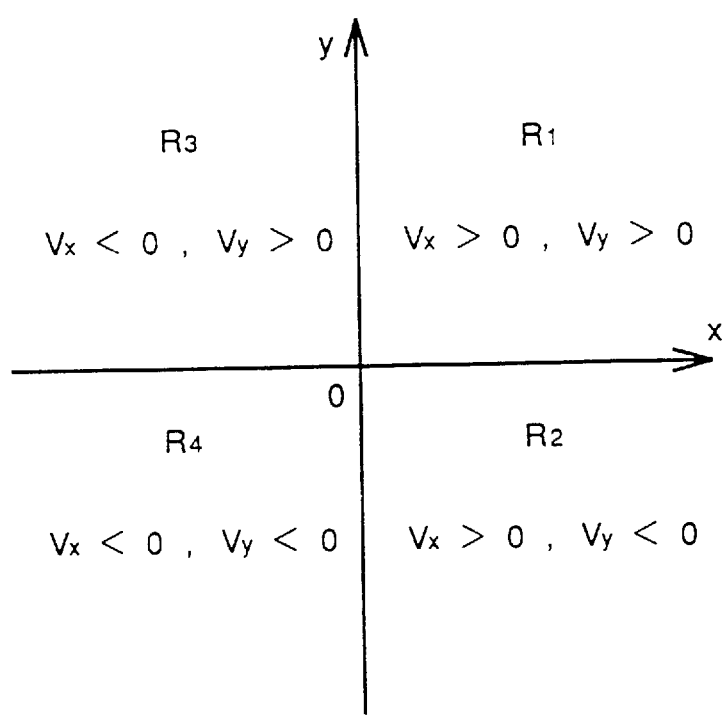
FIG. 7 shows divided areas.

First, as shown in FIG. 7, the xy plane is divided into four areas $R_1$ to $R_4$, and it is determined in which areas cells through which the vector V passes exist. Here, an example in which the cell exists in area RI will be described.

More specifically, since $V_X > 0$, $V_Y > 0$ and $V_Z \geq 0$, if a cell through which the vector V passes next to the cell (i, j, k) is denoted by (u, v, w), the relation $u \geq i$, $v \geq j$, $w \leq k$ holds. Further, the vector is regarded as the speed of the particles coming in that direction, and therefore the position vector $r = (x, y, z)$ of the particles after a lapse of t seconds is given by the following equations if the starting point of particles is denoted as $r_0 = (x_0, y_0, z_0)$:

$r = V \cdot t + r_0$ $x = V_X \cdot t + x_0$ $y = V_Y \cdot t + y_0$ $z = V_Z \cdot t + z_0$.

Figure 8:
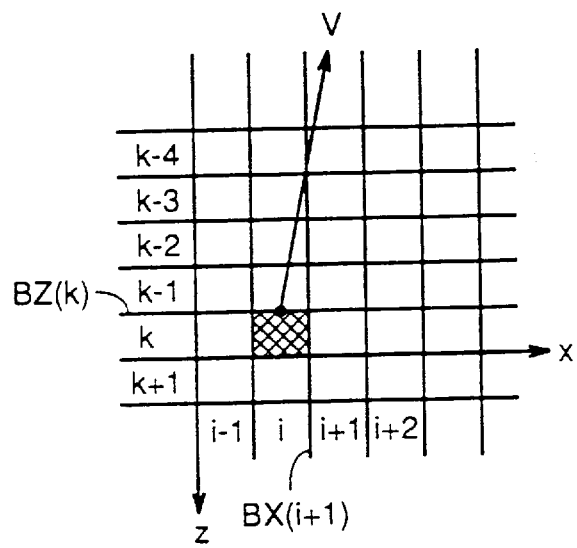
FIGS. 8, 9 and 10 are first to third illustrations showing a cell through which a vector V passes.
Figure 9:
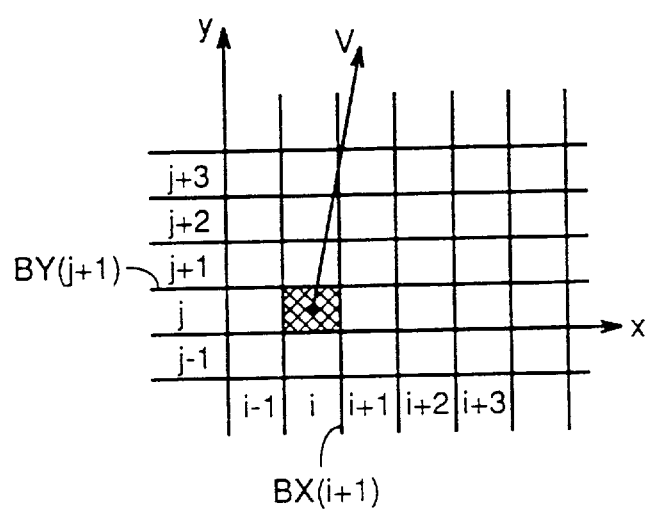

If the coordinates of the boundary of the neighboring cells are denoted as BX (i), BY (j) and BZ (k) as shown in FIGS. 8 and 9, the times at which the particles passes through the boundary BX (i+1), BY (j+1) and BZ (k) of the cell (i, j, k) are respectively expressed as:

$t_x(i+1) = \{BX(i+1) - x_0\}/V_X$ $t_y(j+1) = \{BY(j+1) - y_0\}/V_Y$ $t_z(k) = \{BZ(k) - z_0\}/V_Z$.

In the example shown in FIGS. 8 and 9, since $t_Z(k) < t_Y(j+1) < t_X(i+1)$, the cell number in the X direction at time t satisfying the relation $0 < t < t_X(i+1)$ is i. At time t satisfying the relation $0 < t < t_Y(j+1)$, the cell number in the y direction is j. Thus, the cell boundary coordinate in the z direction is moved like BZ (k-1), BZ (k-2), . . . until time t exceeds $t_Y(j+1)$. If the time t exceeds $t_Y(j+1)$, the cell boundary coordinate in the y direction is moved by one at this time, and $t_X(i+1)$ is compared with $t_Y(j+2)$.

Figure 10:
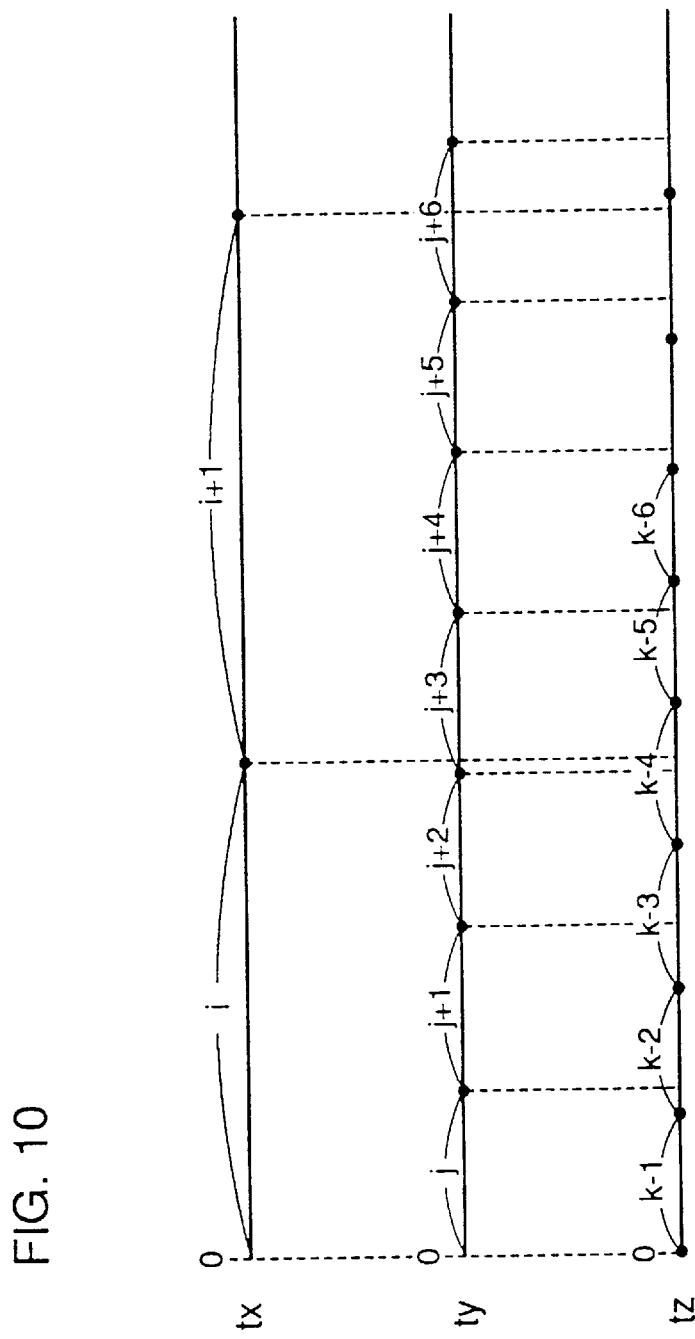

It can be seen from FIG. 10 that regarding cells through which the vector V passes, cell numbers in the X, Y and directions which are positioned at the same time should be written out, as (i, j, k-1), (i, j, k-2), (i, j+1, k-2), (i, j+1, k-3), (i, j+2, k-3), (i, j+2k-4), (i, j+3, k-4), (i+1, j+3, k-4), (i+1, j+3, k-5) . . . . In this case, however, it is preferable that first $t_Z$ be moved, next $t_Y$ and then $t_X$ and that cell numbers positioned at the same time be checked by taking the magnitude of each cycle of $t_X$, $t_Y$ and $t_Z$ into consideration.

A cell at the topmost position, that is, the cell having the smallest z coordinate which is filled with the substance is determined, and cells above this cell (in the direction of the −z axis) are not taken into consideration when the solid angle is determined. This can further reduce the calculation time.

(4) Specific Method of Calculating Substance Boundary

Figure 11:
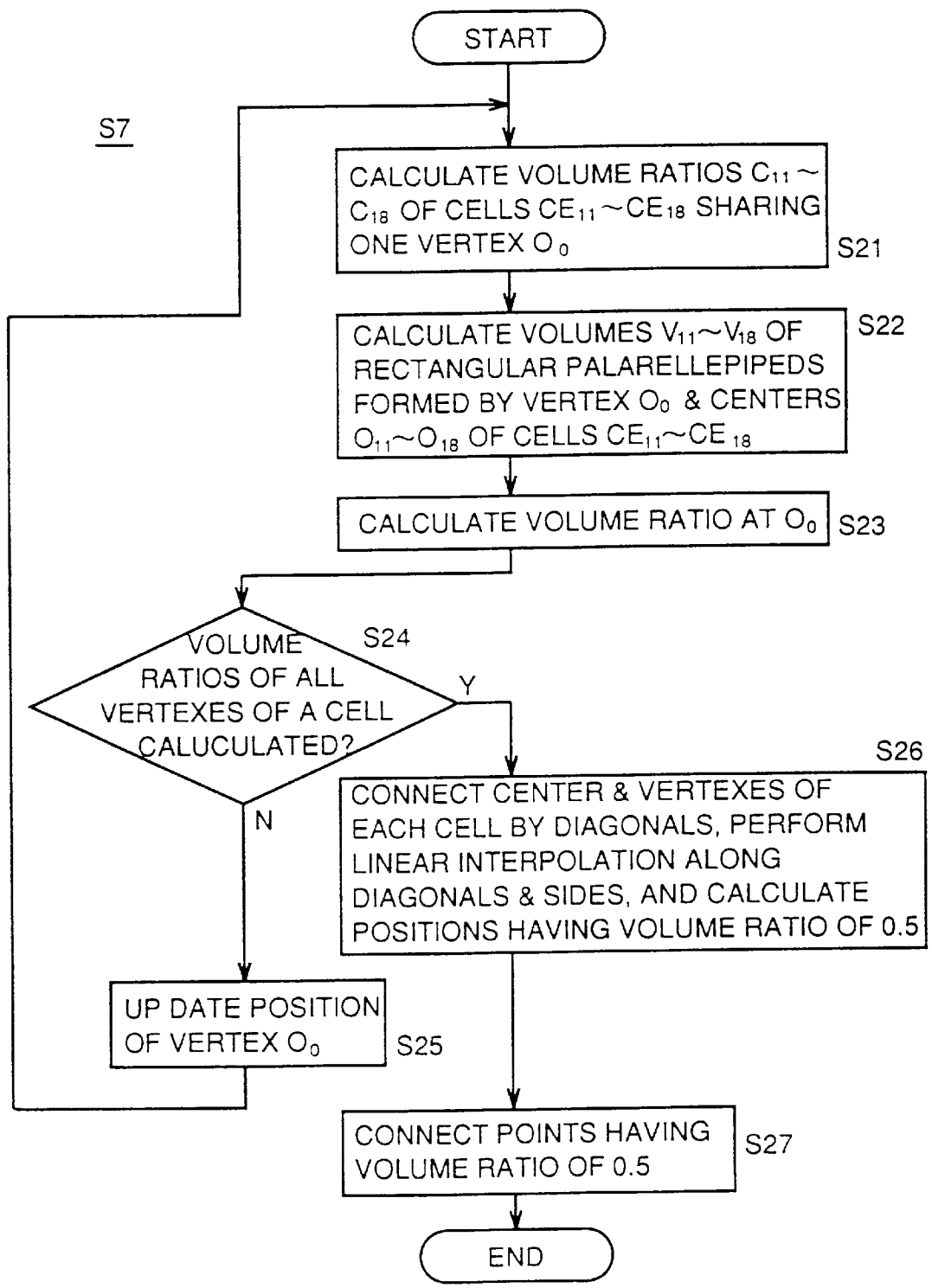
FIG. 11 is a flow chart showing a specific method of calculating substance boundary in the step S7 of FIG. 3.

The specific method of calculating the shape of the substance, that is, the substance boundary in step S7 of FIG. 3 will be described with reference to FIG. 11.

Figure 12:
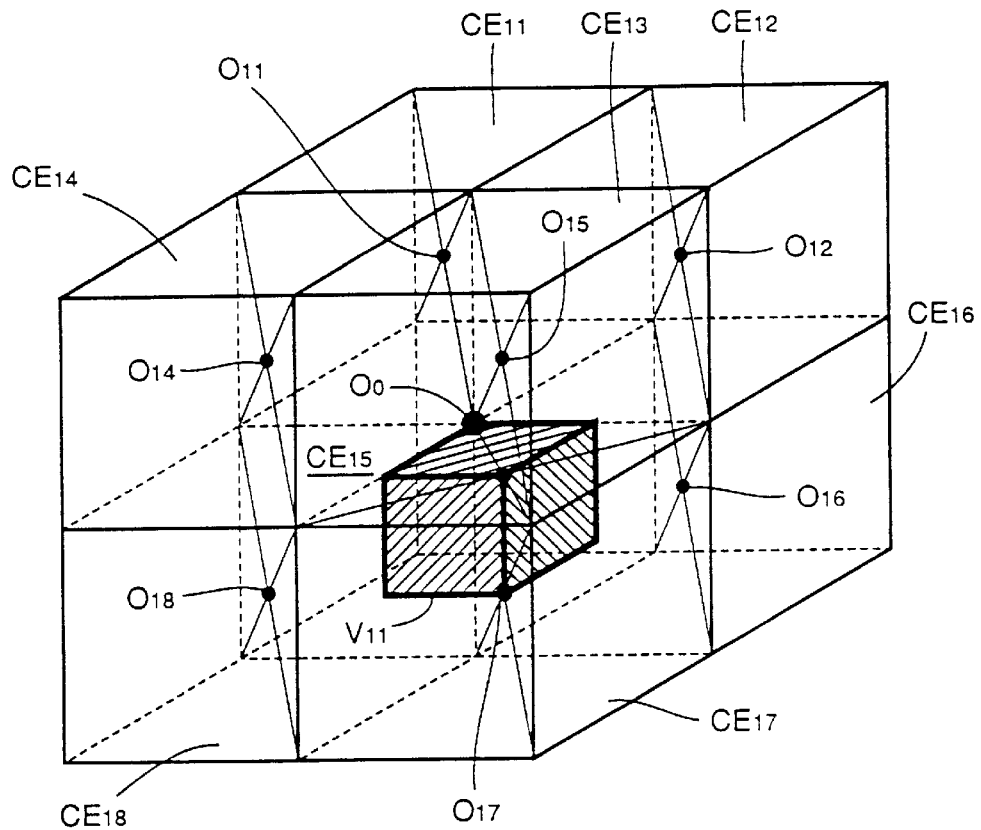
FIG. 12 is a perspective view showing a specific method of calculating substance boundary.

FIG. 12 is a perspective view showing 8 cells $CE_{11}$ to $CE_{18}$ sharing the same vertex $O_0$ in the analysis area. First, volume ratios $C_{11}$ to $C_8$ obtained at the centers $O_{11}$ to $O_{18}$ of respective cells are calculated (step S21). This calculation is effected in step S6 of FIG. 3 prior to step S7.

Next, in step S22, as the volume of a rectangular parallelepiped which corresponds to the cell of interest, the volume of a rectangular parallelepiped formed by the vertex $O_0$ and the center of that cell which opposes to the cell of interest with respect to the vertex $O_0$ is calculated. For example, note cell $CE_{11}$. The volume $V_{11}$ of the rectangular parallelepiped formed by the vertex $O_0$ and the center $O_{17}$ Of the cell $CE_{17}$ which is opposite to cell $CE_{11}$ is calculated. Similarly, when we note cell $CE_{12}$, the volume $V_{12}$ of the rectangular parallelepiped formed by the vertex $O_0$ and the center $C_{18}$ of the cell $CE_{18}$ opposing to cell $CE_{12}$ is calculated.

Based on the volumes $V_{11}$ to $V_{18}$ calculated in this manner, the volume ratio of vertex $O_0$ is calculated in accordance with the following equation:

$C_0 = (C_{11}V_{11} + C_{12}V_{12} + \ldots C_{18}V_{18})/(V_{11} + V_{12} + \ldots + V_{18})$.

The processes of steps S21 to S23 are repeated until the volume ratios of all the vertexes of a certain cell a calculated (steps S24, S25). In that cell of which volume ratios of all vertexes are obtained, interpolation is effected (step S26).

Figure 13:
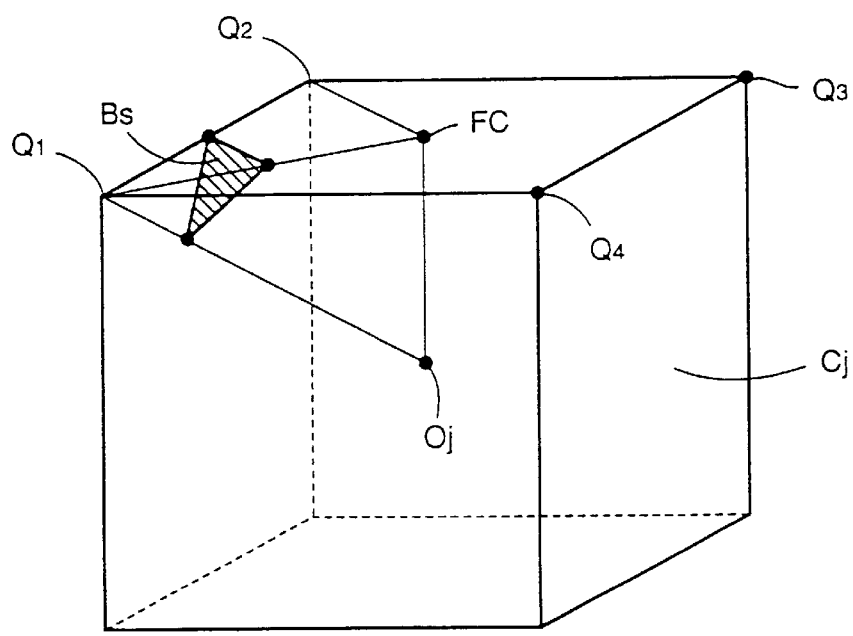
FIG. 13 is a perspective view showing the manner of calculating an equal volume ratio face.

FIG. 13 is a perspective view showing a manner how an equal volume ratio face is calculated in a cell $CE_j$ having the center $O_j$. Since volume ratios of respective vertexes of the cell $CE_j$ have been calculated through steps S21 to S25, the volume ratio of a face center FC of a face of the cell $CE_j$ is calculated as an average value of four vertexes $Q_1$ to $Q_4$ of that face. By effecting interpolation at each side of a tetrahedron constituted by four points, that is, the face center, adjacent two of vertexes $Q_1$ to $Q_4$ and the center $O_j$, the position having the volume ratio of "0.5" can be found. Therefore, by connecting these positions, the substance boundary $B_S$, that is, the shape of the substance can be calculated (step S27).

(5) The Reason Why the Position Having the Volume Ratio "0.5" is Regarded as the Substance Boundary The reason has already been briefly described in the section "2. Method of Determining Boundary". Here, validity of the method of determining the boundary will be further discussed in relation with the error rate. For simplicity, a two dimensional analysis area will be described. However, the same applies to three dimensional analysis area as well.

Figure 14:
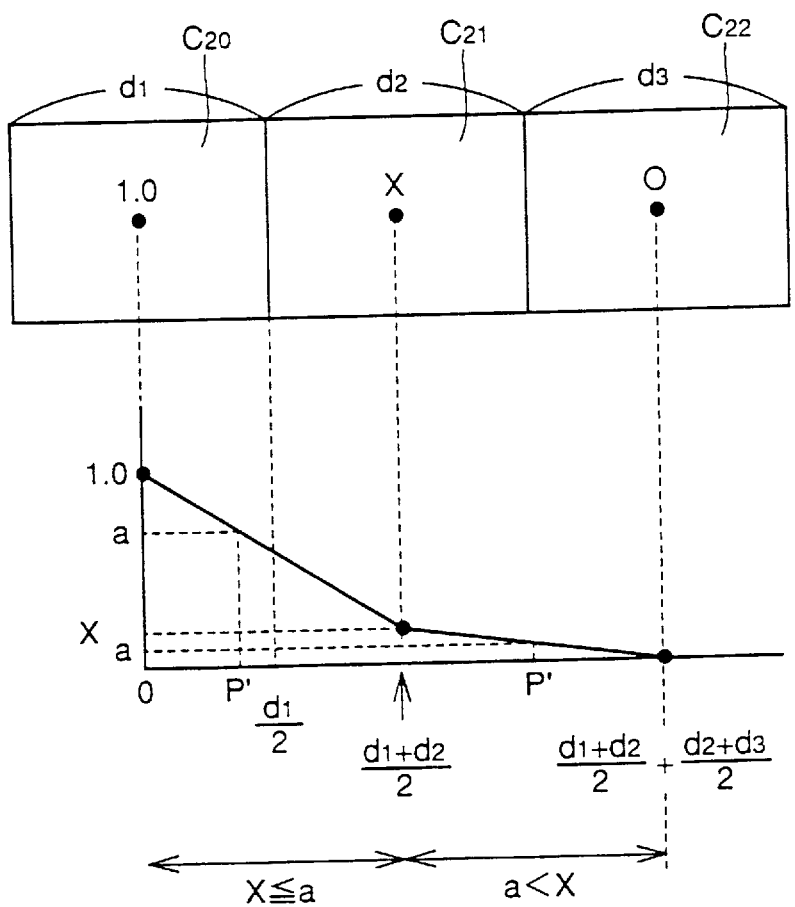
FIG. 14 is an illustration showing validity of the method of determining boundary.

FIG. 14 is an illustration showing cells $C_{20}$ to $C_{22}$ placed next to each other in one direction. The widths of the these cells along this direction are $d_1$ to $d_3$, respectively. Volume ratios "1.0", "x" and "0" are allotted to the centers of cells $C_{20}$ to $C_{22}$.

Let us consider an example in which a position having the volume ratio of a is regarded as the substance boundary. Since the volume ratio x assumes a value from 0 to 1, the position P' of a point on the boundary is determined between the center of the cell $C_{20}$ and the center of the cell $C_{22}$ by interpolation, dependent on the magnitude of x and a. Therefore, the position P' can be represented as $$P' = \begin{cases} \left(\frac{1-a}{1-x}\right)\left(\frac{d_1+d_2}{2}\right) & (x \leq a) \\ \frac{d_1+d_2}{2} + \left(\frac{a-x}{0-x}\right)\left(\frac{d_2+d_3}{2}\right) & (a < x) \end{cases}$$

If the analysis area is divided to satisfy the relation of $d_1:d_2=d_2:d_3$ and the width $d_2$ is fixed to 1, then $d_1=1/d_3$. The position of the actual boundary is $P=d_1/2+x$. The error can be evaluated by the absolute value of (P'−P).

Figure 15:
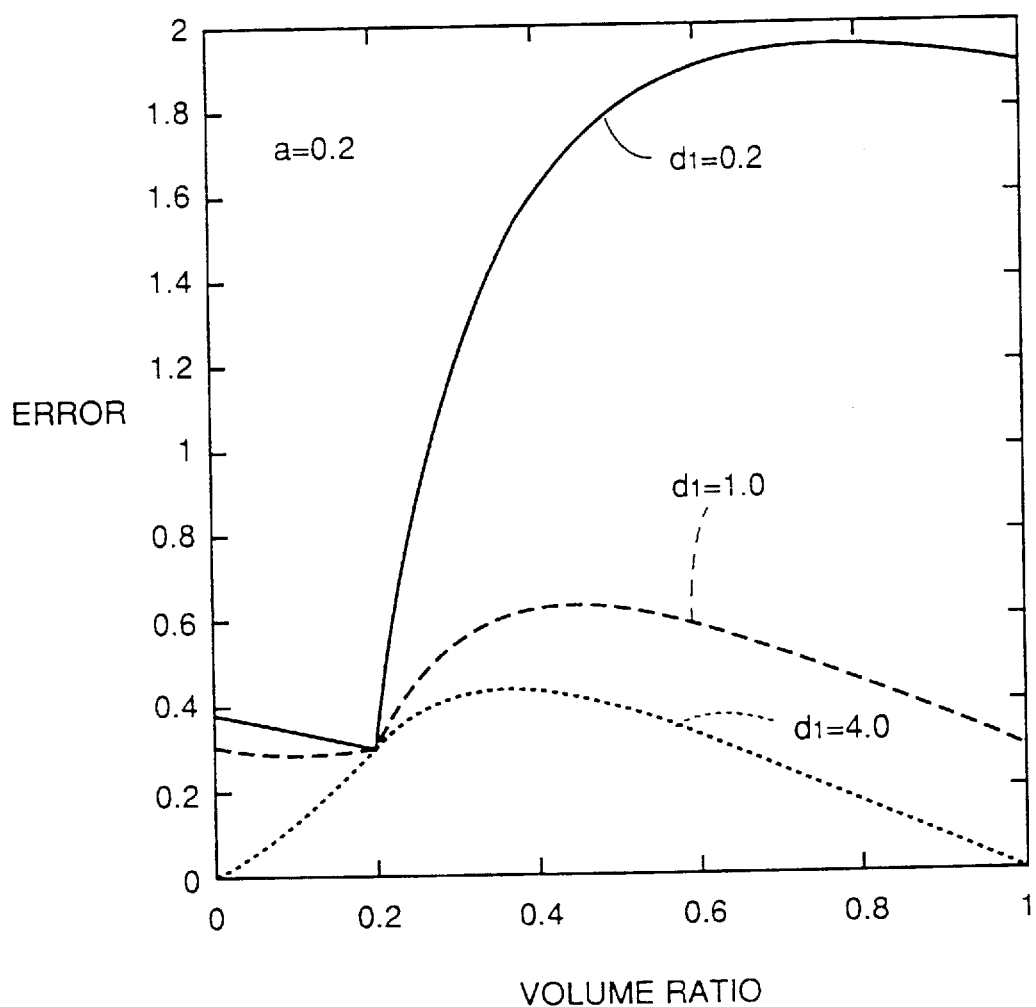
FIGS. 15, 16 and 17 are first to third graphs for help describing validity of the method of determining the boundary.
Figure 16:
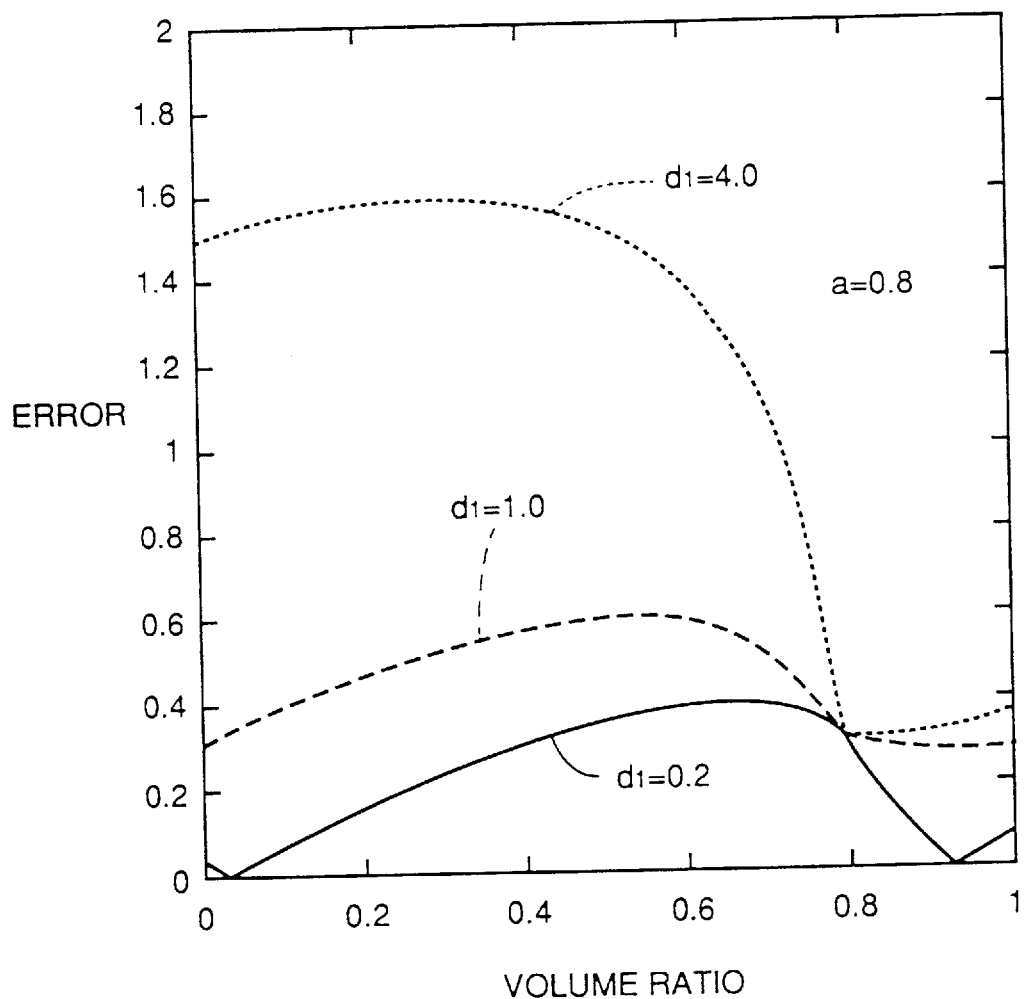
Figure 17:
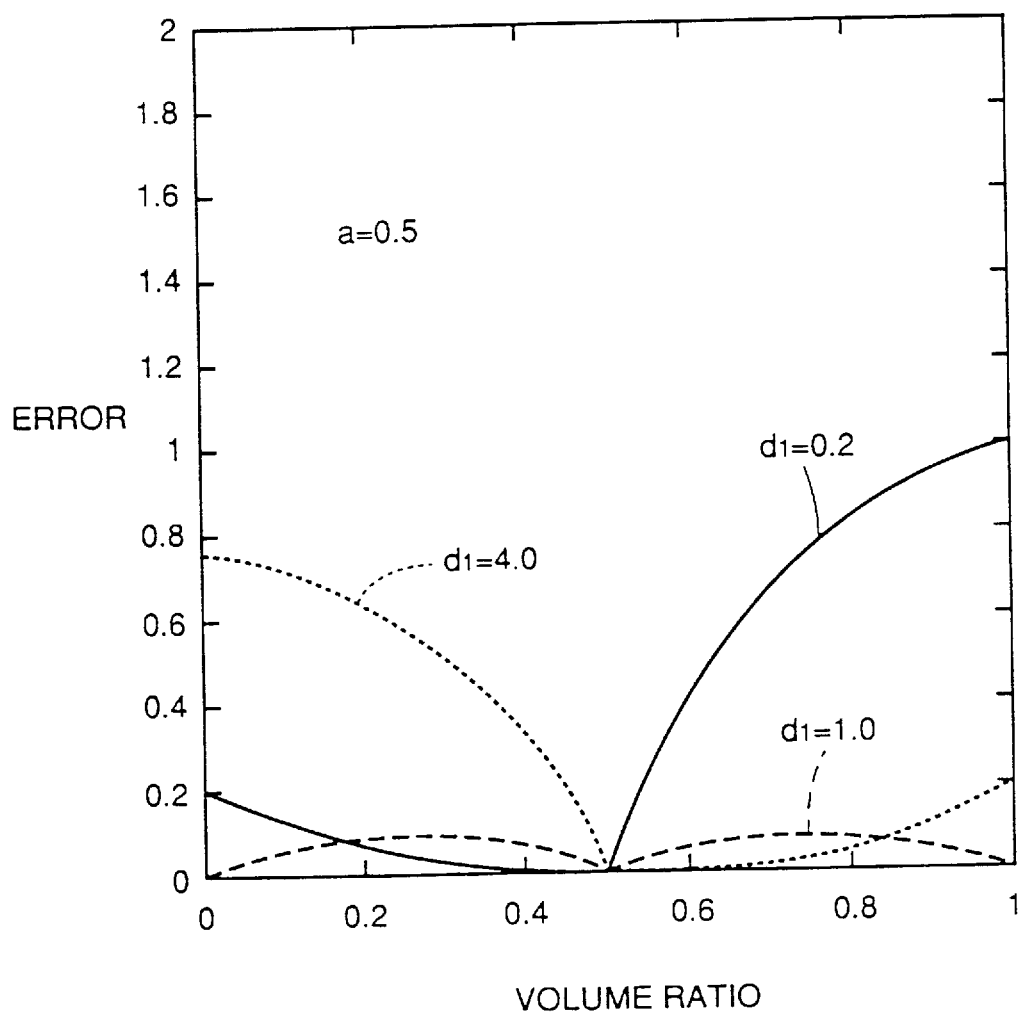

FIGS. 15 to 17 are graphs plotting the errors with respect to the volume ratio x. However, since $d_1=1/d_3$, cases where $d_1=0.2$, 1.0 and 4.0 respectively correspond to the case in which the rightmost cell as largest width, a case in which cells have the same width and a case in which the rightmost cell has the narrowest widths of FIG. 14.

It is preferable to regard the position having the volume ratio a of 0.2 as the substance boundary when $d_1=4.0$, which corresponds to the case in which the cell having larger volume ratio allotted to its center has wider width (FIG. 15). It is preferable to regard the position having the volume ratio a of 0.8 as the substance boundary when $d_1=0.2$, which corresponds to the case in which the cell having smaller volume ratio allotted to its center has wider width (FIG. 16). It is preferable to regard the position having the volume ratio a of 0.5 as the substance boundary when $d_1=1.0$, which corresponds to the case in which the cells have the same width (FIG. 17).

When the analysis area is divided, generally the widths of cells are not successively made wider (or narrower) in a direction along which cells are placed next to each other, and in most cases, the analysis area is divided into cells at approximately the same intervals. From this point of view, it is preferable to regard the position having the volume ratio of 0.5 as the substance boundary, when the analysis area is divided in the usual manner, also in view of errors.

Figure 18:
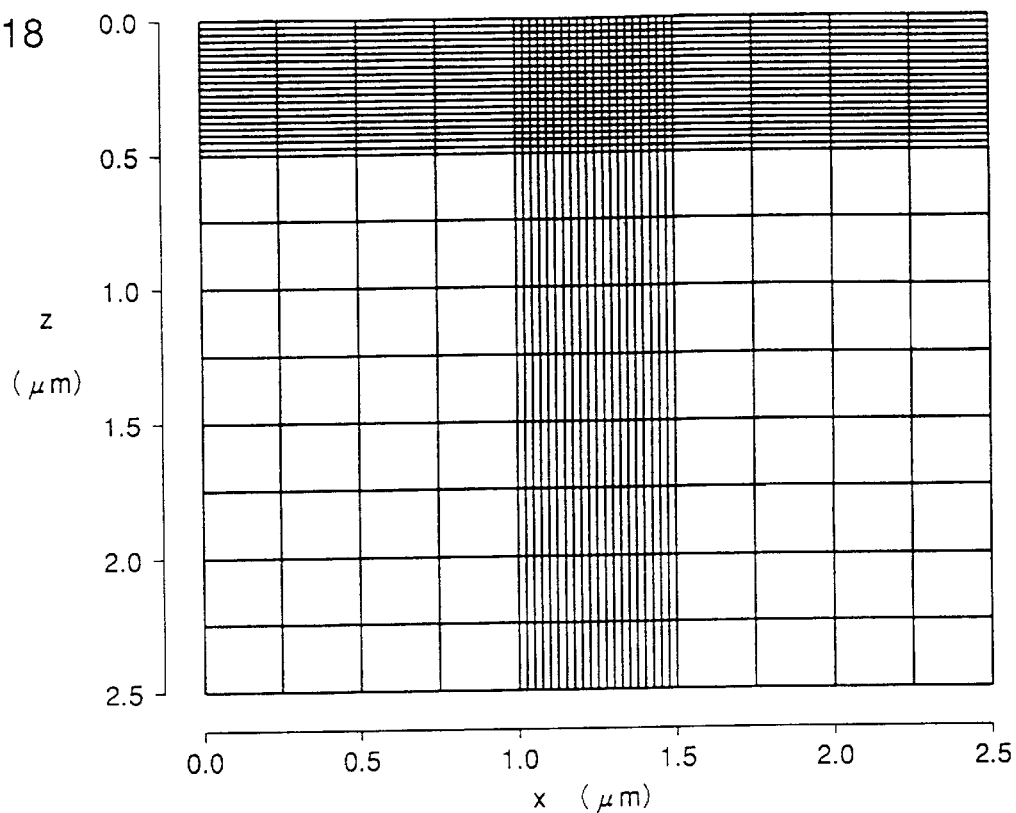
FIGS. 18 to 21 are first to fourth graphs showing effects of the present invention.

FIG. 18 shows division used in the conventional shape simulation. Where the coordinate of the ordinate is within the range of from 1.0 to 1.5 $\mu$m, equal division into 20 is performed in the lateral direction (that is, division with the width of 0.025 $\mu$m). In the range where the coordinate of the ordinate is from 0.0 to 0.5 mm, equal division of 20 is effected in the longitudinal direction (division with the width of 0.025 $\mu$m).

The cells having the volume ratio of "1" are positioned in a range where the coordinate of the ordinate is from 0.5 to 2.5 if the coordinate of the abscissa is in the range of 0.0 to 1.0; in the range where the coordinate of the ordinate is from 1.5 to 2.5 when the abscissa is within the range of from 1.0 to 1.5; and in the range where the coordinate of the ordinate is from 0.5 to 2.5 when the abscissa is within the range of from 1.5 to 2.5, in the initial state. Cells positioned outside these ranges have the volume ratio of "0" allotted thereto. More specifically, as compared with the cells having the volume ratio of "1", the cells having the volume ratio of "0" are smaller.

Figure 19:
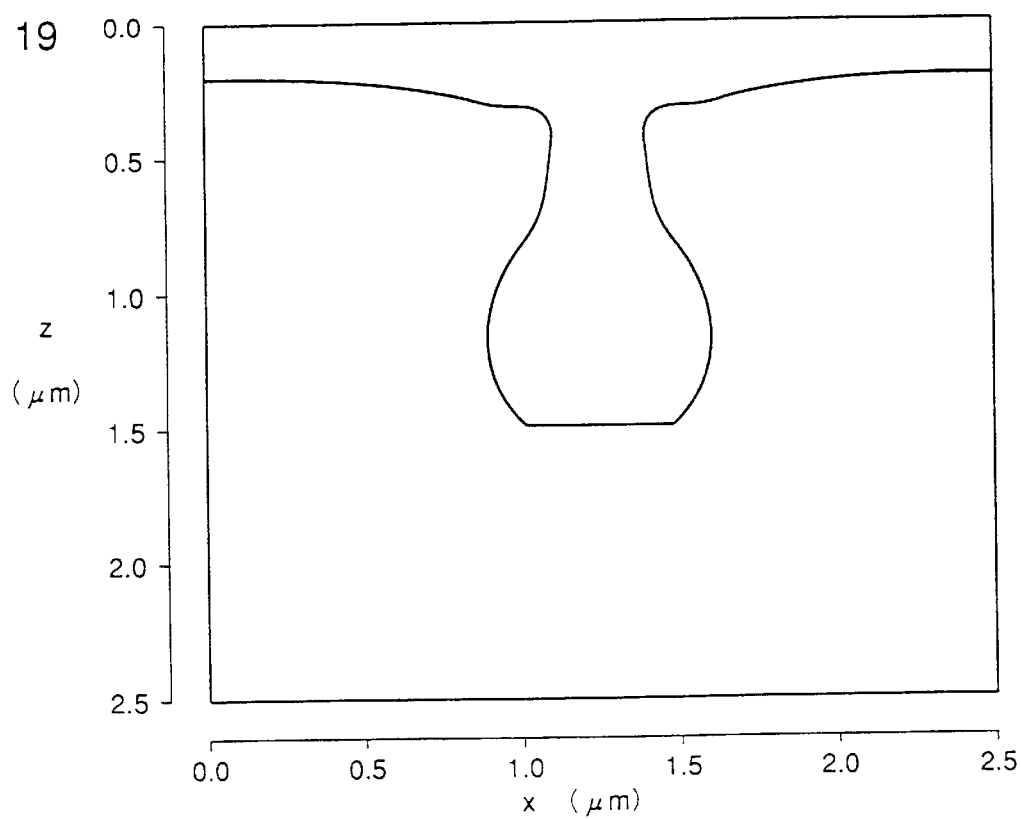
Figure 20:
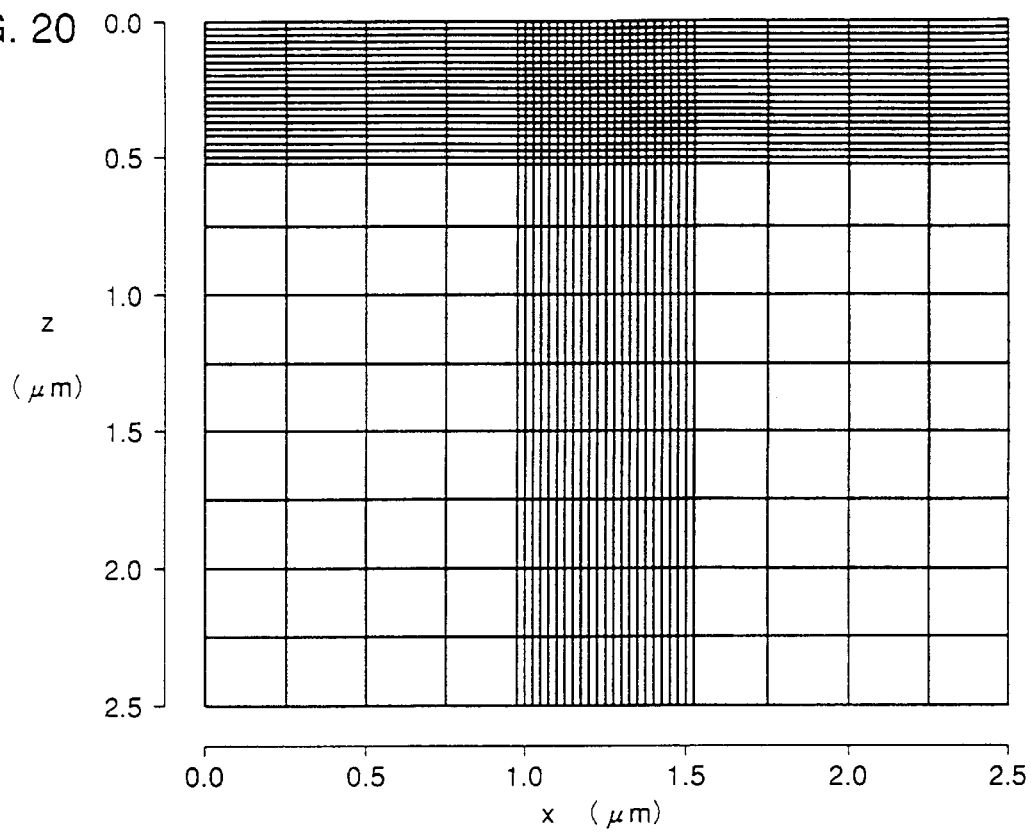

FIG. 19 shows result of deposition in accordance with the shape simulation of aluminum sputter deposition, using the division shown in FIG. 18. FIG. 19 is a simulation when aluminum is deposited to 0.25 $\mu$m on a flat surface. FIG. 20 shows division used in the shape simulation to which the present invention is applied. In the range where the ordinate of the abscissa is from 0.975 to 1.525 $\mu$m, equal division of 22 (that is, division with the width of 0.025 $\mu$m) is effected in the lateral direction. In the range where the coordinate of the ordinate is from 0.0 to 0.525 $\mu$m, equal division of 21 (that is, division with the width of 0.025 $\mu$m) is effected in the longitudinal direction.

In the example of FIG. 20 also, the cells having volume ratio of "1" at the initial state are in the range where the coordinate of the ordinate is from 0.5 to 2.5 when the coordinate of the abscissa is within the range of from 0.0 to 1.0; in the range where the coordinate of the ordinate is from 1.5 to 2.5 when the coordinate of the abscissa is within the range of from 1.0 to 1.5; and in a range where the coordinate of the ordinate is from 0.5 to 2.5 when the coordinate of the abscissa is within the range of from 1.5 to 2.5. Cells positioned outside these ranges have the volume ratio of "0" allotted thereto. As compared with the division shown in FIG. 18, in the example of FIG. 20, the outermost surface of the area having the volume ratio of "1" is divided into cells of the same size as the cells having the volume ratio of "0".

Figure 21:
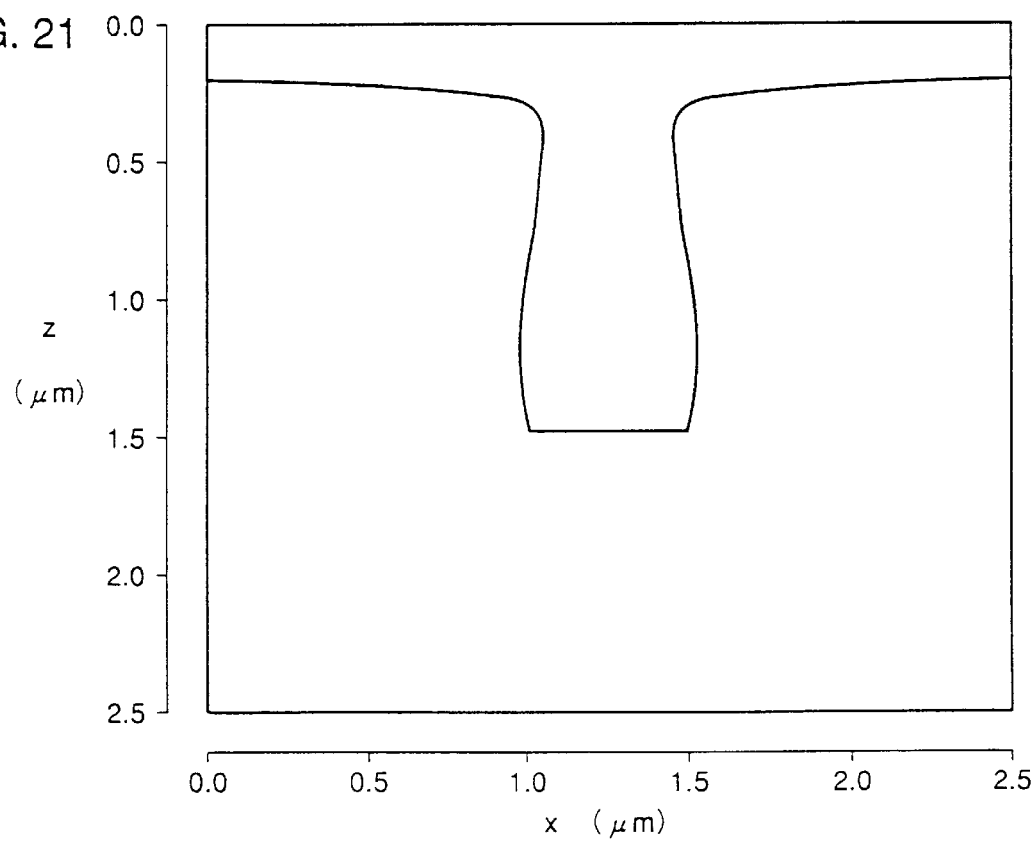

FIG. 21 shows result of deposition in accordance with the shape simulation of aluminum sputter deposition using the division shown in FIG. 20. FIG. 21 is also a simulation of deposition of aluminum to 0.25 $\mu$m on a flat surface, as FIG. 19.

In the conventional example shown in FIG. 19, the shape is as if etching has been effected. However, it can be seen from FIG. 21 that when the present invention is applied, there is no such disadvantage.

(6) Specific Method of Etching Calculation

The present invention can be applied to shape simulation not only of deposition but etching also.

However, in etching, the substance which existed at the initial state is successively removed. Therefore, the area having the volume ratio of "1" should be divided into smaller areas than the area having the volume ratio of "0". However, contrary to the shape simulation for deposition, when the area having the volume ratio "0" is divided, division is effected such that cells neighboring the area having the volume ratio "1" has the same width as the neighboring cell having the volume ratio "1" in the direction along which these cells are placed next to each other.

Figure 23:
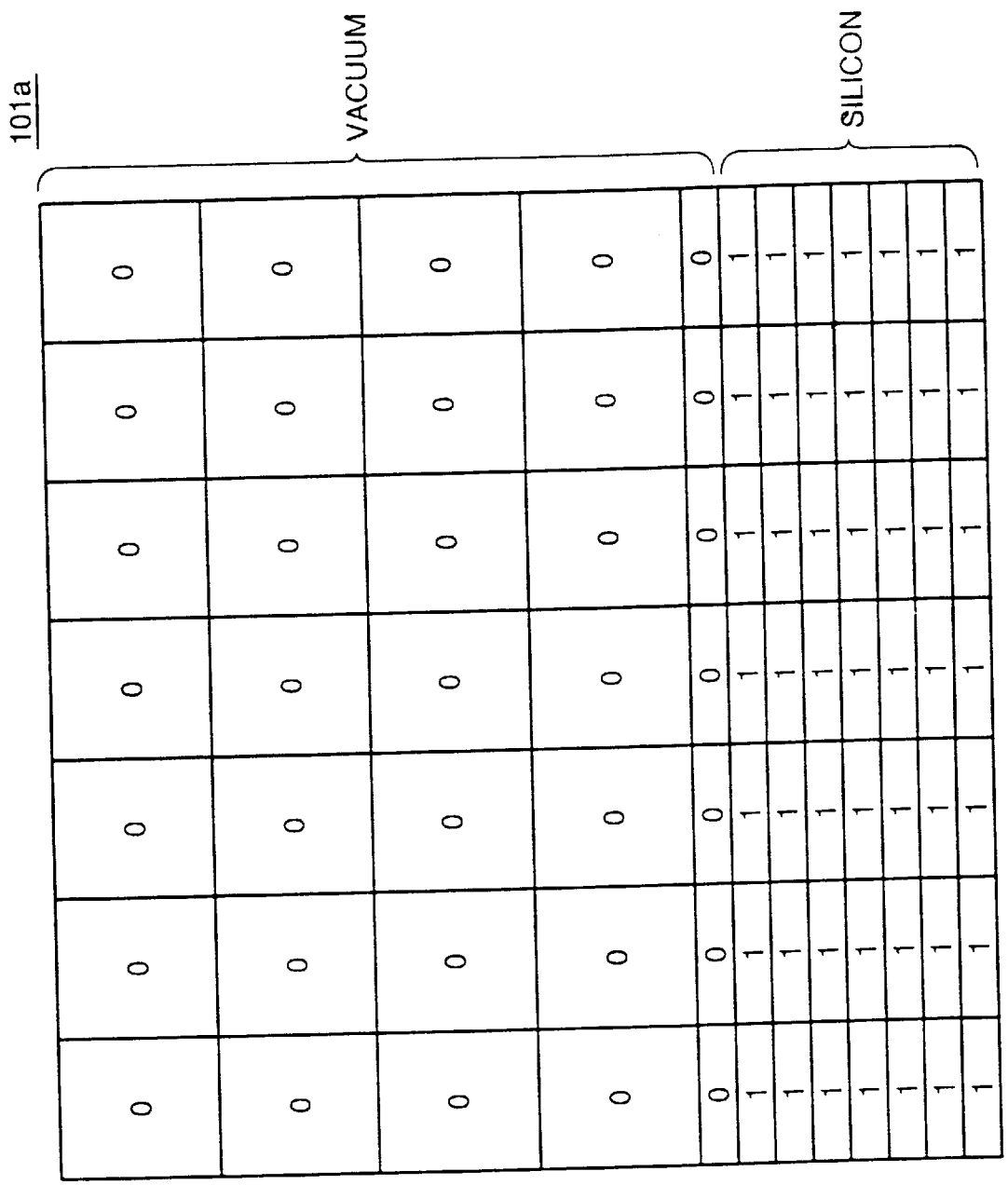
FIG. 23 is an illustration showing an analysis area used for shape simulation of etching.

FIG. 23 schematically shows an analysis area 101a used for shape simulation of etching. Here, silicon is described as an example of the substance corresponding to the volume ratio of "1", and the volume ratio of vacuum area is denoted by "0". Of the vacuum area, the portion adjacent to silicon is divided such that it has the same width as the divided silicon.

Figure 22:
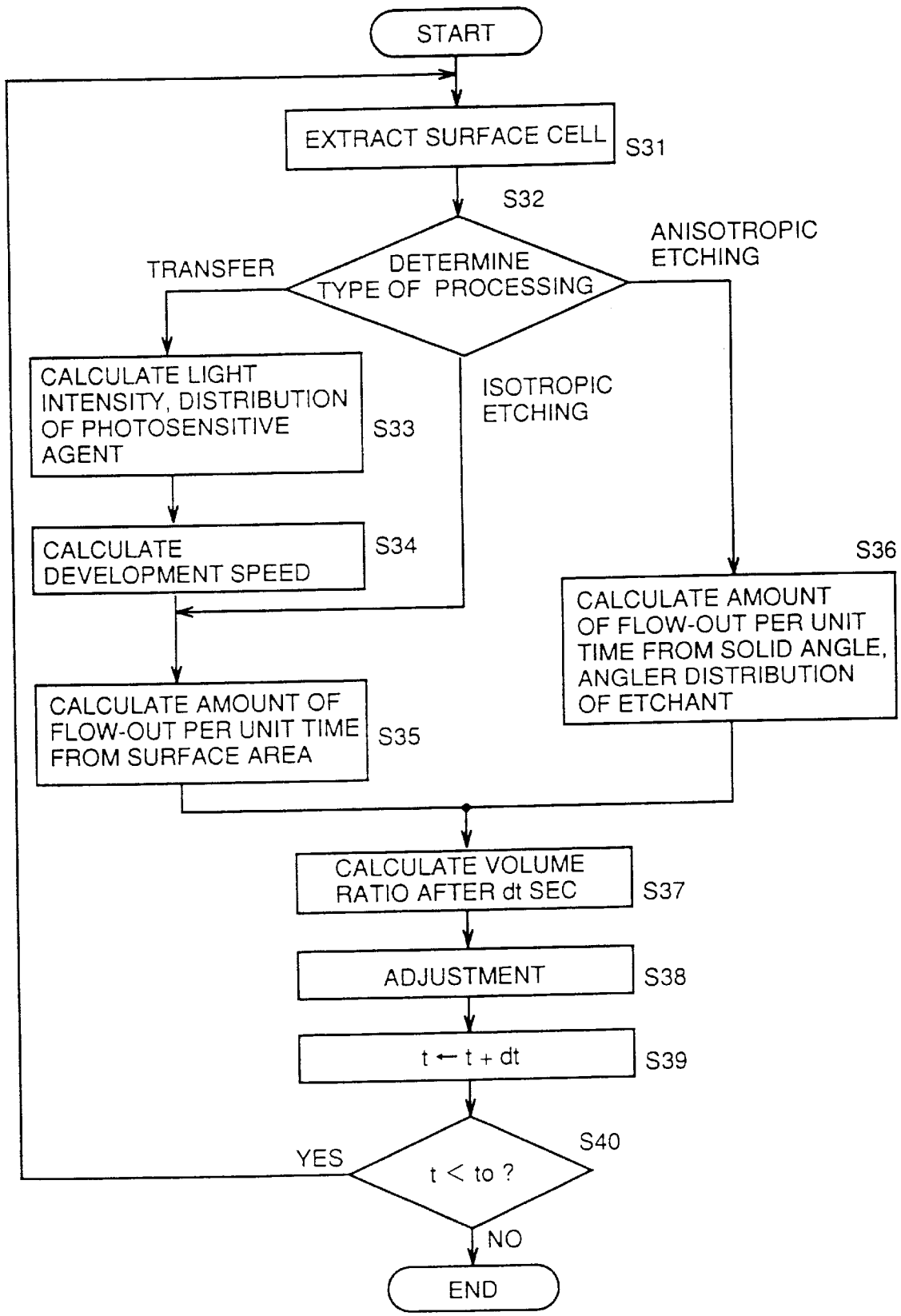
FIG. 22 is a flow chart showing etching calculation of FIG. 3.

Referring to FIG. 22, the method of etching calculation will be more specifically described. In step S31, a surface cell is extracted. If the volume ratio $C^t$ (i, j, k) of a cell (i, j, k) is $C^1$ (i, j, k) >0 and when there exists a volume ratio of 0 among the volume ratios $C^t$ (i±1, j, k), $C^t$ (i,j±1, k) and $C^t$ (i, j, k±1) of cells around that cell, then that cell is regarded as the surface cell.

In step S32, the type of processing is discriminated. If the processing is transferring, light intensity and distribution of photosensitive agent are calculated in step S33. After development speed is calculated in the next step S34, the flow rate per unit time of the substance flowing out from the surface area is calculated in step S35.

If an isotropic etching is performed, the flow directly proceeds from step S32 to step S35 where the flow rate is calculated. When an isotropic etching is performed, the flow proceeds to step S36 in which the flow rate per unit time is calculated based on the solid angle and angle distribution of the etchant.

A volume ratio $R_{ijk}$ at which a substance to be etched (for example, silicon) flows out from this cell per unit time through a face of the surface cell (i, j, k) is determined on the basis of the flow rate calculated in step S35 or S36.

Then, in step S37, the volume ratio $C^{t+dt}$ (i, j, k) of the cell (i, j, k) after a small time period dt is calculated in accordance with the following equation.

$$C^{t+dt}(i,j,k) = C^t(i,j,k) - R_{ijk} \cdot dt$$

Then in step S38, adjustment of the volume ratio of each cell is performed. If the volume ratio $C^{t+dt}$ (i, j, k) calculated in accordance with the above equation assumes a negative value, cells $\alpha$, $\beta$, $\gamma$, . . . having the volume ratio of a substance of 0.5 or more are detected from among the cells (i±1, j, k), (i, j±1, k) and (i, j, k±1) around that cell (i, j, k). The areas in which the cell (i, j, k) is in contact with these $\alpha$, $\beta$, $\gamma$, . . . are denoted as $S\alpha$, $S\beta$, $S\gamma$, . . . , and the following expression apply:

$$C^{t+dt}(i,j,k) \leftarrow 0$$

$$C^{t+dt}(\alpha) \leftarrow C^{t+dt}(\alpha) - \eta \cdot S\alpha / (S\alpha + S\beta + S\gamma + \ldots)$$

$$C^{t+dt}(\beta) \leftarrow C^{t+dt}(\beta) - \eta \cdot S\beta / (S\alpha + S\beta + S\gamma + \ldots)$$

$$C^{t+dt}(\gamma) \leftarrow C^{t+dt}(\gamma) - \eta \cdot S\gamma / (S\alpha + S\beta + S\gamma + \ldots)$$

where $$\eta = -C^{t+dt}(i,j,k) > 0.$$

The volume ratios are re-allotted in accordance with the above expressions. However, if the volume ratios of cells $\alpha$, $\beta$, $\gamma$, . . . attain negative by this re-allocation, the volume ratio of that cell is taken to be 0.

A series of steps S31 to S38 described above is repeated at every small period of time dt until it is determined that the etching time to has elapsed in steps S39 and S40.

3. Other Applications

Though the analysis area is divided into rectangular or cubic cells in the above description, the shape of the cell is not limited thereto.

Figure 24:
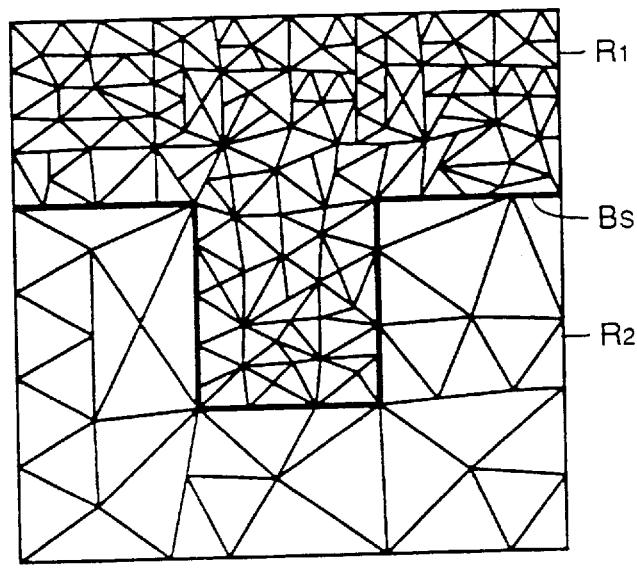
FIGS. 24 and 25 are first and second conceptual figures showing other applications of the present invention.
Figure 25:
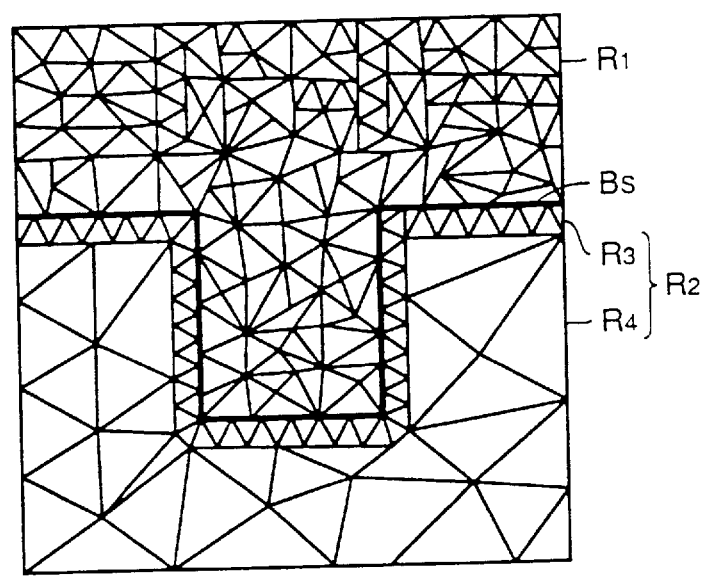

For example, as shown in FIG. 24, two areas $R_1$ and $R_2$ separated by a boundary $B_S$ of the substance in the analysis area may be divided into triangular cells for shape simulation. Even when the cells are triangular, the present invention can be applied similarly. FIG. 25 is an illustration of an analysis area describing an application of the present invention. Areas $R_1$ and $R_2$ have volume ratios "0" and "1" respectively at the initial state, which areas are in contact with each other at the boundary $B_S$. Here, shape simulation for deposition is considered, so that the cells dividing the area $R_1$ is made smaller than those dividing the area $R_2$. However, those of the cells dividing area $R_2$ which are in contact with area $R_1$ are made as small as the cells dividing the area $R_1$. This improves precision in calculation of the equal volume ratio face, enabling more accurate calculation of shape in the simulation.

Figure 26:
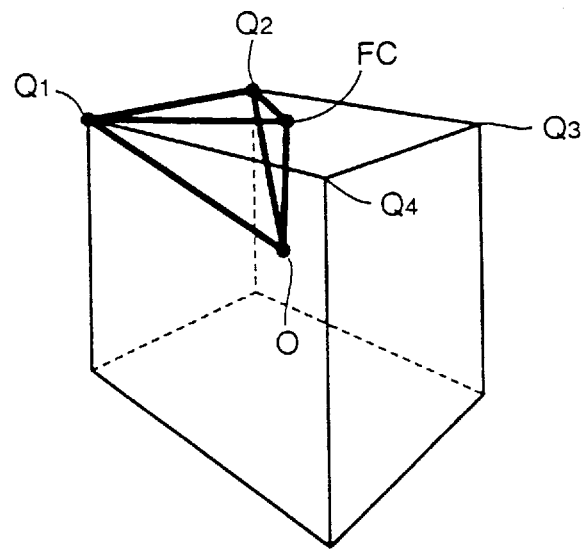
FIGS. 26 and 27 are first and second perspective views showing other applications of the present invention.
Figure 27:
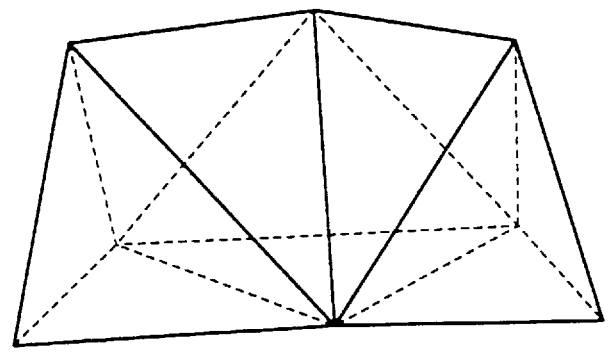

Alternatively, the analysis area may be divided into tetrahedron cells. FIG. 26 is a perspective view showing tetrahedron configuration dividing one cubic cell into 24. A tetrahedron constituted by a volume center O of the cube, one face center FC and adjacent two of vertexes $Q_1$ to $Q_4$ constituting a face on which the face center FC exists divides one cubit cell into 24. The division is not limited to such equal division. FIG. 27 is an illustration showing four tetrahedrons of an arbitrary shape placed next to each other. In this manner, the analysis area may be divided by a plurality of tetrahedrons, and the present invention can be also applied to the analysis area divided in this manner.

4. Another Specific Method of Calculating the Solid Angle

In the section "(3) Specific Method of Calculating a Solid Angle" described above, it is necessary to determine whether or not substance particles are coming to every solid angle of all the cells, that is, the number of product of the number of division of the solid angle (N$\theta$·N$\phi$), which requires long calculation time. If the number of division of the solid angle or the number of division of the cells is reduced so as to shorten the calculation time, precision in calculation decreases, preventing accurate shape simulation.

In the following, a method for calculating the solid angle which further reduces the calculation time will be described.

Figure 34:
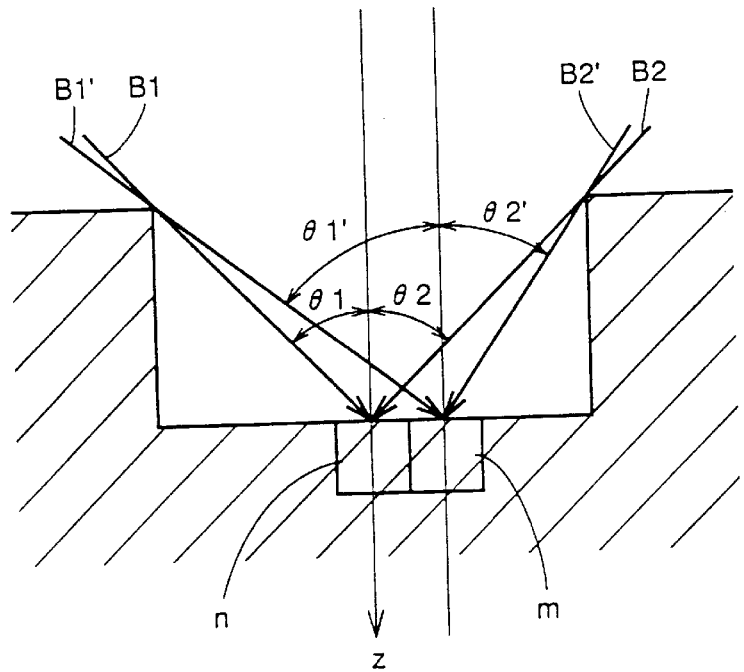
FIGS. 34 and 35 are first and second illustrations showing outline of other methods of calculating the solid angle.
Figure 35:
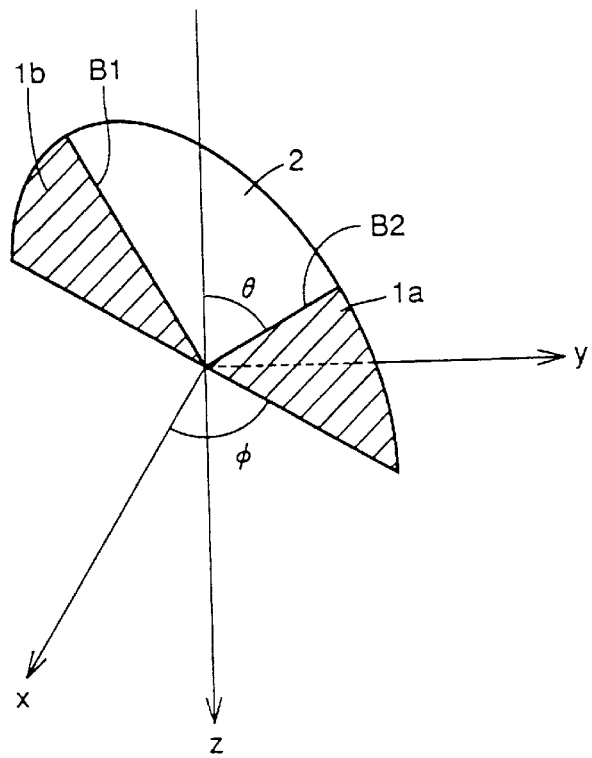

FIGS. 34 and 35 are first and second illustrations showing a method of calculating the solid angle which can further reduce the calculation time.

FIG. 34 shows a cross section of a depressed portion in a step of manufacturing a semiconductor device. Referring to FIG. 34, there are walls formed on both sides of one analysis element n in the analysis area. In this case, the range of the substance particles flowing in or flowing out during the step of deposition or etching is limited to the angular range of $\theta_1 + \theta_2$. Therefore, by specifying boundaries B1 and B2 between the area to which or from which substance particles flow in or flow out (hereinafter referred to as flow in/out area) and an area to or from which substance particles do not flow in or flow out (hereinafter referred to as non-flow in/out area) and effecting analysis only in the flow in/out area, the time necessary for the analysis can be reduced.

Let us consider the boundary of an analysis element m placed near an analysis element n. Since analysis element m is placed near the analysis element n, the boundary B1' of analysis element m is approximately the same as the boundary B1 of analysis element n, and boundary B2' is approximately the same as boundary B2. More specifically, one solid angle $\theta_1'$ with respect to the z axis is approximately the same as $\theta_1$, and $\theta_2'$ is approximately the same as $\theta_2$. Therefore, when boundaries B1 and B2 of analysis element n have already been specified, the boundaries B1' and B2' can be specified only by examining vicinities of the boundaries B1 and B2 when the boundaries of analysis element m are to be specified. As a result, the scope of scanning for determining the boundary can be made very narrow, and hence the boundary between the flow in/out area and the non-flow in/out area can be specified in a short period of time with small amount of calculation.

FIG. 35 is a three dimensional representation of FIG. 34. In FIG. 35, non-flow in/out areas 1a and 1b other than the flow in/out area 2 are hatched. The boundary B2 between non-flow in/out area 1a and flow in/out area 2 is specified by the angles ($\phi$ and $\theta$. Therefore, if the boundary B2 has already been specified, the next boundary can be specified by changing the angle $\theta$. In the following description, the process for specifying the boundary between the flow in/out area and the non-flow in/out area mentioned above is referred to as surface shadowing calculation, and the result of calculation as to whether the direction specified by angles $\theta$ and $\phi$ is included in the flow in/out area or in the non-flow in/out area is represented by the shadowing calculation result SL (I, J), where $1 \leq I \leq N\theta$, $1 \leq J \leq N\phi$, N$\theta$ represents the number of division in the direction of $\theta$, and N$\phi$ represents the number of division in the direction of φ. The shadowing calculation result SL (I, J) assumes 1 when it is in the flow in/out area, and it is assumed 0 when it is in the non-flow in/out area.

Figure 36:
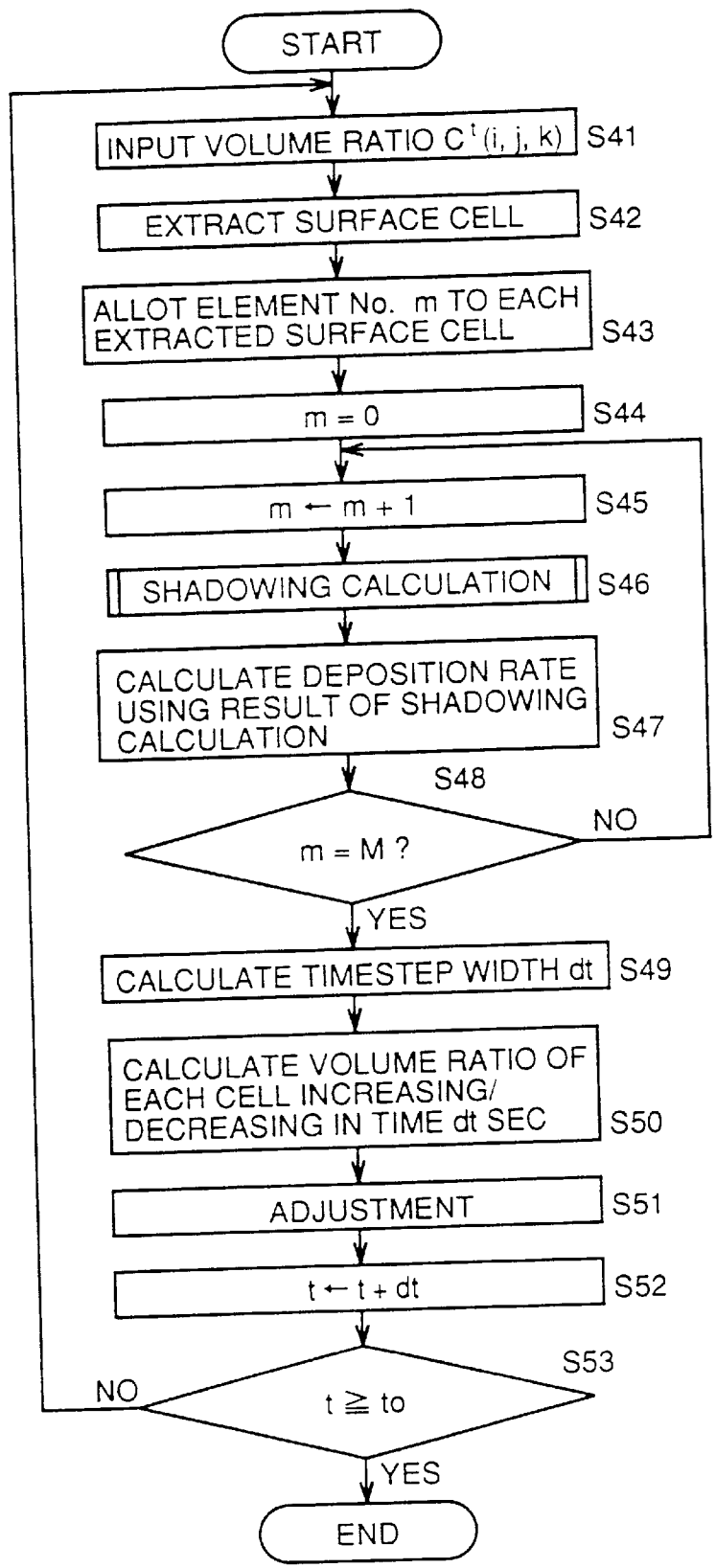
FIG. 36 is a flow chart showing deposition calculation using another method of calculating the solid angle.

The deposition calculation using the above described method of obtaining the solid angle will be described with reference to FIG. 36.

First, in step S41, a volume ratio $C^t$ (i, j, k) which has been already calculated, is input.

In step S42, a cell which serves as the surface cell is extracted based on the value of the input volume ratio $C^t$ (i, j, k).

In step S43, element number m is allotted to the extracted surface cell. The element number m is applied successively, starting from 1.

Next, in step S44, the element number m is set to 0 as the initial value.

Then, in step S45, the element number m is replaced by the element number m+1. Therefore, in this example, the element number m assumes 1.

Next, in step S46, the shadowing calculation is performed, which will be described later. In this shadowing calculation, prescribed processing takes place in accordance with the element number m.

In step S47, the deposition speed is calculated based on the result of shadowing calculation S (i, j) calculated in step S46.

The calculation of the deposition speed R (m) using the result of shadowing calculation SL (i, j) will be described with reference to FIG. 6.

Referring to FIG. 6, the deposition speed R (m) is represented by the following equation in which the direction of substance particles flowing into the cell m is represented as a vector V, r represents the length of vector V, A represents the length of one side along the θ direction of a small area in the direction of vector V, and B represents the length of one side in the φ direction:

$$R(m) = \sum_{i,j} S(m) \cdot V \cdot f(I,J) \cdot SL(I,J) \frac{r \cdot d\theta \cdot r \cdot \sin\theta \cdot d\phi}{\frac{4\pi r^2}{2}} N$$

$$= \frac{N}{2\pi} \sum_{i,j} S(m) \cdot V \cdot f(I,J) \cdot SL(I,J) \cdot \sin\theta \cdot d\theta \cdot d\phi$$

where

S = s·n (s: area of face element
n: unit normal vector of face element
V = (sinθcosφ, sinθsinφ, −cosθ)
A = r·dθ
B = r·sinθ·dφ
f(I, J): amount of particles flowing in from the direction of solid angle (I, J), (angular distribution)
N: normalization coefficient In step S48, it is determined whether the element number m of the surface cell which is being analyzed at present is equal to the maximum element number M to be analyzed. If m is not equal to M, the flow proceeds to step S45 so as to analyze the next surface cell, and if m equals to m, the flow proceeds to step S49.

In step S49, time step width dt of analysis time is calculated. Here, based on the deposition speed calculated in step S47 above, time step width dt is made smaller if the deposition speed is fast, and time step width dt is enlarged when deposition speed is slow.

Next, in step S50, the volume ratio $C^{1+dt}$ (i, j, k) of each cell which increases/decreases in the time step width determined in step S49 is calculated in accordance with the following equation.

$$C^{t+dt}(i,j,k) = C^t(i,j,k) + R_{ijk} \cdot dt$$

Where $R_{ijk}$ represents the volume ratio flowing in a unit time which is a sum of deposition speeds R (m) calculated for respective faces of the cell.

In step S51, adjustment of the volume ratio of each cell calculated in step S50 is performed. This processing is similar to the step S16 of FIG. 5, for example, and therefore detailed description is not repeated.

In step S52, the time t is updated by a small time period dt.

Next, in step S53, whether or not time t has reached deposition time $t_0$ is determined. If time t has not yet reached deposition time $t_0$, the flow proceeds to step S41 and the following processings are continued. If time t has exceeded deposition time $t_0$, the process is completed.

Figure 37:
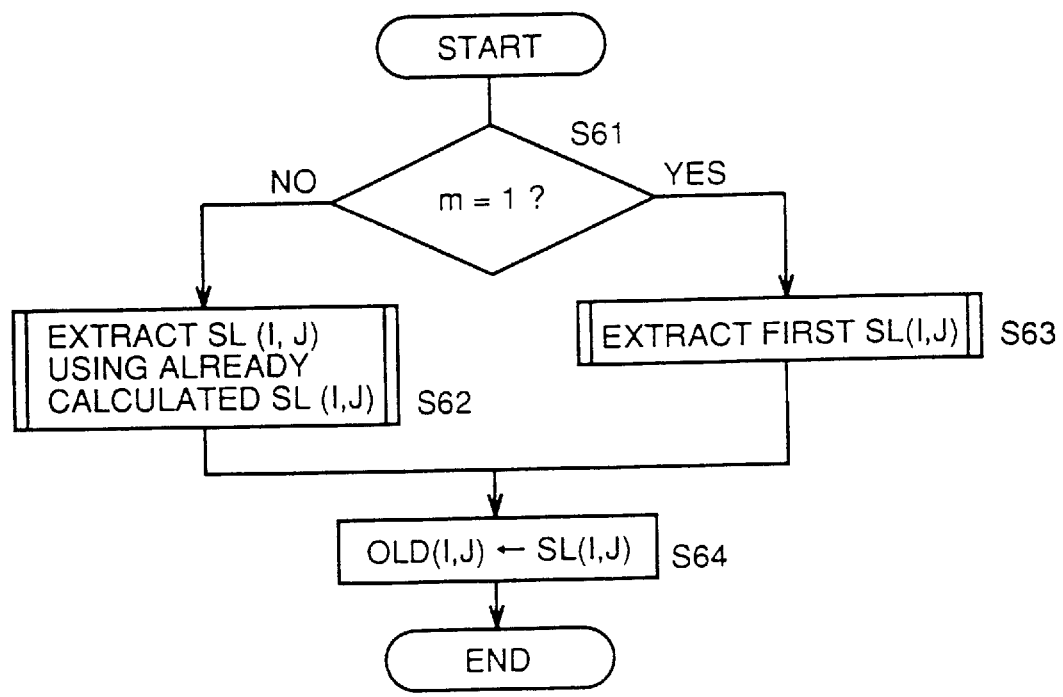
FIG. 37 is a flow chart showing the shadowing calculation shown in FIG. 36.

The shadowing calculation shown in FIG. 36 will be described with reference to FIG. 37.

First, in step S61, whether or not the element number m of the surface cell which is currently analyzed is 1 or not is determined. If the element number m is 1, the flow proceeds to step S63. Otherwise, the flow proceeds to step S62.

If the element number m is 1, the surface cell is the first surface cell, and therefore there is not a shadowing calculation result SL (I, J) which has been already calculated. Therefore, here, the first shadowing calculation is effected to obtain the result SL (I, J), which operation will be described later.

If the element number m is not 1, there is already a shadowing calculation result SL (I, J) which has been calculated. Therefore, the result SL (I, J) of shadowing calculation of that surface cell which is currently being analyzed is calculated utilizing the already existing shadowing calculation result SL (I, J) in a manner which will be described later.

When step S62 or S63 is terminated, in step S64, the surface shadowing calculation result SL (I, J) calculated in each step is stored in OLD (I, J) and process is terminated.

Figure 38:
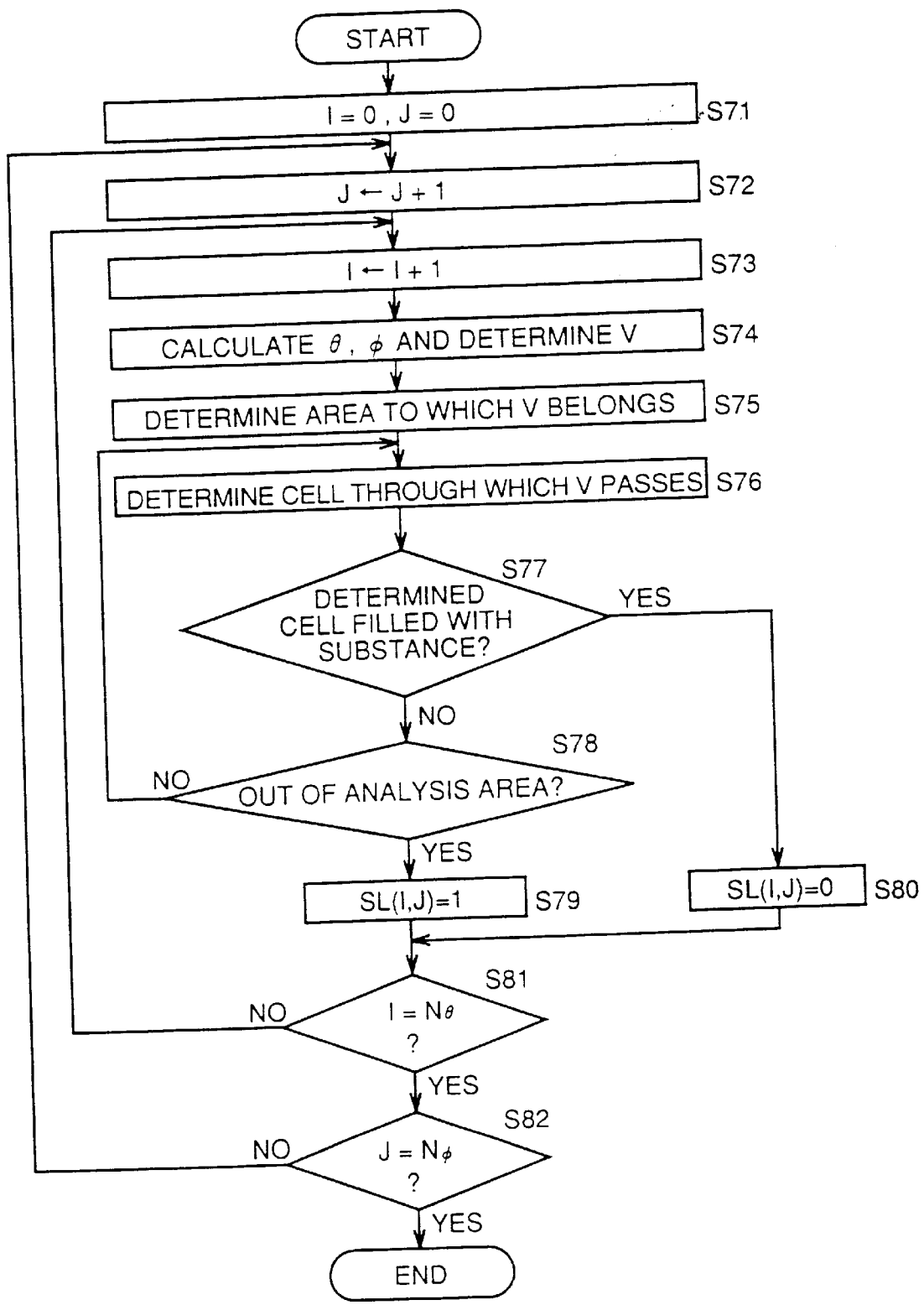
FIG. 38 is a flow chart showing the process for extracting first shadowing calculation result shown in FIG. 37.

First, the process for calculating the first result of shadowing calculation SL (I, J) shown in FIG. 37 will be described with reference to FIG. 38.

When the number of division in the θ direction is represented as Nθ and the number of division in the direction of φ is represented as Nθ, in this process, it holds:

$$\theta = \pi(1-\frac{1}{2})/2N\theta$$

$$\phi = 2\pi(J-\frac{1}{2})/N\phi$$

where $$1 \leq I \leq N\theta$$

$$1 \leq I \leq N\phi.$$

In the following operation, the direction of flowing in of the substance particles are specified by the variables I and J, instead of angles θ and φ.

First, in step S71, the values of variables I and J are set to 0 as initial values.

Then, in steps S72 and S73, variables J and I are incremented.

Next, in step S74, angles φ and θ corresponding to variables J and I are calculated, and the vector V representing the direction of flowing in of the substance particles is determined in accordance with the following equation:

$V=(\sin\theta\cos\phi, \sin\theta\sin\phi, -\cos\theta)-(V_x, V_y, V_z)$.

Next, in step S75, it is determined in which area the cell through which vector V passes exists. The area here means the areas R1 to R4 obtained by dividing the xy plane into four.

Next, in step S76, a cell through which vector V passes is determined. This can be done through the same process as described with reference to FIGS. 8 to 10.

Next, in step S77, whether the cell through which the vector V passes is a substance cell or not is determined. The substance cell means a cell filled with the substance. If the cell through which the vector passes is a substance cell, the flow proceeds to step S80, and otherwise, the flow proceeds to step S88.

If the cell is a substance cell, the directions specified by variables I and J belong to the non-flow in/out area to which substance particles do not flow in, and therefore in step S80, the value SL (I, J) is set to 0 as the shadowing calculation result of this direction.

Meanwhile, if the cell through which vector V passes is not a substance cell, whether or not the vector V reaches outside the analysis area without passing through the substance cell is determined in step S78. If the vector does not reach outside the analysis area, the flow proceeds to step S76, and steps following step S76 are continued with respect to the next cell through which vector V passes. If the vector reaches outside the analysis area, the flow proceeds to step S79.

If the vector reaches outside the analysis area, there is not a substance cell in the direction specified by the variables I and J, and therefore substance particles can flow therein. Therefore, the direction specified by the variables I and J belongs to the flow in area to which substance particles can flow in. Therefore, in step S79, the shadowing calculation result SL (I, J) of this direction is set to 1.

By setting the shadowing calculation result SL (I, J) to 0 for the non-flow in area and setting the shadowing calculation result (I, J) to 1 for the flow in area, as described above, according to the equation for obtaining deposition speed R (m), the result of calculation would be 0 for the non-flow in area, and therefore the deposition speed R (m) can be calculated directly by using the shadowing calculation result SL (I, J).

Then, in step S81 it is determined whether the variable I is equal to $N\theta$. If the variable I is equal to $N\theta$, it means that the shadowing calculation has been completed for all the directions along the $\theta$ direction, and therefore the flow proceeds to step S82. Otherwise, the flow proceeds to S73 to continue shadowing calculation for other directions with respect to $\theta$ direction.

When variable I equals $N\theta$, in step S82, whether variable J equals $N\theta$ is determined. If the variable J equals $N\phi$, it means that the shadowing calculation has been completed for all the directions along the $\phi$ direction, and therefore the process is terminated. Otherwise, the flow proceeds to step S72 to continue shadowing calculation for other directions with respect to the $\phi$ direction.

Calculation is performed in the range of $0 \leq \theta \leq \pi/2$ and $0 \leq \phi \leq 2\pi$ in the above example, calculation may be effected in the range of $0 \leq \theta \leq \pi$ and $0 \leq \phi \leq \pi$.

Figure 39:
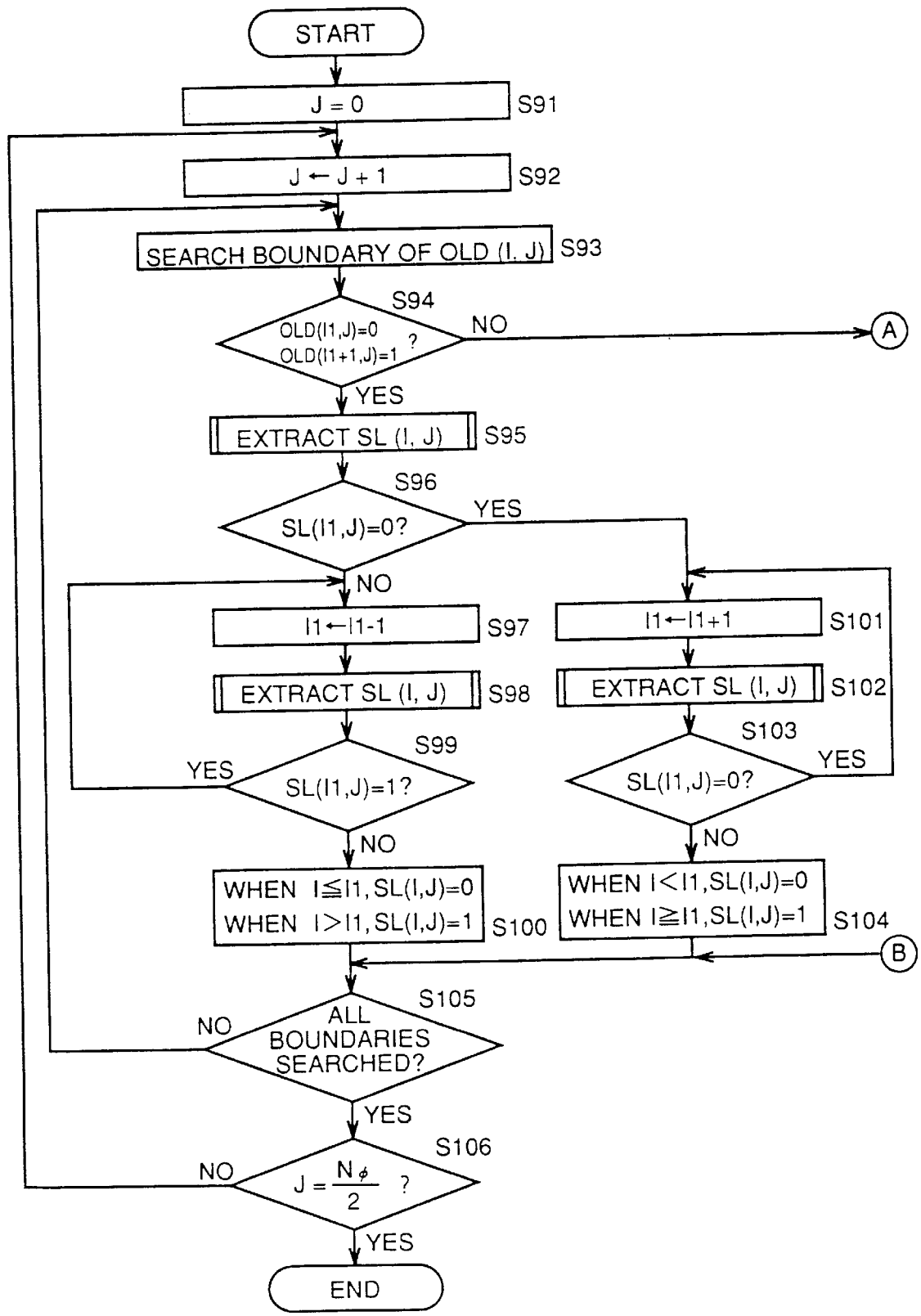
FIGS. 39 and 40 are first and second flow charts, respectively, showing the process for extracting the shadowing calculation result employing already calculated result of shadowing calculation shown in FIG. 37.
Figure 40:
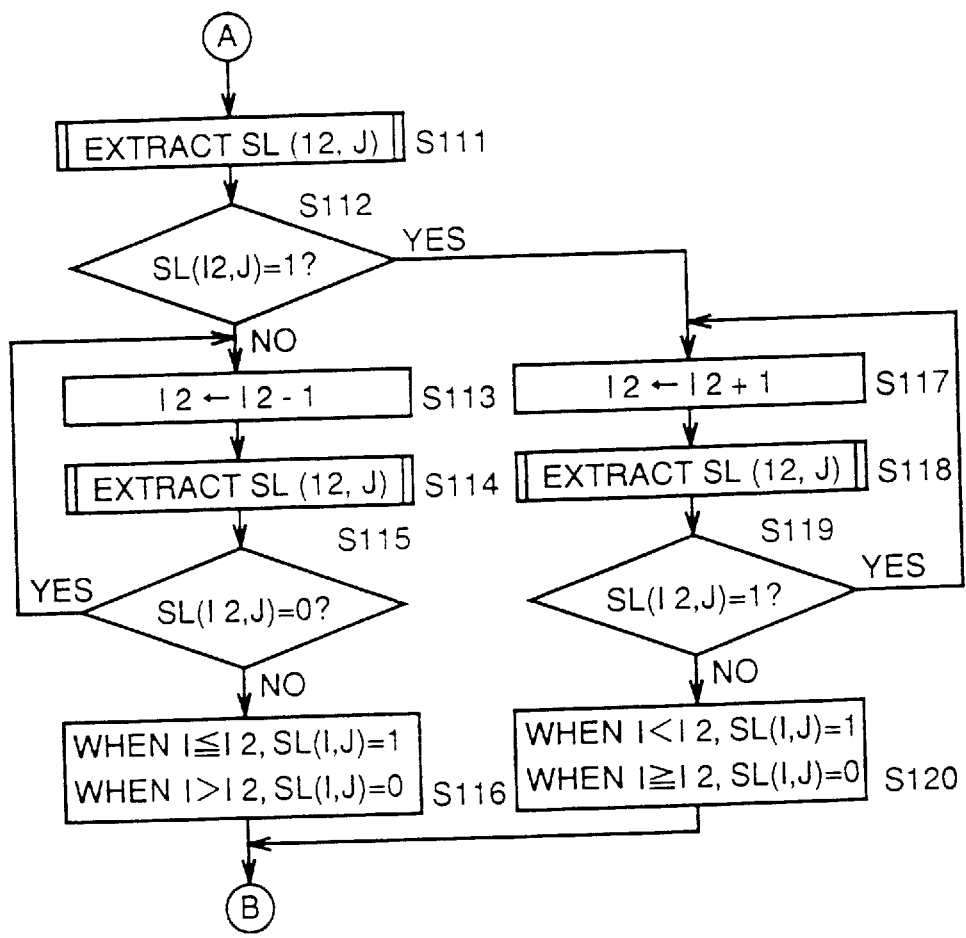

The process for extracting SL (I, J) utilizing the shadowing calculation result SL (I, J) which has been already calculated shown in FIG. 37 will be described with reference to FIGS. 39 and 40.

In this processing, the range of $\theta$ is set to $0 \leq \theta \leq \pi$, and the range of $\phi$ is set to $0 \leq \phi \leq \pi$. The number of divisions in these ranges are set to be $2N\theta$ and $N\phi/2$, respectively. Therefore, the variables I and J are $1 \leq I \leq 2N\theta$ and $1 \leq J \leq N\phi/2$, respectively. The ranges are set in this manner in order to specify two boundaries, if there are two as shown in FIG. 34, by one processing.

First, in step S91, the variable J is set to 0.

Next, in step S92, the variable J is incremented.

Next, in step S93, the boundary between the flow in area and the non-flow in area is searched based on the shadowing calculation result OLD (I, J) of the analysis element proceeding by one, which has been already calculated. Here, the boundary is searched with the variable J fixed and the variable I being incremented successively starting from 1.

Next, in step S94, whether the first boundary specified in step S93, for example the boundary B2 shown in FIG. 34 satisfies the relation that OLD (I1, J)=0 and OLD (I1+1, J)=1 is determined. The boundary satisfying this condition is the boundary at which the area changes from non-flow in area to flow in area. If the above condition is satisfied, the flow proceeds to step S95, and if not, the flow proceeds to step S111 shown in FIG. 40.

Then, the shadowing calculation result SL (I1, J) of the cell (having the element number m) which is currently being analyzed is calculated. The calculation of the shadowing result SL (I1, J) is carried out in the similar manner as the steps S74 to S80 shown in FIG. 8. Extraction of shadowing calculation results SL (I1, J) and SL (I2, J) are the same.

Next, in step S96, whether the calculated surface shadowing calculation result SL (I1, J) is 0 or not is determined. If it is not 0, the flow proceeds to step S97, and if it is 0, the flow proceeds to step S101. If the shadowing calculation result SL (I1, J) calculated in step S95 is 1, it means that the present boundary is the boundary at which the area changes from the non-flow in area to the flow in area as the variable I1 increases. Therefore, there must be a boundary of the cell which is currently being analyzed in the direction of decreasing the variable I1. Therefore, in step S97, the variable I1 is decremented.

Next, in step S98, the shadowing calculation result SL(I1, J) is extracted by using the discriminated variable I1.

Next, in step S99, whether or not the shadowing calculation result SL (I1, J) obtained in S98 is 1 is determined. If it is 1, it means that the boundary has not yet been found. Therefore, the flow proceeds to step S97 to continue following processes. If it is not 1, that is, when it is 0, it means that the boundary is found, and the flow proceeds to step S100.

In step S100, when I≤I1, SL (I, J) is set to 0 and when I>I1, SL (I, J) is set to 1, as the shadowing calculation result.

Meanwhile, in step S96, if it is determined that the shadowing calculation result SL (I1, J) calculated in step S95 is 0, it means that the boundary of the cell which is currently being analyzed exists in a direction increasing the variable I1. Therefore, in step S101, the variable I1 is incremented.

Then, in step S102, the shadowing calculation result SL (I1, J) is calculated based on the incremented variable I1.

Next, in step S103, whether the shadowing calculation result SL (I1, J) obtained in step S102 is 0 or not is determined. If it is 0, it means that the boundary has not yet been found. Therefore, the flow proceeds to step S101 to continue the following processes. If it is not 0, that is, when it is 1, the flow proceeds to step S104.

Then, in step S104, when I<I1, SL (I, J) is set to 0, and when I≥I1, SL (I, J) is set to 1.

In step S94, if the condition that OLD (I1, J)=0 and OLD (I1+1, J)=1 is not satisfied by the boundary searched in step S93, then in step S111, the shadowing calculation result SL (I2, J) is calculated. Here, I2 is the last value of I with OLD (I, J) being 1, when OLD (I, J) changes from 1 to 0. Therefore, between the direction specified by I2 and J and the direction specified by I2+1 and J, there is the boundary at which the area changes from the flow in area to the non-flow in area.

In step S112, whether the shadowing calculation result SL (I2, J) calculated in step S71 is 1 or not is determined. If it is not 1, the flow proceeds to step S113, and if it is 1, it proceeds to step S117.

If SL (I2, J) is not 1, that is, when SL (I2, J) is 0, it means that there is a boundary in the direction decreasing I2, and therefore in step S113, I2 is decremented.

Then, in step S114, the shadowing calculation result SL (I2, J) is calculated using the decremented variable I2.

Next, in step S115, whether the shadowing calculation result SL (I2, J) obtained in step S114 is 0 or not is determined. If the shadowing calculation result SL (I2, J) is 0, it means that the boundary has not yet been found. Therefore, the flow proceeds to step S113 to continue the following processing, and if it is not 0, i.e., if it is 1, it means that the boundary has been found, and the flow proceeds to S116.

Next, in step S116, when I≦I2, SL (I, J) is set to 1, and when I>I2, SL (I, J) is set to 0.

Meanwhile, in step S112, if it is determined that the shadowing calculation result SL (I2, J) obtained in step S111 is 1, it means that the boundary exists in the direction increasing the variable I2. Therefore, in step S117, the variable I2 is incremented.

Next, in step S118, the shadowing calculation result SL (I2, J) is calculated using the incremented variable I2.

Next, in step S119, whether the surface shadowing calculation result SL (I2, J) obtained in step S118 is 1 or not is determined. If it is 1, it means that the boundary has not yet been found, and therefore the flow proceeds to step S117 to continue the following processes. If it is not 1, that is, if it is 0, it means that the boundary has been found, and therefore the flow proceeds to step S120.

Next, in step S120, when I<I2, SL (I, J) is set to 1 and when I≧I2, SL (I, J) is set to 0.

Next, in step S105, whether or not all the boundaries have been searched in the range of 1≦I≦2Nθ is confirmed. If not all the boundaries have been searched, the flow proceeds to step S93 and following processes for further searching, and if all the boundaries have been searched, the flow proceeds to step S106.

Next, in step S106, whether the variable J is equal to Nϕ/2 is confirmed. If the variable J is equal to Nϕ/2, it means that the shadowing calculation results SL (I, J) have been calculated for every direction, and therefore the process is terminated. Otherwise, the flow returns to step S92 and the processing continues.

By the above described process, the boundary between the flow in area and the non-flow in area is searched by using the shadowing calculation result SL (I, J) of a near cell which has been calculated, that is, OLD (I, J), and the shadowing calculation result SL (I, J) of the cell which is currently being analyzed is obtained by examining vicinity of the searched boundary, whereby the shadowing calculation result SL (I, J) can be calculated in a very short period of time for every surface cell. In other words, if the boundary is found immediately, calculation for the number of division 2Nθ along the θ direction becomes unnecessary, and therefore the time necessary for calculation can be reduced to ½Nθ.

Though the ranges for calculation were 0≦θ≦π and 0≦ϕ<π in the above example, the ranges may be 0≦θ≦π/2 and 0≦ϕ≦2π.

Figure 41:
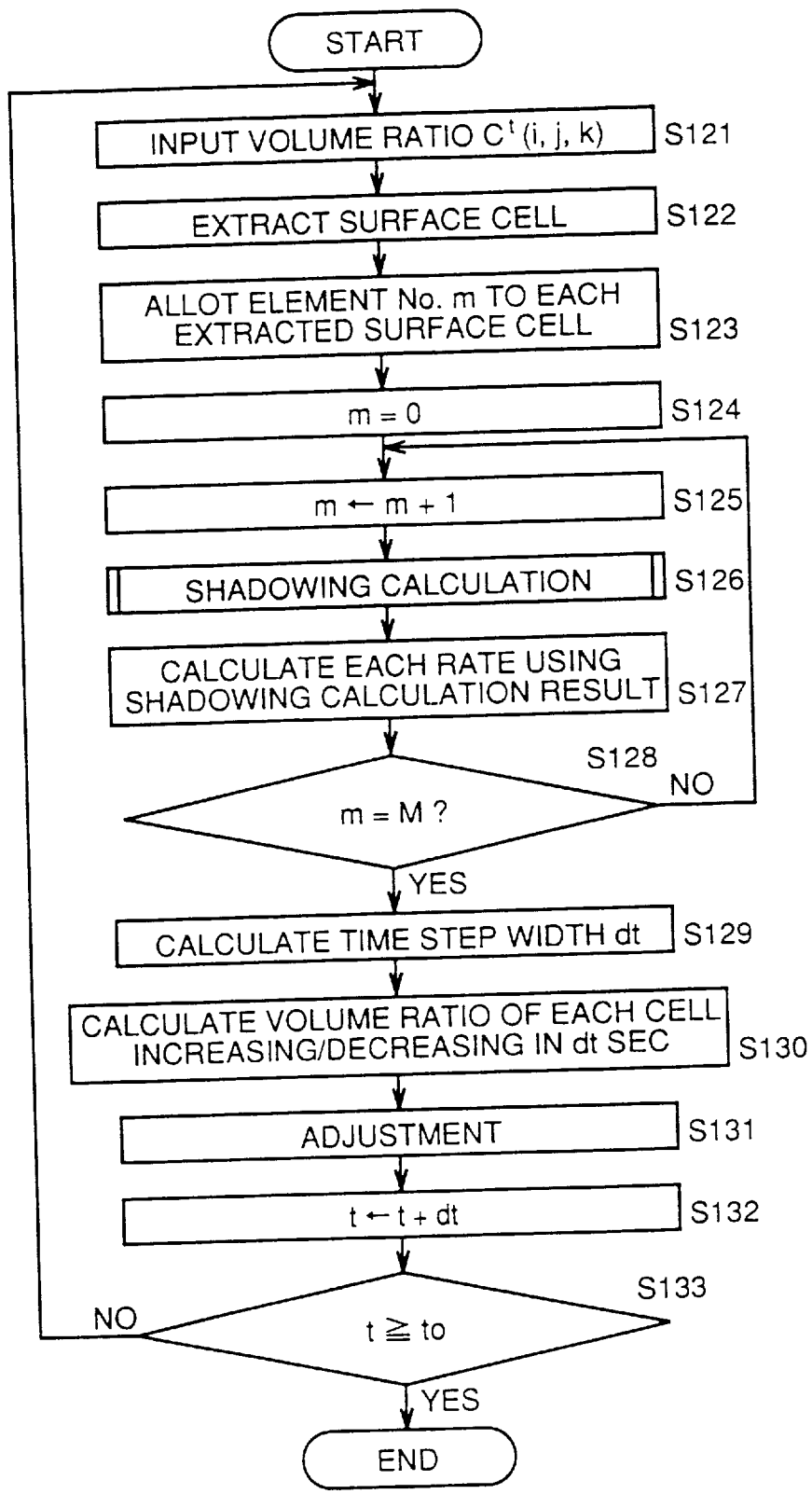
FIG. 41 is a flow chart showing etching calculation employing another method of calculating the solid angle.

Etching calculation will be described with reference to FIG. 41. The etching calculation shown in FIG. 41 is substantially similar to deposition calculation shown in FIG. 36, except that etching rate is calculated instead of deposition rate in step S127. The method of calculating the etching rate is the same as the method of calculating the deposition rate described above, and therefore details thereof is not repeated.

Though a rectangular parallelepiped cell has been used as the analysis element in the above described embodiment, the present invention can be similarly applied to other analysis elements. For example, the analysis element may include a string model, a removal model, a lay tracing model and the like.

If the number of boundaries is determined as 1, 3, 4, . . . , L, similar processing can be carried out as when there are two boundaries as described above, so as to reduce time necessary for calculation.

5. Another Specific Method of Deposition and Etching Calculations (1) Overall Flow In the following, another specific method of deposition and etching calculations will be described. This method enables deposition and etching calculations of higher precision as it performs deposition and etching calculations using a precise surface shape.

Figure 42:
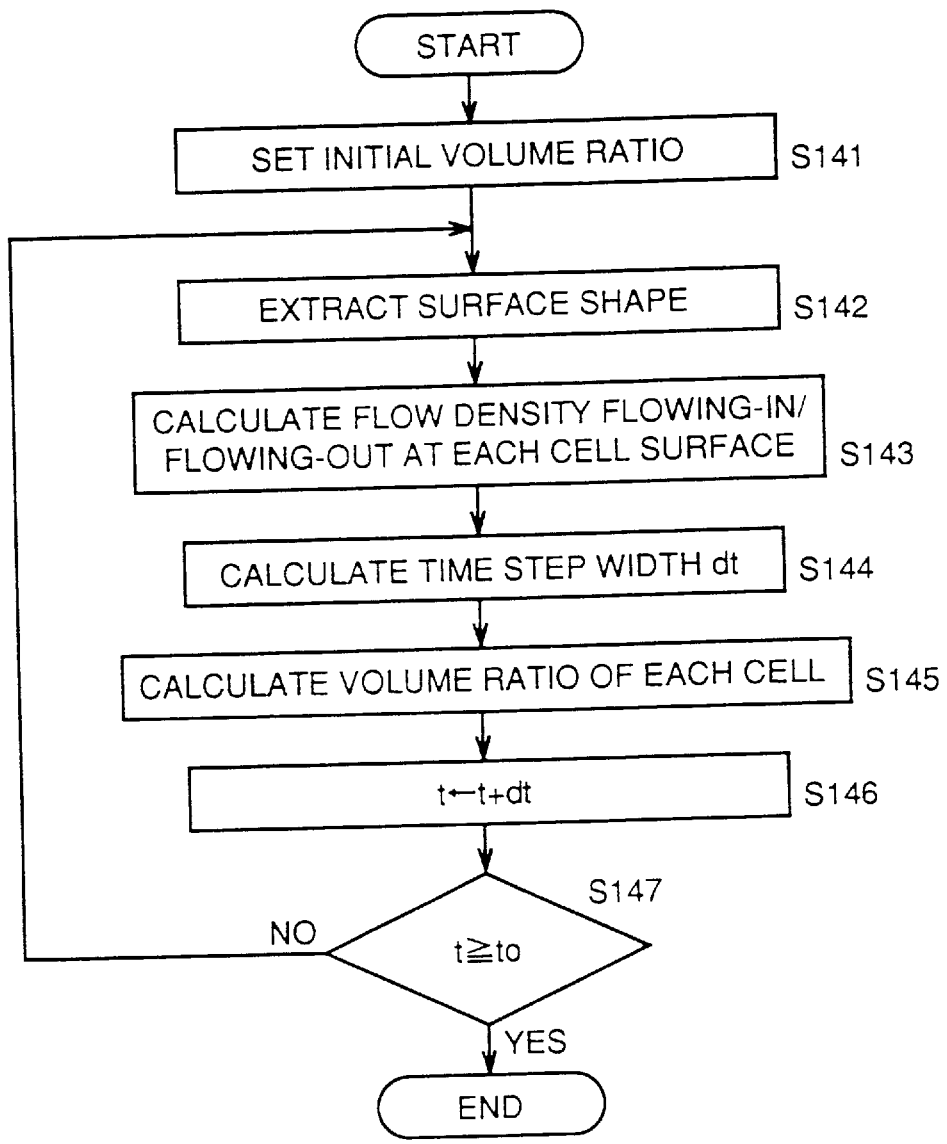
FIG. 42 is a flow chart showing another specific method of deposition and etching calculations.

Referring to FIG. 42, first, in step S141, an initial volume ratio is set in each cell in the analysis area.

Next, in step S142, the surface shape is calculated. The surface shape is calculated by finding an equal volume ratio face at which the volume ratio attains 0.5 for every cell, based on the volume ratios of the cells.

Specific method of calculation will be described in greater detail later.

Then, in step S143, if it is deposition calculation, the flow in density of the substance particles flowing in to the surface of each cell is calculated. More specifically, flow in density is calculated in steps S13 and S14 shown in FIG. 5.

In case of etching calculation, flow out density of the substance particles flowing out from the surface of each cell is calculated. More specifically, the flow out density is calculated through steps S33 to S36 shown in FIG. 22.

Next, in step S144, the time step width dt of the analysis time is calculated. More specifically, the time step width dt of the analysis time is determined such that increase or decrease of the volume ratio of each cell becomes at most 0.5.

Next, in step S145, the volume ratio of each cell increasing/decreasing during the time step width dt determined in step S144 is calculated. Next, in step S146, the time t1 is updated by a small time period dt. Next, in step S147, whether the time t has reached the deposition time or etching time $t_0$ is determined. If time t has not yet reached the deposition time or etching time $t_0$, the flow proceeds to step S142 to continue the following processing, and if the time has elapsed, the process is completed.

According to the deposition and etching calculation method, the amount of substance particles flowing in to or flowing out from each cell is calculated as the amount of substance particles flowing in to or flowing out from an equal volume ratio face (the face having the volume ratio of 0.5) of each cell. Therefore, the amount can be calculated with extremely high precision as compared with the conventional method in which it is calculated by using the amount of substance particles flowing in to or flowing out from the surface of the surface cell approximated as a rectangle.

(2) Method of Calculating Equal Volume Ratio Face

The method of calculating the equal volume ratio face used for calculating the surface shape in step S142 shown in FIG. 42 will be described in detail.

(a) First Method of Extraction

In the following, the first method of extracting the equal volume ratio face will be described.

Figure 43:
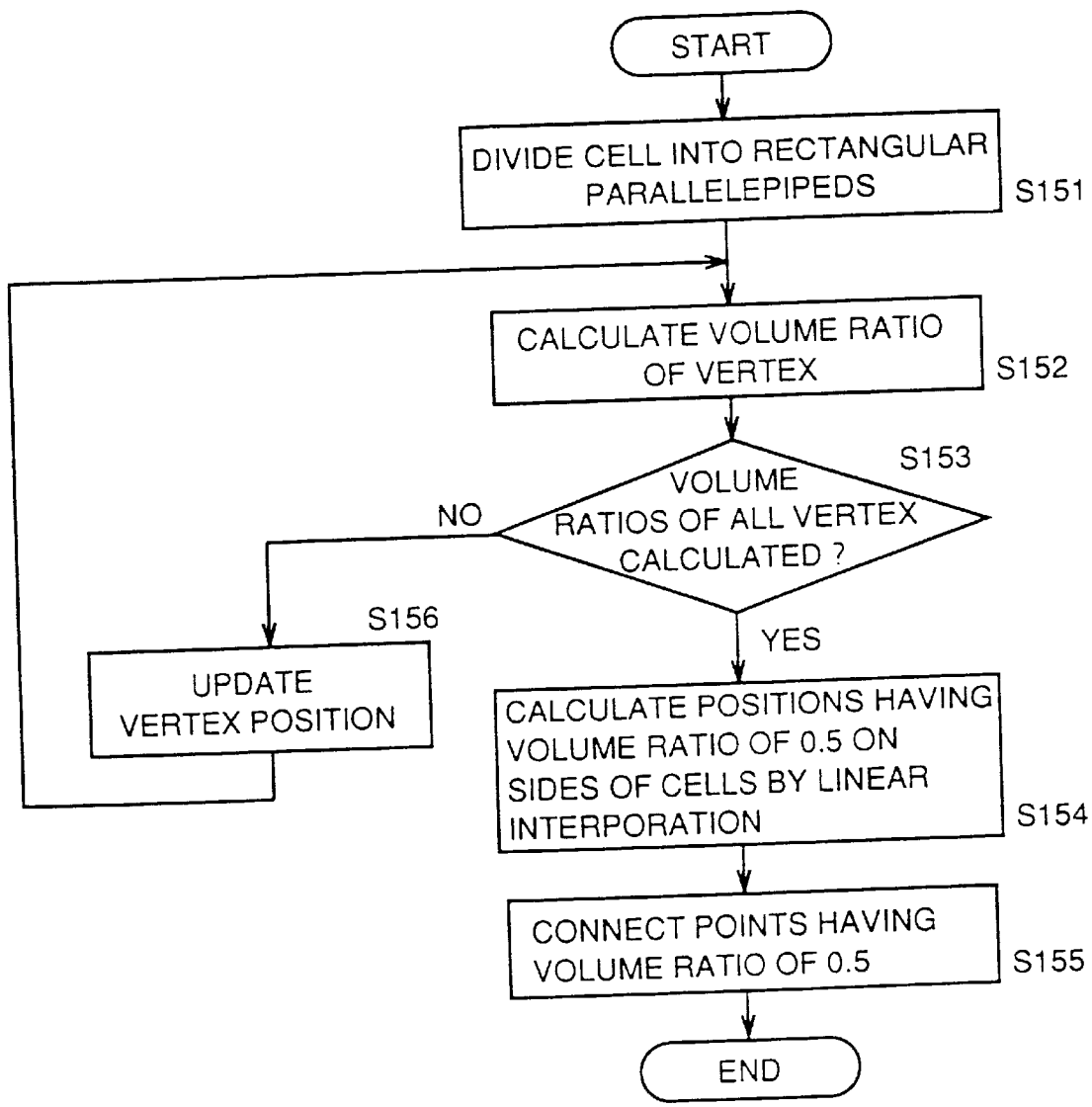
FIG. 43 is a flow chart showing a first method of extracting an equal volume ratio face.
Figure 44:
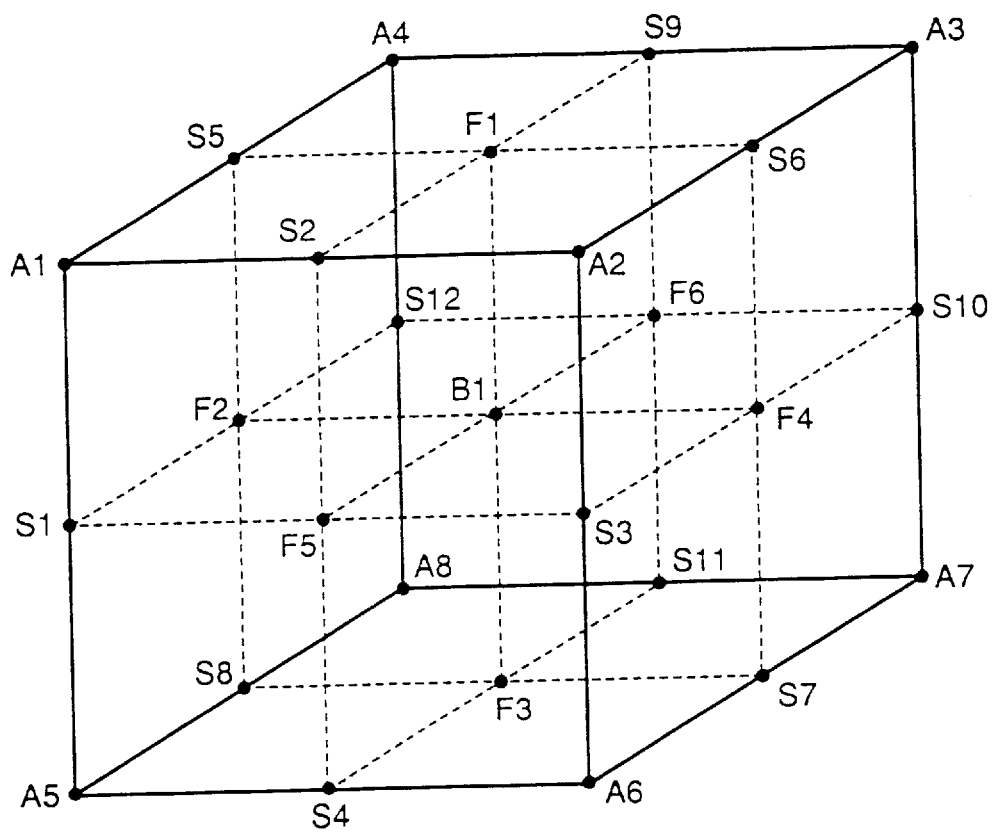
FIG. 44 shows a cell divided into eight.

First, referring to FIG. 43, in step S151, a cell is divided into 8 rectangular parallelepipeds. FIG. 44 shows a cell divided into 8. A1 to A8 shown in FIG. 44 denote vertexes of the cell, F1 to F4 denote face centers of the cell surface, S1 to S12 denote middle points of sides of the cell, and B1 denotes the volume center of the cell. As shown in FIG. 44, the cell is equally divided into 8, and the vertexes of the divided cells correspond to A1 to A8, F1 to F6, S1 to S12 and B1.

Figure 45:
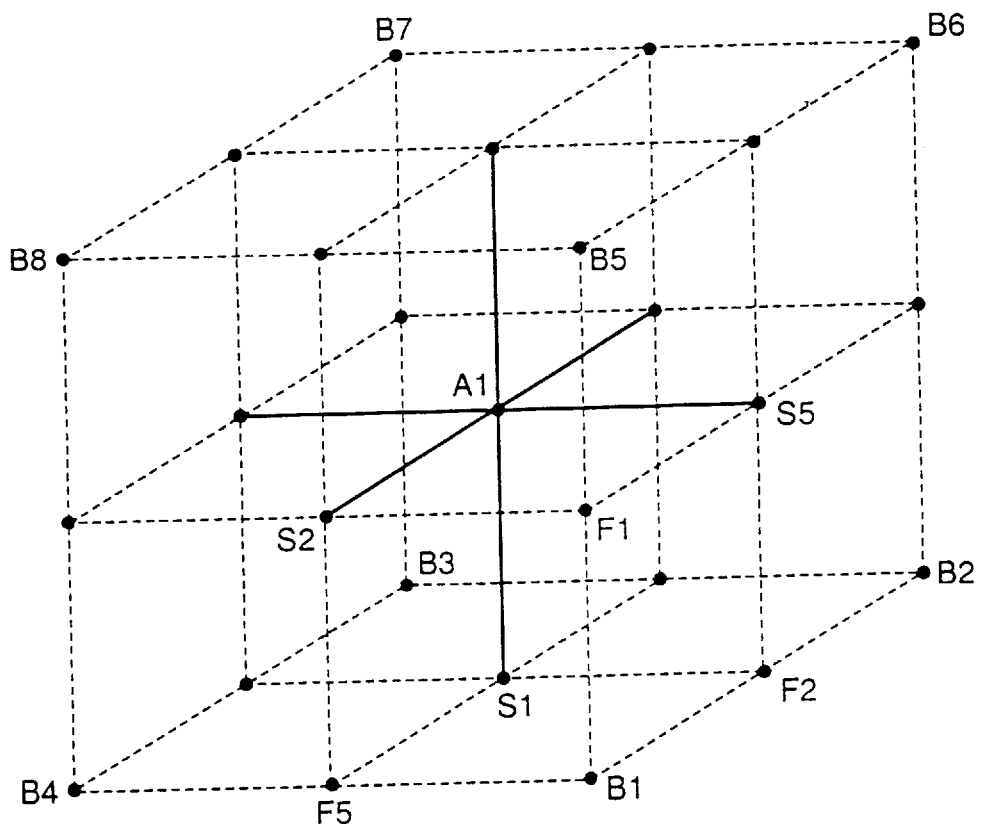
FIG. 45 is an illustration showing a method of calculating volume ratio at a vertex of the divided cell shown in FIG. 44.

Next, in step S152, the volume ratio of a vertex of the divided cell is calculated. FIG. 45 is an illustration showing the method of calculating the volume ratio of the vertex of the divided cell. For example, the volume ratio of a vertex A1 is calculated in the following manner. Since volume ratios of volume centers B1 to B8 of the cells surrounding vertex A1 have already been calculated, the volume ratios of volume centers B1 to B8 are assumed to be C1 to C8, respectively. The volumes of the rectangular parallelepipeds formed by the vertex A1, the volume center opposing to volume centers B1 to B8 with the vertex A1 being the center are denoted as V1 to V8. For example, if we consider the volume center B7, the volume center which opposes with the vertex A1 being the center is B1, and the volume of a rectangular parallelepiped having A1, S2, F1, S5, F5, B1, F2 and S1 as vertexes is represented as V7. Therefore, the volume ratio $C_{A1}$ of the vertex A1 is represented as:

$$C_{A1} = (C1V1 + C2V2 + \ldots + C8V8)/(V1 + V2 + \ldots + V8)$$

By the above described method, the volume ratio of vertex A1, for example, is calculated.

Next, in step S153, whether or not the volume ratios of all the vertexes of the divided cell have been calculated is determined. If not all the vertexes have been calculated, the flow proceeds to step S156 where the position of the vertex is updated, and then the flow proceeds to S152 to continue the following processes. Meanwhile, if the volume ratios of all the vertexes have been calculated, the flow proceeds to step S154.

By the above described processing, volume ratios of 27 vertexes A1 to A8, S1 to S12, F1 to F6 and B1, which are all the vertexes of the divided 8 cells are calculated.

Figure 46:
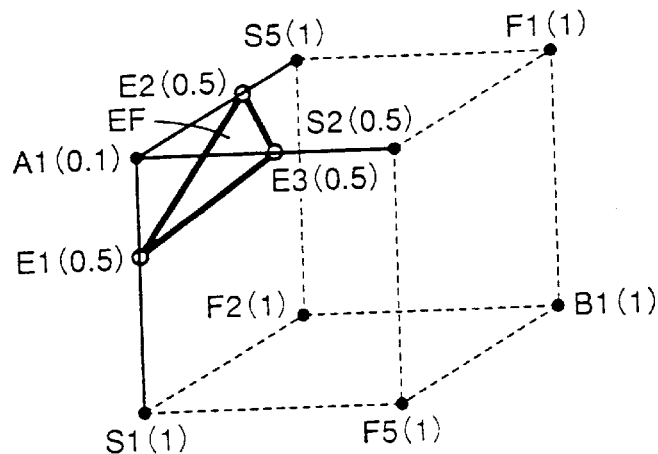
FIG. 46 shows the equal volume ratio face calculated in accordance with the method of extraction shown in FIG. 43.

Then, the flow proceeds to step S154, where a position on each side of the divided cell at which the volume ratio attains 0.5 is calculated by linear interpolation, based on the calculated volume ratios of respective vertexes. FIG. 46 shows an equal volume ratio face calculated in accordance with the method shown in FIG. 43. The values in parenthesis in the figure represent the volume ratios. For example, when volume ratios of respective vertexes of the divided cell have been calculated as shown in FIG. 46, points E1 to E3 on respective sides where the volume ratio attains 0.5 are calculated by linear interpolation, using the calculated volume ratios. Though linear interpolation is performed as interpolation, other method of interpolation may be used, and the same applies to other interpolation in the subsequent steps.

In step S155, points having the volume ratio of 0.5 are connected. For example, when points E1 to E3 having the volume ratio of 0.5 are calculated as shown in FIG. 46, these points are connected and an equal volume ratio face FE is obtained.

In the above described method, one cell is further divided into 8, and therefore an equal volume ratio face can be obtained very finely. Therefore, when deposition or etching calculation is effected by using the calculated equal volume ratio face, very precise shape simulation is possible.

(b) Second Method of Extraction

A second method of extracting an equal volume ratio face will be described. In the first method of extraction described above, a three dimensional model was used. The second method of extraction is applied to two dimensional model.

Figure 47:
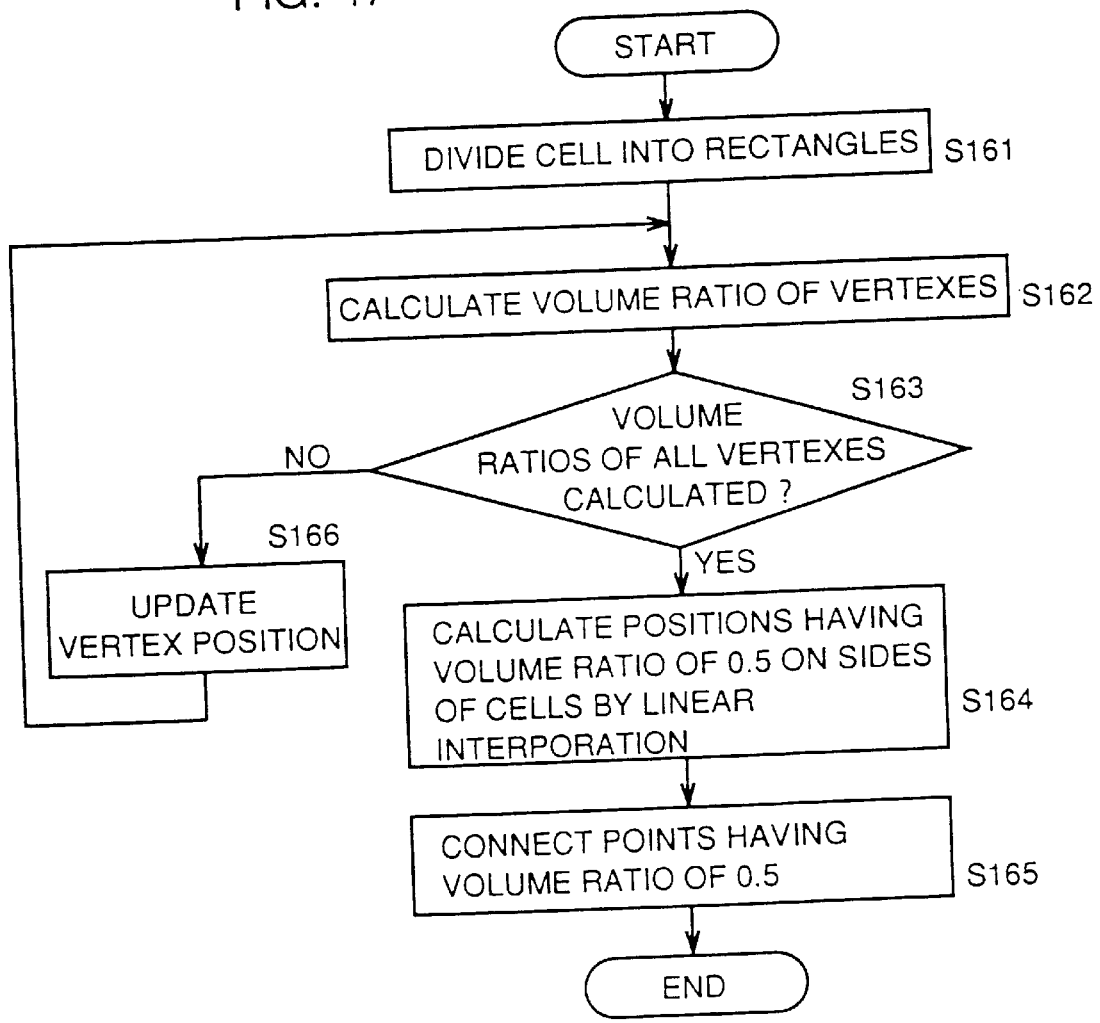
FIG. 47 is a flow chart showing a second method of extracting an equal volume ratio face.
Figure 48:
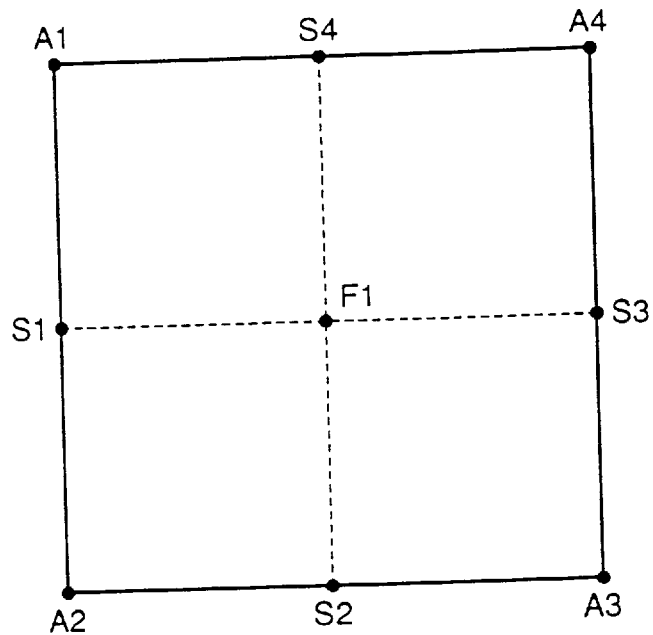
FIG. 48 shows a cell divided into four.

Referring to FIG. 47, first, in step S161, a two dimensional rectangular cell is further divided into four rectangles. FIG. 48 shows the cell divided into four. In FIG. 48, A1 to A4 denote vertexes of the original cell, S1 to S4 denote middle points of respective sides of the original cell and F1 denotes the face center of the original cell. Therefore, four rectangle cells obtained by the division has vertexes A1 to A4, S1 to S4 and F1.

Next, in step S161, volume ratio of the vertexes of the divided cells is calculated. For example, the volume ratio of vertex A1 is calculated in the following manner.

Figure 49:
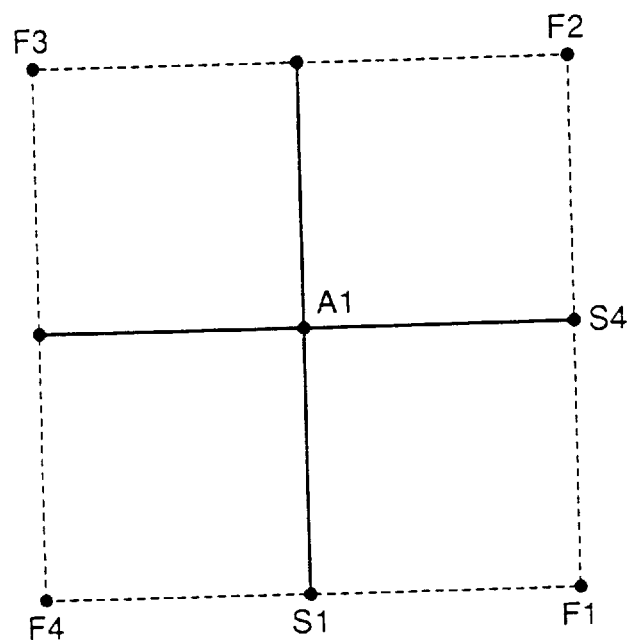
FIG. 49 is an illustration showing a method of calculating volume ratio at a vertex of the divided cell shown in FIG. 48.

FIG. 49 is an illustration showing the method of calculating the volume ratio of a vertex of the divided cell. It is assumed that the volume ratios of face centers F1 to F4 of the cells surrounding vertex A1 have been already calculated, and the volume ratios are denoted as C1 to C4, respectively. Volumes of rectangles formed by the vertex A1 and face centers F1 to F4 opposing to face centers F1 to F4 with the vertex Al being the center are denoted as V1 to V4. For example, the face center opposing to the face center F3 is F1, and the opposing rectangle is that one constituted by the vertexes A1, S1, F1, S4, which volume is V3. Therefore, the volume ratio of the vertex A1 can be calculated in accordance with the following equation:

$$C_{A1} = (C1V1 + C2V2 + C3V3 + C4V4)/(V1 + V2 + V3 + V4).$$

By the above described equation, the volume ratio of each vertex of the divided cell can be calculated.

Next, in step S163, whether or not the volume ratio of all the vertexes of the divided cell have been calculated is determined. If not all the volume ratios have been calculated, the flow proceeds to step S166 where the position of the vertex is updated, and the flow further proceeds to step S162 to continue the following processes. Meanwhile, if the volume ratios of all the vertexes have been already calculated, the flow proceeds to step S164. By the above described processing, volume ratio of all the vertexes of the divided cell can be calculated.

Figure 50:
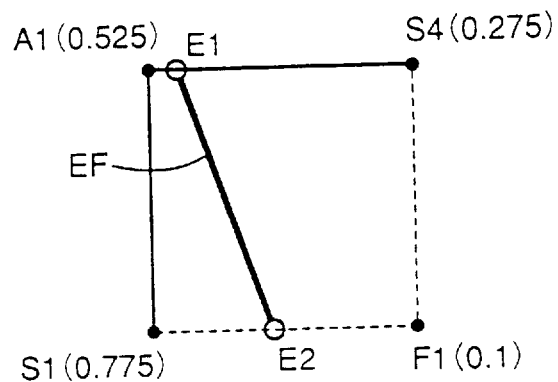
FIG. 50 shows the equal volume ratio face calculated in accordance with the method of extraction shown in FIG. 47.

Next, in step S164, a position at which the volume ratio attains 0.5 on each side of the divided cell is calculated by linear interpolation. When vertexes are calculated as shown in FIG. 50, for example, points E1 and E2 at which the volume ratio attains 0.5 are calculated by linear interpolation based on the volume ratios of vertexes A1, S1, F1, S4 calculated in step S162.

Then, in step S165, points having the volume ratio of 0.5 are connected. In the example shown in FIG. 50, the points E1 and E2 at which the volume ratio attains 0.5 are connected, determining an equal volume ratio face EF.

In the above described method, for two dimensional simulation, a rectangular cell is further divided into four rectangular cells, and an equal volume ratio face having the volume ratio of 0.5 is calculated based on the volume ratios of respective vertexes of the divided cell, and therefore, the equal volume ratio face can be calculated very finely. When deposition or etching calculation is effected by using the calculated highly precise equal volume ratio face, very precise shape simulation becomes possible.

(c) Third Method of Extraction

Next, a third method of extracting an equal volume ratio face will be described. The third method of extraction is applied to three dimensional shape simulation.

Figure 51:
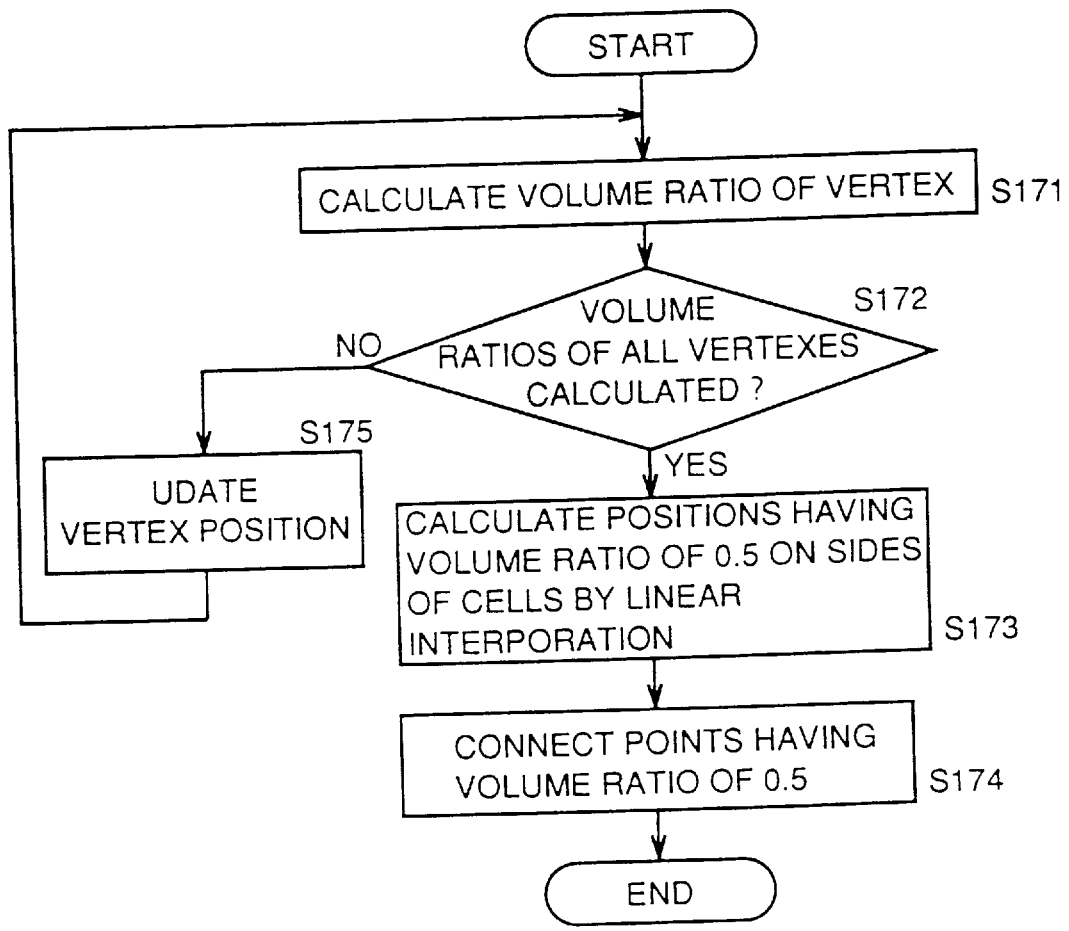
FIG. 51 is a flow chart showing a third method of extracting an equal volume ratio face.
Figure 52:
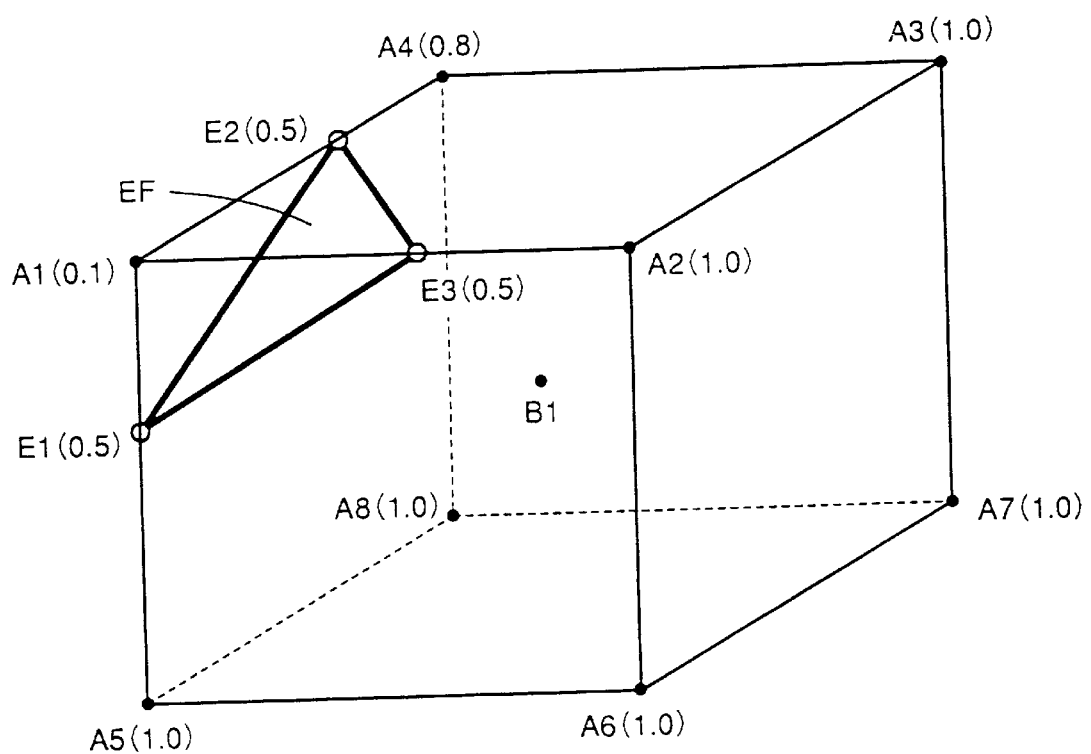
FIG. 52 is an illustration of the method of extraction shown in FIG. 51.

Referring to FIG. 51, first, in step S171, volume ratio of each vertex of a rectangular parallelepiped cell is calculated. As shown in FIG. 52, the cell has vertexes A1 to A8. For example, the volume ratio of vertex A1 is calculated in the similar manner as described with respect to step S152 shown in FIG. 43, based on the volume ratios of the cells around the vertex A1.

Next, in step S172, whether or not the volume ratios of all the vertexes have been calculated is determined. If the volume ratio of not all the vertexes have been calculated, the flow proceeds to step S174 where the position of the vertex is updated, and the flow proceeds to step S171 to continue the following processes. Meanwhile, if the volume ratio of all the vertexes have been already calculated, the flow proceeds to step S173. By the above described processing, the volume ratio of vertexes Al to A8 can be calculated as shown in FIG. 52.

In step S173, a position at which the volume ratio attains 0.5 on each side of the cell is calculated by linear interpolation. For example, as shown in FIG. 52, points E1 to E3 having the volume ratio of 0.5 are calculated on respective sides based on the volume ratios of vertexes A1 to A8.

Next, in step S174, positions having the volume ratio of 0.5 are connected. In the example shown in FIG. 52, points E1 to E3 having the volume ratio of 0.5 are connected, determining an equal volume ratio face EF.

In the above described third method of extraction, the number of volume ratios to be calculated is smaller as compared with the first method, and therefore the time necessary for calculation can be reduced to about one eighth, enabling high speed shape simulation. Further, since the number of volume ratios to be stores is also reduced, the storage capacity for storing the volume ratios can also be reduced.

(d) Fourth Method of Extraction

A fourth method of extracting the equal volume ratio face will be described. The fourth method of extraction is applied to a two dimensional shape simulation.

Figure 53:
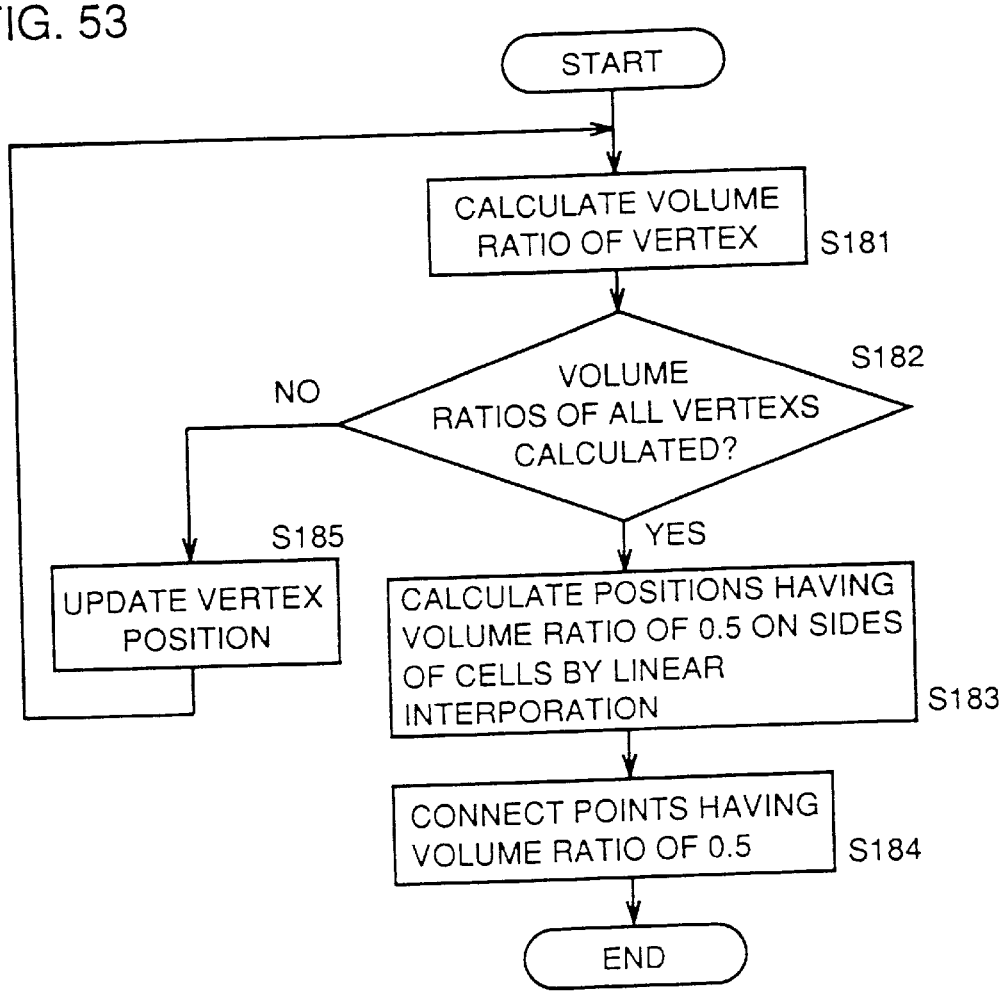
FIG. 53 is a flow chart showing a fourth method of extracting an equal volume ratio face.
Figure 54:
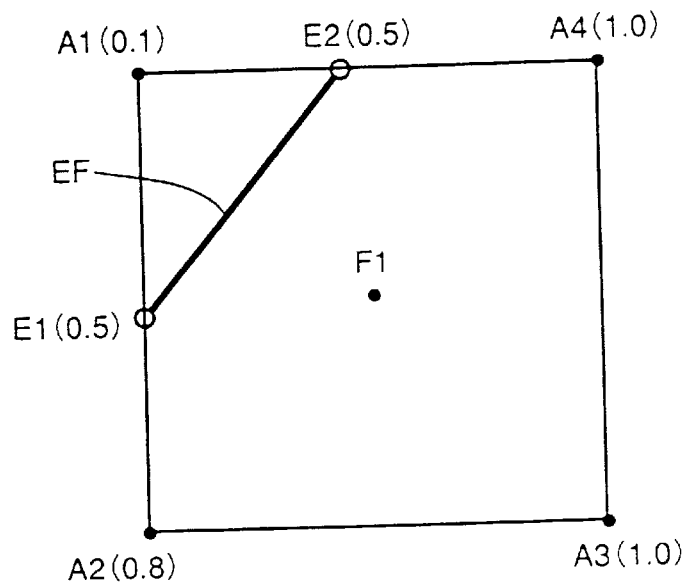
FIG. 54 is an illustration showing the method of extraction shown in FIG. 53.

Referring to FIG. 53, first, in step S181, volume ratios of respective vertexes of a rectangular cell are calculated. For example, when a rectangular cell has four vertexes A1 to A4 as shown in FIG. 54, volume ratios of the vertexes are calculated in the similar manner as the method of calculating the volume ratio described in step S162 of FIG. 47. Next, in step S182, whether or not the volume ratios of all the vertexes have been calculated is determined. If the volume ratios of all the vertexes have not yet been calculated, the position of a vertex is updated in step S185, and the flow proceeds to step S181 to continue the following processes. Meanwhile, if the volume ratios of all the vertexes have been calculated, the flow proceeds to step S183.

In step S183, a position at which the volume ratio attains 0.5 on each side of the cell is calculated by linear interpolation. In the example of FIG. 54, points E1 and E2 having the volume ratio of 0.5 on sides of the cell are calculated based on the volume ratios of vertexes A1 to A4.

Next, in step S184, the points having the volume ratio of 0.5 are connected. For example, as shown in FIG. 54, points E1 and E2 having the volume ratio of 0.5 are connected to determine an equal volume ratio face EF.

In the fourth method of extraction described above, only the volume ratios of cell vertexes are used, and therefore the number of volume ratios used is small, the time for calculation can be reduced to one half as compared with a second method of extraction, and therefore calculation can be carried out at high speed. Further, since the number of volume ratios used is small, the storage capacity of the memory device storing the volume ratios can be reduced. If the same computer is used, the number of division of the cells can be increased, and as a result, highly precise shape simulation becomes possible.

(e) Fifth Method of Extraction

A fifth method of extracting an equal volume ratio face will be described. In the fifth method of extraction, the method for calculating the equal volume ratio face which has been described in the section of "(4) Specific Method of Calculating Substance Boundary" with reference to FIG. 11 to 13. More specifically, volume ratios of vertexes of the rectangular parallelepiped cell and the volume ratio at the center of the boundary face of the rectangular parallelepiped cell are calculated by linear interpolation. The object cell is divided into 24 tetrahedrons, points having the volume ratio of 0.5 on the sides of the tetrahedrons are calculated by linear interpolation, and the calculated points are connected to determine an equal volume ratio face. Since the details have been already described, description is not repeated.

In the above described fifth method of extraction, since the number of volume ratios to be calculated is small, the time for calculation can be reduced to about one half as compared with the first method. Therefore, shape simulation can be effected at high speed, and the storage capacity of the memory storing the volume ratios can be reduced. Therefore, if the same device is used, the number of division of the cells can be increased, which enables highly precise shape simulation.

(f) Sixth Method of Extraction

A sixth method of extraction of an equal volume ratio face will be described. The sixth method of extraction is applied to a three dimensional shape simulation.

Figure 55:
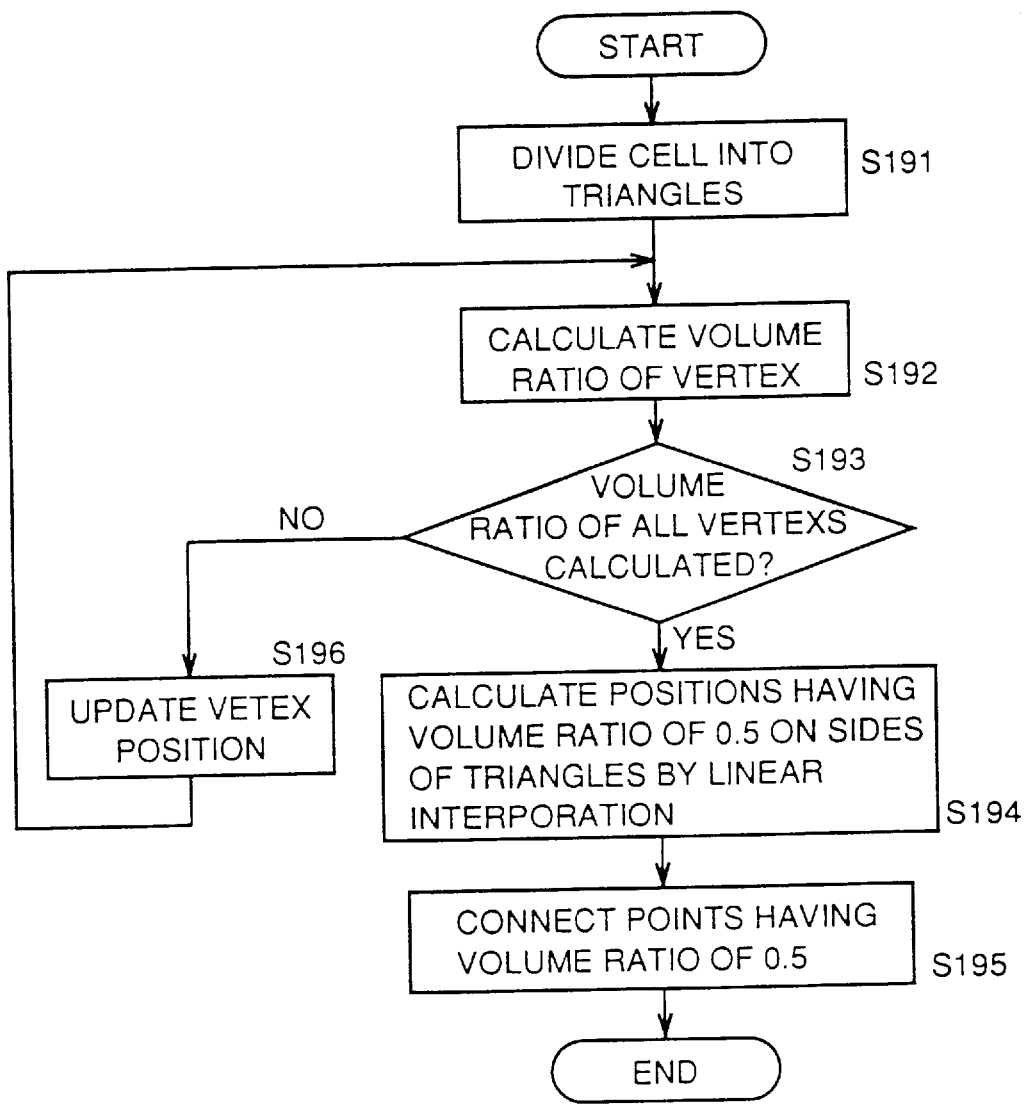
FIG. 55 is a flow chart showing a sixth method of extracting an equal volume ratio face.
Figure 56:
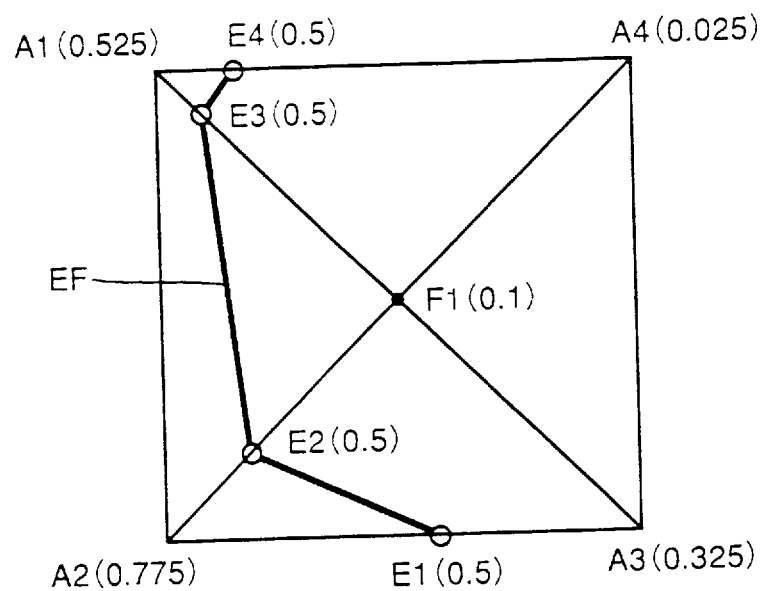
FIG. 56 is an illustration showing the method of extraction shown in FIG. 55.

Referring to FIG. 55, first, in step S191, a cell is divided into four triangles. Referring to FIG. 56, for example, a rectangular cell having four vertexes A1 to A4 is divided into four triangles with the face center F being the center.

Next, in step S192, volume ratio of vertexes of the rectangular cell are calculated. More specifically, the volume ratios of the vertexes are calculated by the same method of calculating the volume ratio as shown in step S162 of FIG. 47.

Next, in step S193, whether the volume ratios of all the vertexes have been calculated is determined. If the volume ratios of all the vertexes have not yet been calculated, position of a vertex is updated in step S196, the flow proceeds to step S192 and the following processes are carried out. Meanwhile, if the volume ratios of all vertexes have been calculated, the flow proceeds to step S194.

Next, in step S194, a position at which the volume ratio attains 0.5 on each side of the cell is calculated by linear interpolation. In the example of FIG. 56, points E1 to E4 having the volume ratio of 0.5 on the sides of the triangles are calculated by linear interpolation based on the volume ratios of vertexes Al to A4 and F1 of the divided triangles.

Next, in step S195, points having the volume ratio of 0.5 are connected. More specifically, as shown in FIG. 56, points E1 to E4 having the volume ratio of 0.5 are connected to determine an equal volume ratio face EF.

In the above described sixth method of extraction, since the equal volume ratio face can be determined by using three sides, the equal volume ratio face can be indicated with higher definition as compared with the fourth method of extraction shown in FIG. 54, enabling approximation of the volume ratio face with higher precision. Accordingly, deposition and etching calculation can be effected by using highly precisely approximated equal volume ratio face, shape simulation comes to be more precise.

Though rectangular parallelepiped cells have been described for three dimensional shape simulation above, the same applies to cubic cells. Though rectangular cells have been described for two dimensional shape simulation, the present invention can be also applied to square cells.

6. Method of Storing Volume Ratio (1) First Method of Storing

A first method of storing volume ratios will be described in the following.

First, variables used in the flow chart of FIG. 57 will be described. IND (i, j, k) is a material index corresponding to each cell, and i, j and k in the parenthesis specify the corresponding cell. In IND (i, j, k), 0 is stored when it is vacuum or only the air exists. When it is a single area completely filled by one type of material only, a numeral corresponding to the material is stored therein. For example, when it is silicon, 1 is stored, polysilicon, 2 is stored, $SiO_2$, 3 is stored, and in this manner numerals unique to each of the materials are stored. When there are a plurality of materials (including vacuum or air) exist in one cell, a prescribed number larger than 100 is stored in each cell, indicating that a plurality of materials are in the area. A (m, II) represents material volume ratio. Here, m is a material number. As mentioned above, a prescribed number is allotted, for example, if the materials is silicon, 1, polysilicon, 2 and $SiO_2$, 3. II is a numeral calculated in accordance with the equation II=IND (i, j, k)−100. A (m, II) is a variable used for the area including a plurality of materials, and volume ratio is stored for each material existing in the cell.

Figure 57:
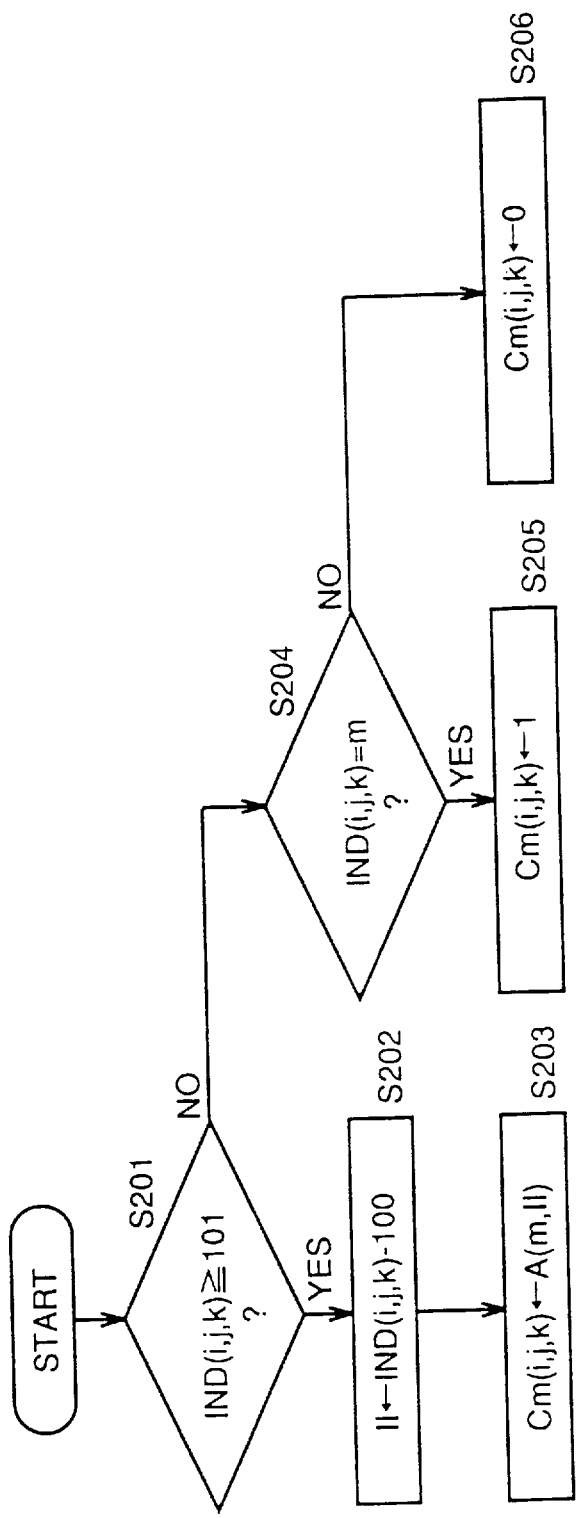
FIG. 57 is a flow chart showing a first method of storing volume ratio.

Referring to FIG. 57, first, in step S201, whether or not the material index IND (i, j, k) is not smaller than 101 is determined. If it is not smaller than 101, it is determined that the corresponding cell includes a plurality of materials, and the flow proceeds to step S202. Meanwhile, if the index is smaller than 101, it is determined that the cell is a single material area, and the flow proceeds to step S204.

If it is determined that the cell includes a plurality of materials, in step S202, result of subtraction of 100 from IND (i, j, k) is substituted for II. For example, if IND (i, j, k) is 101, the calculation result is 1, and the value of II will be 1.

In step S203, substitute A (m, II) for Cm (i, j, k). Here, Cm (i, j, k) represents volume ratio of a material m. More specifically, the material volume ratio specified by m and II, that is, the volume ratio of the material m of the IIth cell including a plurality of materials substitutes for Cm (i, j, k).

Meanwhile, if it is determined to be an area of single material, in step S204, whether the index IND (i, j, k) is equal to the material number m is determined. If it is, it means that the material specified by the material number m exists in the corresponding cell with the volume ratio of "1", the flow proceeds to step S205, and 1 is input for Cm (i, j, k). Meanwhile, if the index is not equal to the material number, it means that the corresponding cell is vacuum or air exists in the cell. Therefore, the flow proceeds to step S206, and "0" indicating air or vacuum is input to Cm (i, j, k).

The above described processes are carried out for every prescribed material number m, and volume ratio Cm (i, j, k) of each cell is set for every material.

Next, the first method of storing will be more specifically described with reference to FIGS. 58 to 60. In FIGS. 58 to 60, numerals in the grid represent the volume ratios of various materials.

As shown in FIG. 58, the cells having the silicon volume ratio of 1 correspond to the cells having material index of 1 in FIG. 61. The cells shown in FIG. 59 having the polysilicon volume ratio of 1 correspond to the cells having the number 2 of FIG. 61. Further, as shown in FIG. 60, the cells having the $SiO_2$ volume ratio of 1 shown in FIG. 60 correspond to the material index 3 of FIG. 61. Cells in which no substance exist correspond to material index 0 as shown in FIG. 61. Other cells, that is, cells including a plurality of materials, numbers 101 to 106 are set as the material index for respective cells.

For example, the material index of the cell having i=1 and k=3 is 101. Therefore, according to the flow chart above, 100 is subtracted from the material index 101, and II is replaced by I. In this cell, silicon and polysilicon exist with the volume ratio of 0.5 each. Therefore, as the material volume ratio A (m, II), A (1, 1)=0.5, A (2, 1)=0.5 are stored respectively. These values substitute for the volume ratio Cm (i, k) resulting in C1 (1, 3)=0.5, C2 (1, 3)=0.5.

If the volume ratios must be stored for each of the above mentioned three materials, a total of 75 pieces of data are necessary. However, according to the first method, a plurality of data must be stored only for the areas 101 to 106 including a plurality of materials. Therefore, data to be stored includes 19 data for the single substance areas, and 9 data for the areas including a plurality of substances, that is, a total of 28. Namely, the storage capacity is approximately reduced to ¼. Accordingly, when a computer having the same storage capacity is used for shape simulation, the storage capacity can be reduced to one fourth, and data of four times larger number of cells can be stored. As a result, the number of division of the cells can be increased, enabling higher precision of shape simulation.

Method of storing volume ratios updated by deposition or etching calculation will be described.

Figure 62:
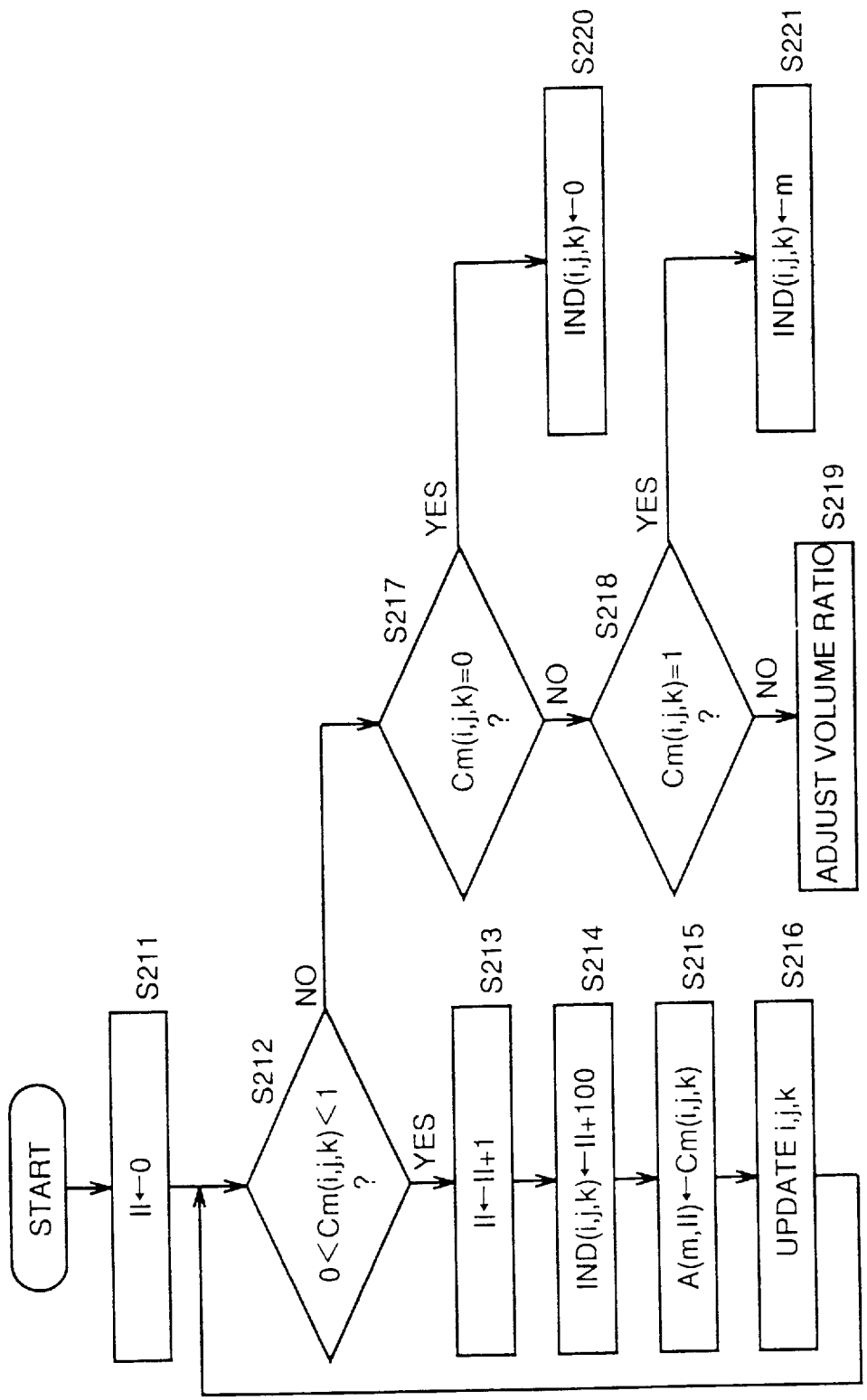
FIG. 62 is a flow chart showing a method of updating stored volume ratio.

Referring to FIG. 62, in step S211, substitute 0 for II.

Next, in step S212, whether the calculated volume ratio Cm (i, j, k) is larger than 0 and smaller than 1 is determined. If this condition is satisfied, the flow proceeds to step S213, and if not, it proceeds to step S217.

If the above condition is satisfied, the calculated volume ratio Cm (i, j, k) may be stored as it is, and therefore the following processes are performed. First, in step S213, 1 is added to II, and the result is regarded as II.

Next, in step S214, 100 is added to II, and the result substitutes for material index IND (i, j, k).

In step S215, volume ratio Cm (i, j, k) substitutes for material volume ratio A (m, II). Through the above described processes, the volume ratio corresponding to the material number m is stored in the material volume ratio A (m, II).

Thereafter, values i, j, k are updated, the flow proceeds to step S212, and the same processes as described above are performed for the next cell.

If it is determined in step S212 that the condition is not satisfied, in step S217, whether or not the volume ratio Cm (i, j, k) is 0 is determined. If it is equal to 0, the flow proceeds to step S218, otherwise it proceeds to step S220. If the volume ratio is equal to 0, the corresponding cell is vacuum or only the air exists in the cell.

Therefore, 0 is input to material index IND (i, j, k).

Meanwhile, if it is not equal to 0, in step S218, whether or not the volume ratio Cm (i, j, k) is equal to 1 is determined. If it is not equal to 1, the flow proceeds to step S219, and if it is equal to 1, the flow proceeds to S221.

If it is equal to 1, it means that the corresponding cell is completely filled with the material corresponding to the material number m. Therefore, in step S221, m substitutes for material index IND (i, j, k).

If it is not equal to 1, the volume ratio Cm (i, j, k) may be smaller than 0 or larger than 1, and therefore adjustment of the volume ratio is necessary. Therefore, in step S219, the volume ratio is adjusted.

The above described processes are performed for every prescribed material number m, and volume ratio of each cell is updated for every material.

Adjustment of the volume ratio will be described in detail with reference to FIGS. 63 to 65. Assume that deposition calculation starts from the state shown in FIG. 63, and thereafter, there appears cells (denoted by 0) having the volume ratio of larger than 1, as shown in FIG. 64. In that case, adjustment is carried out in the following manner. If cells whose volume ratio is less than 0.5 from among the cells (i±1, j, k), (i, j±1, k) and (i,j, k±1) around the cell (i, j, k) whose volume ratio exceeded 1 are denoted as α, β, γ, . . . , and the areas with which the cell (i, j, k) is in contact are denoted as Sα, Sβ, Sγ, . . . , the following formulas apply:

$$C^{t+dt}(i,j,k) \leftarrow 1$$

$$C^{t+dt}(\alpha) \leftarrow C^{t+dt}(\alpha) + \eta \cdot S\alpha/(S\alpha + S\beta + S\gamma + \ldots)$$

$$C^{t+dt}(\beta) \leftarrow C^{t+dt}(\beta) + \eta \cdot S\beta/(S\alpha + S\beta + S\gamma + \ldots)$$

$$C^{t+dt}(\gamma) \leftarrow C^{t+dt}(\gamma) + \eta \cdot S\gamma/(S\alpha + S\beta + S\gamma + \ldots)$$

where $$\eta = C^{t+dt}(i,j,k) - 1.$$

By the above described process, the volume ratios after adjustment are made as shown in FIG. 65, and therefore all the volume ratios are within the range of from 0 to 1.

Adjustment when the volume ratio attains negative in etching calculation will be described with reference to FIGS. 66 to 68. When etching calculation starts from the state shown in FIG. 66 and cells having negative volume ratios appear as shown in FIG. 67, the following adjustment is carried out. If the cells whose volume ratio is not less than 0.5 among the cells (i±1, j, k), (i, j±1, k) and (i, j, k±1) around the cell (i, j, k) whose volume ratio is negative are denoted as α, β, γ, . . . , and the areas with which the cell (i, j, k) is in contact are denoted as Sα, Sβ, Sγ, . . . , the following formulas apply.

$$C^{t+dt}(i,j,k) \leftarrow 0$$

$$C^{t+dt}(\alpha) \leftarrow C^{t+dt}(\alpha) - \eta \cdot S\alpha/(S\alpha + S\beta + S\gamma + \ldots)$$

$$C^{t+dt}(\beta) \leftarrow C^{t+dt}(\beta) - \eta \cdot S\beta/(S\alpha + S\beta + S\gamma + \ldots)$$

$$C^{t+dt}(\gamma) \leftarrow C^{t+dt}(\gamma) - \eta \cdot S\gamma/(S\alpha + S\beta + S\gamma + \ldots)$$

where $$\eta = -C^{t+dt}(i,j,k) > 0.$$

According to the above formulas, when the volume ratios of cell α, β, γ, . . . attains negative, the volume ratio of that cell is set to 0. By this adjustment, all volume ratios are within the range of from 0 to 1, as shown in FIG. 68.

(2) Second Method of Storing

Second method of storing the volume ratio will be described with reference to FIG. 69.

The variables used in the flow chart of FIG. 69 will be described. IND (i, j, k) and Cm (i, j, k) are the same as those used in the first method described above. NS (Il) denotes a start number, and NE (Il) is an end number. NS (Il) and NE (Il) are set for every IND (i, j, k) of the area including a plurality of substances, that is, for every I1. In other words, NE (Il)–NS (Il)+1 serves as the material number of the cell including a plurality of substances. CC (L) represents the material volume ratio of the cell including a plurality of substances, while IC (L) is a material index of the cell including a plurality of substances. There are a number CC (L) s and IC (L) s corresponding to the number of materials included in the cell, specifying the materials included in the cell and the volume ratios thereof. The variable L satisfies NS (Il) ≦ L ≦ NE (Il).

Figure 69:
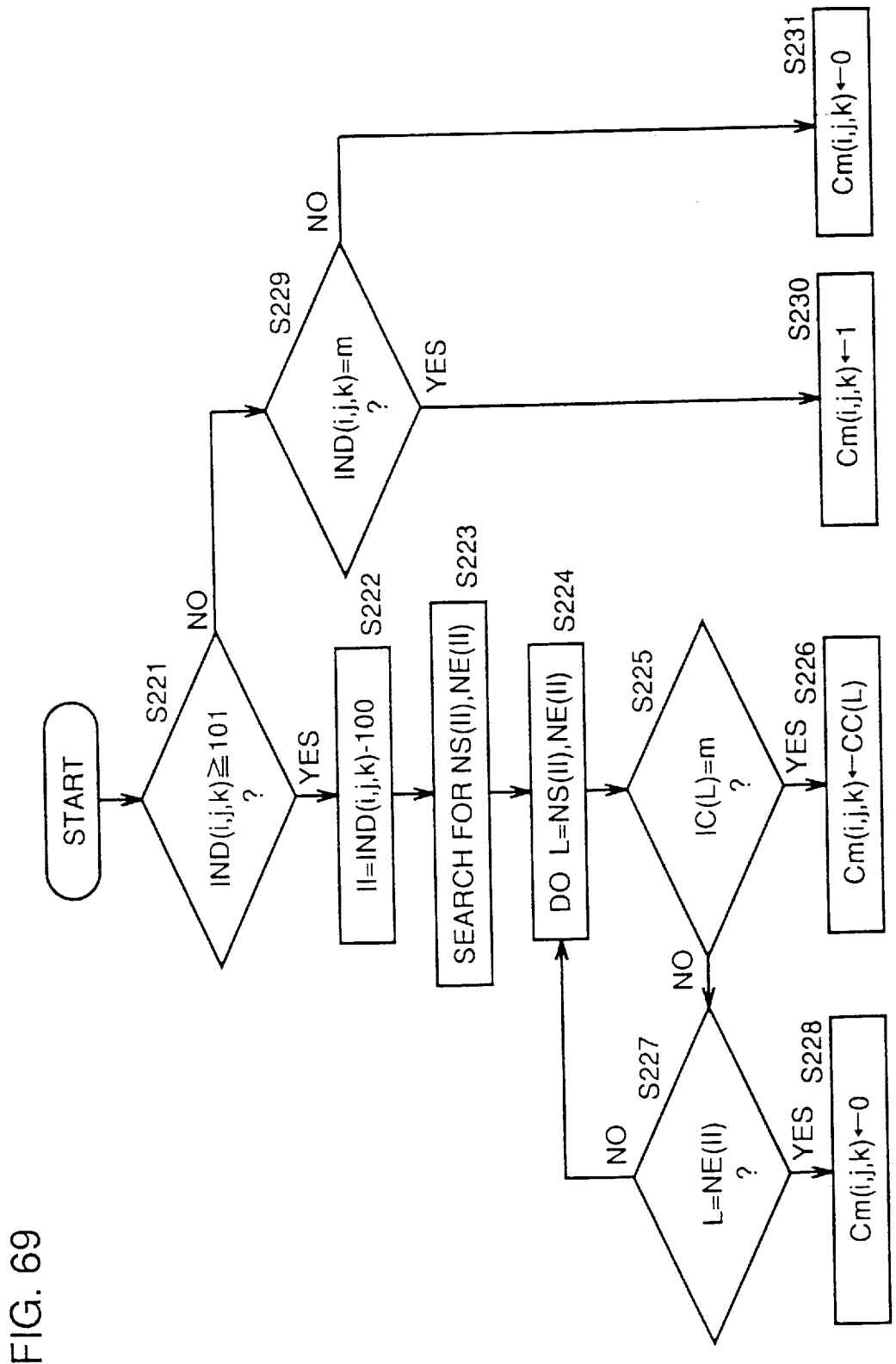
FIG. 69 is a flow chart showing a second method of storing volume ratio.

Referring to FIG. 69, first, in step S221, whether or not the material index IND (i, j, k) is not smaller than 101 is determined. If it is not smaller than 101, the flow proceeds to S222. Otherwise, the flow proceeds to step S229.

If the index is not smaller than 101, it means that the corresponding cell includes a plurality of substances, and therefore the volume ratio are calculated through the following steps. First, in step S222, 100 is subtracted from the material index IND (i, j, k), and the result is input to Il. Next, in step S223, a start number NS (Il) and an end number NE (Il) corresponding to Il are calculated. In step S224, DO loop processing is effected within the range of L from NS (Il) to NE (Il). Next, in step S225, whether the material index IC (L) is equal to the material number m or not is determined. If it is equal to the material number, the flow proceeds to step S226. If not, the flow proceeds to step S227.

If IC (L) is equal to m, the value of the material volume ratio CC (L) corresponding to IC (L) is used as the substitute for Cm (i, j, k) in step S226. By this operation, the volume ratio of the material corresponding to the material number m in the cell including a plurality of substances is used as a substitute for Cm (i, j, k).

If IC (L) is not equal to m, in step S227, it is determined whether L is equal to NE (Il). If it is, the flow proceeds to step S228. Otherwise, the flow proceeds to step S224.

When L is equal to NE (Il), it means that the material number m is not equal to any IC (L). Therefore, it is found that the material corresponding to m does not exist in this cell. Therefore, in step S228, volume ratio Cm (i, j, k) is replaced by 0.

Meanwhile, if L is not equal to NE (Il) it means that the DO loop has not yet been completed. Therefore, processes are continued from step S224 until the DO loop is completed. If it is determined in step S221 that IND (i, j, k) is smaller than 101, that is, when it is determined that the corresponding cell is a single substance area, whether or not IND (i, j, k) is equal to material number m is determined in step S229. If the index is equal to the material number, the flow proceeds to step S230. Otherwise, the flow proceeds to step S231.

If IND (i, j, k) is equal to m, it means that the corresponding cell is fully filled with the material corresponding to the material number m. Therefore, in step S230, 1 substitutes for the volume ratio Cm (i, j, k).

Meanwhile, if IND (i, j, k) is not equal to m, it means that the material corresponding to the material number m does not exist in the corresponding cell. Therefore, in step S231, 0 substitutes for the volume ratio Cm (i, j, k).

The above described processes are performed for every material number m, and prescribed volume ratio is used as a substitute for the volume ratio Cm (i, j, k) corresponding to the material number m of each cell. Through these steps, by the second method of storing also, 0 is stored as the material index IND (i, j, k) of the cell which is vacuum or in which only the air exists, and the material number m is stored in the material index IND (i, j, k) of the cell which is fully filled with the material corresponding to the material number m. In the material index IND (i, j, k) of the cell including a plurality of substances, a prescribed number not smaller than 101 is stored, and in addition, material volume ratio CC (L) and material index IC (L) of each of the included plurality of materials are stored in number corresponding to the number of substances existing, corresponding to the material index IND (i, j, k).

By the above described process, only one piece of data has to be stored for each cell if the cell is a single substance area in this second method as well, and therefore as in the first embodiment, storage capacity can be reduced. Therefore, when a computer having a prescribed storage capacity is used for shape simulation, the number of cell division can be increased, enabling shape simulation of higher precision.

Further, in implementation of the present invention, languages and computers to which the present invention is applied are not limited. Fortran, C, and other languages may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A machine implemented method of obtaining process parameters to be transferred to a semiconductor manufacturing apparatus and used for controlling fabricating of a semiconductor device of a desired shape, comprising: the steps of:
   (a) setting initial values of process parameters for controlling fabricating the semiconductor device and ranges of values of desired shape parameters to be obtained as a result of a shape simulation;
   (b) performing the shape simulation using the set initial values of process parameters;
   (c) graphically displaying the shape of the semiconductor device obtained as a result of the shape simulation along with obtained shape parameters of the semiconductor device; and
   (d) determining whether or not the shape parameters obtained as a result of the shape simulation satisfy the values of desired shape parameters initially set and outputting a result of the determining,
      (i) if the result of the determining is satisfactory, transferring the values of the process parameters to the semiconductor manufacturing apparatus and fabricating the semiconductor device using the transferred values of the process parameters, and
      (ii) if the result of determining is not satisfactory, changing the value of the process parameters and repeating steps (b) to (d), wherein
   the step of shape simulation comprises
         a first step for dividing a prescribed analysis area, in which volume ratios assuming a value from 0 to 1 are distributed, into a plurality of analysis elements to the center of each of which an initial volume ratio, which is an initial value of said volume ratio, is allotted;
         a second step of calculating time change of said volume ratio for updating said volume ratio;
         a third step for determining a shape based on said volume ratio updated in said second step; and
         a fourth step of displaying the determined shape, wherein
         said first step includes a fifth step of dividing said analysis area such that a first analysis element having said initial volume ratio of 1 among said plurality of analysis elements is placed aside a second analysis element having said initial volume ratio of 0 among said plurality of analysis elements, said first and second analysis elements have approximately same width in a first direction in which these elements are placed next to each other and have different width in said first direction where these elements are not placed next to each other,
         said second step includes a sixth step of updating said volume ratio at the center of said analysis elements, and
         said third step includes a seventh step of determining said shape on the basis of a position at which said volume ratio assumes 0.5.

2. The machine implemented method according to claim 1, wherein
   said analysis element includes rectangular faces.

3. The machine implemented method according to claim 2, wherein
   said third step includes
   an eighth step of calculating said volume ratio at a vertex of said analysis element from said volume ratio at the center of said analysis element, and
   a ninth step for calculating a position at which said volume ratio assumes 0.5 based on said volume ratio at the vertex of said analysis element.

4. The machine implemented method according to claim 3, wherein
   in said ninth step, said position at which said volume ratio assumes 0.5 is calculated also based on said volume ratio at the center of said analysis element.

5. The machine implemented method according to claim 4, wherein
   interpolation is performed in calculating the position at which said volume ration assumes 0.5.

6. The machine implemented method according to claim 5, wherein
   said analysis area extends three dimensionally, and said analysis element includes a rectangular parallelepiped.

7. The machine implemented method according to claim 6, wherein
   said ninth step includes a tenth step of calculating said volume ratio at a face center of said rectangular face, and
   in said ninth step, the position at which said volume ratio assumes 0.5 is calculated also based on said volume ratio at said face center.

8. The machine implemented method according to claim 1, wherein
   said time change of the volume ration includes increase of said volume ratio.

9. The machine implemented method according to claim 1 wherein
   said time change of the volume ration includes decrease of said volume ratio.

10. A machine implemented method of obtaining process parameters to be transferred to a semiconductor manufacturing apparatus and used for controlling fabricating of a semiconductor device of a desired shape, comprising the steps of:
   (a) setting initial values of process parameters for controlling fabricating the semiconductor device and ranges of values of desired shape parameters to be obtained as a result of a shape simulation;

(b) performing the shape simulation using the set initial values of process parameters;

(c) graphically displaying the shape of the semiconductor device obtained as a result of the shape simulation along with obtained shape parameters of the semiconductor device; and (d) determining whether or not the shape parameters obtained as a result of the shape simulation satisfy the values of desired shape parameters initially set and outputting a result of the determining, (i) if the result of the determining is satisfactory, transferring the values of the process parameters to the semiconductor manufacturing apparatus and fabricating the semiconductor device using the transferred values of the process parameters, and (ii) if the result of determining is not satisfactory, changing the value of the process parameters and repeating steps (b) to (d), wherein the step of shape simulation simulates a shape of an analysis area which changes because of movement of substance particles and comprises a first step of dividing said analysis area into a plurality of analysis elements;

a second step of specifying a first boundary between a moving area in which said substance particles move and a non-moving area in which said substance particles do not move in a first analysis element positioned at a surface among said analysis element;

a third step of specifying a second boundary between the moving area in which said substance particles move and the non-moving area in which the substance particles do not move in a second analysis area positioned at the surface near said first analysis element, based on said first boundary; and a fourth step of displaying said first boundary and said second boundary.

11. The machine implemented method according to claim 10, wherein said shape simulation method further comprises:

a fifth step of determining whether the third boundary near said first boundary in said second analysis element is in the moving area or the non-moving area;

a sixth step of moving, when said third boundary is determined to be in the moving area in said fifth step, said third boundary in a direction toward that area which is determined to be the non-moving area in said second step, until said third boundary is determined to be in the non-moving area; and a seventh step of moving, when said third boundary is determined to be in the non-moving area in said fifth step, said third boundary in a direction toward that area which is determined to be the moving area in said second step, until said third boundary is determined to be in the moving area.

12. The machine implemented method according to claim 10, wherein said moving area includes a flow in area to which said substance particles flow in, and said non-moving area includes a non-flow in area to which said substance particles do not flow in.

13. The machine implemented method according to claim 10, wherein said moving area includes a flow out area from which said substance particles flow out, and said non-moving area includes a non-flow out area from which said substance particles do not flow out.

14. An machine implemented method of obtaining process parameters to be transferred to a semiconductor manufacturing apparatus and used for controlling fabricating of a semiconductor device of a desired shape, comprising the steps of:

(a) setting initial values of process parameters for controlling fabricating the semiconductor device and ranges of values of desired shape parameters to be obtained as a result of a shape simulation;

(b) performing the shape simulation using the set initial values of process parameters;

(c) graphically displaying the shape of the semiconductor device obtained as a result of the shape simulation along with obtained shape parameters of the semiconductor device; and (d) determining whether or not the shape parameters obtained as a result of the shape simulation satisfy the values of desired shape parameters initially set and outputting a result of the determining, (i) if the result of the determining is satisfactory, transferring the values of the process parameters to the semiconductor manufacturing apparatus and fabricating the semiconductor device using the transferred values of the process parameters, and (ii) if the result of determining is not satisfactory, changing the value of the process parameters and repeating steps (b) to (d), wherein the step of shape simulation comprises a step of inputting process parameters corresponding to a processing step in the manufacture of said semiconductor device;

a first step of dividing a prescribed analysis area in which volume ratios assuming values in a prescribed range are distributed into a plurality of analysis element to the center of each of which an initial volume ratio, which is an initial value of said volume ratio is allotted;

a step of performing a calculation of said processing step in the prescribed analysis area according to said process parameters;

a second step of calculating an equal volume ratio face at which said volume ratio assumes a prescribed value based on the volume ratio of said analysis element;

a third step of calculating time change of said volume ratio by calculating amount of substance particles passing through said equal volume ratio face; and a fourth step of displaying a graphical representation of said calculated time change of said volume ratio.

15. The machine implemented method according to claim 14, wherein said analysis area extends three dimensionally, said analysis element includes a rectangle, and said second step includes a fifth step of calculating volume ratio at each vertex of said rectangle based on said volume ratio at the center of said analysis element, and a sixth step of calculating an equal volume ratio face at which said volume ratio assumes said prescribed value based on said volume ratio at each vertex of said rectangle.

16. The machine implemented method according to claim 15, wherein interpolation is performed in calculating the equal volume ratio face at which said volume ratio assumes the prescribed value.

37

17. The machine implemented method according to claim 14, wherein
    said analysis area extends two dimensionally,
    said analysis element includes a rectangle, and
    said second step includes
        a fifth step of calculating volume ratio at each vertex of said rectangle based on said volume ratio at the center of said analysis element, and
        a sixth step of calculating an equal volume ratio face at which said volume ratio assumes said prescribed value based on said volume ratio at each vertex of said rectangle.

18. The machine implemented method according to claim 17, wherein
    interpolation is effected in calculating the equal volume ratio face at which said volume ratio assumes the prescribed value.

19. A machine implemented method of obtaining process parameters to be transferred to a semiconductor manufacturing apparatus and used for controlling fabricating of a semiconductor device of a desired shape, comprising the steps of:
    (a) setting initial values of process parameters for controlling fabricating the semiconductor device and ranges of values of desired shape parameters to be obtained as a result of a shape simulation;
    (b) performing the shape simulation using the set initial values of process parameters;
    (c) graphically displaying the shape of the semiconductor device obtained as a result of the shape simulation along with obtained shape parameters of the semiconductor device; and
    (d) determining whether or not the shape parameters obtained as a result of the shape simulation satisfy the values of desired shape parameters initially set and outputting a result of the determining,
        (i) if the result of the determining is satisfactory, transferring the values of the process parameters to the semiconductor manufacturing apparatus and fabricating the semiconductor device using the transferred values of the process parameters, and
        (ii) if the result of determining is not satisfactory, changing the value of the process parameters and repeating steps (b) to (d), wherein
    the step of shape simulation simulates a shape of a substance constituted by a plurality of materials and comprises
        a first step of dividing an analysis element including said substance into a plurality of analysis elements; and
        a second step of storing, when only one type of material among said plurality of materials is completely filling said analysis element, only a first code corresponding to type of each substance for every said analysis element.

20. The machine implemented method according to claim 19, wherein said shape simulation method further comprises:
    a third step of storing, when not any of said plurality of materials exists in said analysis element, a second code indicating that said analysis element is vacant for each said analysis element, wherein
        said second code is different from said first code.

21. The machine implemented method according to claim 20, wherein said shape simulation method further comprises:

38 a fourth step of storing, when at least two of said plurality of materials exist in said analysis element and when at least one of said plurality of materials exist in a part of said analysis element, a third code for every said analysis element, and storing said first code and volume ratio of the material corresponding to said third code, wherein
        said first, second and third codes differ from each other.

22. A computer-readable medium having stored thereon a plurality of sequences of instructions, said plurality of sequences of instructions including sequences of instructions which, when executed by a processor, effect obtaining process parameters to be transferred to a semiconductor manufacturing apparatus and used for controlling fabricating of a semiconductor device of a desired shape, by causing the processor to perform the steps of:
    (a) setting initial values of process parameters for controlling fabricating the semiconductor device and ranges of values of desired shape parameters to be obtained as a result of a shape simulation;
    (b) performing the shape simulation using the set initial values of process parameters;
    (c) graphically displaying the shape of the semiconductor device obtained as a result of the shape simulation along with obtained shape parameters of the semiconductor device; and
    (d) determining whether or not the shape parameters obtained as a result of the shape simulation satisfy the values of desired shape parameters initially set and outputting a result of the determining,
        (i) if the result of the determining is satisfactory, transferring the values of the process parameters to the semiconductor manufacturing apparatus and fabricating the semiconductor device using the transferred values of the process parameters, and
        (ii) if the result of determining is not satisfactory, changing the value of the process parameters and repeating steps (b) to (d), wherein
    the step of shape simulation simulates a shape of an analysis area which changes because of movement of substance particles and comprises
        a first step of dividing said analysis area into a plurality of analysis elements;
        a second step of specifying a first boundary between a moving area in which said substance particles move and a non-moving area in which said substance particles do not move in a first analysis element positioned at a surface among said analysis element; a third step of specifying a second boundary between the moving area in which said substance particles move and the non-moving area in which the substance particles do not move in a second analysis area positioned at the surface near said first analysis element, based on said first boundary; and
        a fourth step of displaying said first boundary and said second boundary.

23. The computer-readable medium according to claim 22, wherein said shape simulation further comprises:
    a fifth step of determining whether the third boundary near said first boundary in said second analysis element is in the moving area or the non-moving area;
    a sixth step of moving, when said third boundary is determined to be in the moving area in said fifth step, said third boundary in a direction toward that area which is determined to be the non-moving area in said second step, until said third boundary is determined to be in the non-moving area; and a seventh step of moving, when said third boundary is determined to be in the non-moving area in said fifth step, said third boundary in a direction toward that area which is determined to be the moving area in said second step, until said third boundary is determined to be in the moving area.

24. The computer-readable medium according to claim 22, wherein said moving area includes a flow in area to which said substance particles flow in, and said non-moving area includes a non-flow in area to which said substance particles do not flow in.

25. The computer-readable medium according to claim 22, wherein said moving area includes a flow out area from which said substance particles flow out, and said non-moving area includes a non-flow out area from which said substance particles do not flow out.

26. A computer-readable medium having stored thereon a plurality of sequences of instructions, said plurality of sequences of instructions including sequences of instructions which, when executed by a processor, effect obtaining process parameters to be transferred to a semiconductor manufacturing apparatus and used for controlling fabricating of a semiconductor device of a desired shape, by causing the processor to perform the steps of:

(a) setting initial values of process parameters for controlling fabricating the semiconductor device and ranges of values of desired shape parameters to be obtained as a result of a shape simulation;

(b) performing the shape simulation using the set initial values of process parameters;

(c) graphically displaying the shape of the semiconductor device obtained as a result of the shape simulation along with obtained shape parameters of the semiconductor device; and (d) determining whether or not the shape parameters obtained as a result of the shape simulation satisfy the values of desired shape parameters initially set and outputting a result of the determining, (i) if the result of the determining is satisfactory, transferring the values of the process parameters to the semiconductor manufacturing apparatus and fabricating the semiconductor device using the transferred values of the process parameters, and (ii) if the result of determining is not satisfactory, changing the value of the process parameters and repeating steps (b) to (d), wherein the step of shape simulation comprises a step of inputting process parameters corresponding to a processing step in the manufacture of said semiconductor device;

a first step of dividing a prescribed analysis area in which volume ratios assuming values in a prescribed range are distributed into a plurality of analysis element to the center of each of which an initial volume ratio, which is an initial value of said volume ratio is allotted;

a step of performing a calculation of said processing step in the prescribed analysis area according to said process parameters;

a second step of calculating an equal volume ratio face at which said volume ratio assumes a prescribed value based on the volume ratio of said analysis element;

a third step of calculating time change of said volume ratio by calculating amount of substance particles passing through said equal volume ratio face; and a fourth step of displaying a graphical representation of said calculated time change of said volume ratio.

27. The computer-readable medium according to claim 26, wherein said analysis area extends three dimensionally, said analysis element includes a rectangle, and said second step includes a fifth step of calculating volume ratio at each vertex of said rectangle based on said volume ratio at the center of said analysis element, and a sixth step of calculating an equal volume ratio face at which said volume ratio assumes said prescribed value based on said volume ratio at each vertex of said rectangle.

28. The computer-readable medium according to claim 27, wherein interpolation is performed in calculating the equal volume ratio face at which said volume ratio assumes the prescribed value.

29. The computer-readable medium according to claim 26, wherein said analysis area extends two dimensionally, said analysis element includes a rectangle, and said second step includes a fifth step of calculating volume ratio at each vertex of said rectangle based on said volume ratio at the center of said analysis element, and a sixth step of calculating an equal volume ratio face at which said volume ratio assumes said prescribed value based on said volume ratio at each vertex of said rectangle.

30. The computer-readable medium according to claim 29, wherein interpolation is effected in calculating the equal volume ratio face at which said volume ratio assumes the prescribed value.

31. A computer-readable medium having stored thereon a plurality of sequences of instructions, said plurality of sequences of instructions including sequences of instructions which, when executed by a processor, effect obtaining process parameters to be transferred to a semiconductor manufacturing apparatus and used for controlling fabricating of a semiconductor device of a desired shape, by causing the processor to perform the steps of:

(a) setting initial values of process parameters for controlling fabricating the semiconductor device and ranges of values of desired shape parameters to be obtained as a result of a shape simulation;

(b) performing the shape simulation using the set initial values of process parameters;

(c) graphically displaying the shape of the semiconductor device obtained as a result of the shape simulation along with obtained shape parameters of the semiconductor device; and (d) determining whether or not the shape parameters obtained as a result of the shape simulation satisfy the values of desired shape parameters initially set and outputting a result of the determining, (i) if the result of the determining is satisfactory, transferring the values of the process parameters to the semiconductor manufacturing apparatus and fabricating the semiconductor device using the transferred values of the process parameters, and (ii) if the result of determining is not satisfactory, changing the value of the process parameters and repeating steps (b) to (d), wherein the step of shape simulation simulates a shape of a substance constituted by a plurality of materials and comprises a first step of dividing an analysis element including said substance into a plurality of analysis elements; and a second step of storing, when only one type of material among said plurality of materials is completely filling said analysis element, only a first code corresponding to type of each substance for every said analysis element.

32. The computer-readable medium according to claim 31, wherein said shape simulation further comprises:

a third step of storing, when not any of said plurality of materials exists in said analysis element, a second code indicating that said analysis element is vacant for each said analysis element, wherein said second code is different from said first code.

33. The computer-readable medium according to claim 32, wherein said shape simulation further comprises:

a fourth step of storing, when at least two of said plurality of materials exist in said analysis element and when at least one of said plurality of materials exist in a part of said analysis element, a third code for every said analysis element, and storing said first code and volume ratio of the material corresponding to said third code, wherein said first, second and third codes differ from each other.

* * * * *